US 8,080,869 B2

(12) United States Patent
Okudo et al.

(10) Patent No.: US 8,080,869 B2
(45) Date of Patent: Dec. 20, 2011

(54) WAFER LEVEL PACKAGE STRUCTURE AND PRODUCTION METHOD THEREFOR

(75) Inventors: Takafumi Okudo, Nara (JP); Yuji Suzuki, Hirakata (JP); Yoshiyuki Takegawa, Nara (JP); Toru Baba, Osaka (JP); Kouji Gotou, Neyagawa (JP); Hisakazu Miyajima, Osaka (JP); Kazushi Kataoka, Neyagawa (JP); Takashi Saijo, Kawanishi (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 708 days.

(21) Appl. No.: 12/094,600

(22) PCT Filed: Nov. 24, 2006

(86) PCT No.: PCT/JP2006/323445
§ 371 (c)(1),
(2), (4) Date: Jun. 10, 2008

(87) PCT Pub. No.: WO2007/061047
PCT Pub. Date: May 31, 2007

(65) Prior Publication Data
US 2009/0159997 A1    Jun. 25, 2009

(30) Foreign Application Priority Data

| Nov. 25, 2005 | (JP) | 2005-341223 |
|---|---|---|
| Nov. 25, 2005 | (JP) | 2005-341224 |
| Nov. 25, 2005 | (JP) | 2005-341225 |
| Nov. 25, 2005 | (JP) | 2005-341253 |
| Dec. 22, 2005 | (JP) | 2005-371049 |
| Dec. 22, 2005 | (JP) | 2005-371052 |
| Dec. 22, 2005 | (JP) | 2005-371053 |
| Dec. 22, 2005 | (JP) | 2005-371054 |
| Mar. 28, 2006 | (JP) | 2006-089558 |
| Mar. 28, 2006 | (JP) | 2006-089589 |

(51) Int. Cl.
*H01L 23/12* (2006.01)
(52) U.S. Cl. .................. 257/704; 257/E23.193; 438/125
(58) Field of Classification Search .................. 257/704
See application file for complete search history.

(56) References Cited

U.S. PATENT DOCUMENTS 4,988,035 A    1/1991    Ueno et al.
(Continued)

FOREIGN PATENT DOCUMENTS

DE    103 51 761 A1    5/2004
(Continued)

OTHER PUBLICATIONS

Notice of Official Action for the Application No. 095143570 from Taiwan Intellectual Property Office dated Dec. 14, 2009.
Notification of Reasons for Refusal for the Application No. 2006-089556 from Japan Patent Office mailed Dec. 5, 2006.
International Search Report for the Application No. PCT/JP2006/323445 mailed Feb. 6, 2007.

(Continued)

*Primary Examiner* — Ajay K Arora
(74) *Attorney, Agent, or Firm* — Cheng Law Group, PLLC

(57) ABSTRACT

A wafer level package structure, in which a plurality of compact sensor devices with small variations in sensor characteristics are formed, and a method of producing the same are provided. This package structure has a semiconductor wafer having plural sensor units, and a package wafer bonded to the semiconductor wafer. The semiconductor wafer has a first metal layer formed with respect to each of the sensor units. The package wafer has a bonding metal layer at a position facing the first metal layer. Since a bonding portion between the semiconductor wafer and the package wafer is formed at room temperature by a direct bonding between activated surfaces of the first metal layer and the bonding metal layer, it is possible to prevent that variations in sensor characteristics occur due to residual stress at the bonding portion.

13 Claims, 28 Drawing Sheets

U.S. PATENT DOCUMENTS

| | | | |
|---|---|---|---|
| 5,392,650 A | 2/1995 | O'Brien et al. | |
| 5,448,014 A | 9/1995 | Kong et al. | |
| 5,525,549 A | 6/1996 | Fukada et al. | |
| 5,654,244 A | 8/1997 | Sakai et al. | |
| 5,869,876 A | 2/1999 | Ishio et al. | |
| 5,948,982 A | 9/1999 | Woodruff et al. | |
| 6,222,868 B1 | 4/2001 | Ouchi et al. | |
| 6,228,675 B1 | 5/2001 | Ruby et al. | |
| 6,257,060 B1 | 7/2001 | Leonardson et al. | |
| 6,465,892 B1 | 10/2002 | Suga | |
| 6,555,901 B1 | 4/2003 | Yoshihara et al. | |
| 6,596,117 B2 * | 7/2003 | Hays et al. | 156/251 |
| 6,683,358 B1 | 1/2004 | Ishida et al. | |
| 6,873,054 B2 | 3/2005 | Miyazawa et al. | |
| 6,892,578 B2 | 5/2005 | Saitoh et al. | |
| 7,176,599 B2 | 2/2007 | Kawachi et al. | |
| 7,406,870 B2 | 8/2008 | Seto | |
| 2002/0008444 A1 | 1/2002 | Sakata et al. | |
| 2002/0180031 A1 | 12/2002 | Yamaguchi et al. | |
| 2003/0003684 A1 | 1/2003 | Farrens et al. | |
| 2003/0038328 A1 | 2/2003 | Ishio | |
| 2003/0183921 A1 | 10/2003 | Komobuchi et al. | |
| 2004/0016981 A1 | 1/2004 | Yoshida et al. | |
| 2004/0053435 A1 | 3/2004 | Ikushima et al. | |
| 2004/0065638 A1 | 4/2004 | Gogoi | |
| 2004/0207485 A1 | 10/2004 | Kawachi et al. | |
| 2004/0238943 A1 | 12/2004 | Fujii | |
| 2005/0167795 A1 | 8/2005 | Higashi | |
| 2005/0217373 A1 | 10/2005 | Ishikawa et al. | |
| 2006/0022325 A1 | 2/2006 | Hwang et al. | |
| 2007/0158822 A1 | 7/2007 | Fujii | |
| 2008/0302185 A1 | 12/2008 | Yakabe et al. | |

FOREIGN PATENT DOCUMENTS

| | | | |
|---|---|---|---|
| EP | 0 278 030 A1 | 8/1988 | |
| EP | 0 905 838 A1 | 3/1999 | |
| JP | 60-053054 A | 3/1985 | |
| JP | 02-012663 U | 1/1990 | |
| JP | 02-063173 A | 3/1990 | |
| JP | 02-079044 U | 6/1990 | |
| JP | 2-218172 A | 8/1990 | |
| JP | 3-67177 A | 3/1991 | |
| JP | 05-095122 A | 4/1993 | |
| JP | 05-175247 A | 7/1993 | |
| JP | 5-281251 A | 10/1993 | |
| JP | 5-288771 A | 11/1993 | |
| JP | 6-45618 A | 2/1994 | |
| JP | 06-318625 A | 11/1994 | |
| JP | 07-283334 A | 10/1995 | |
| JP | 08-015300 A | 1/1996 | |
| JP | 8-18068 A | 1/1996 | |
| JP | 08-032090 A | 2/1996 | |
| JP | 9-203747 A | 8/1997 | |
| JP | 09-266266 A | 10/1997 | |
| JP | 9-292049 A | 11/1997 | |
| JP | 10-177034 A | 6/1998 | |
| JP | 2791429 B2 | 6/1998 | |
| JP | 2001-060635 A | 3/2001 | |
| JP | 2001-068616 A | 3/2001 | |
| JP | 2001-183389 A | 7/2001 | |
| JP | 2003-69044 A | 3/2003 | |
| JP | 2003-100919 A | 4/2003 | |
| JP | 2003-179085 A | 6/2003 | |
| JP | 2003-318178 A | 11/2003 | |
| JP | 2003-329704 A | 11/2003 | |
| JP | 2004-028912 A | 1/2004 | |
| JP | 2004-057507 A | 2/2004 | |
| JP | 2004-085547 A | 3/2004 | |
| JP | 3532788 B2 | 3/2004 | |
| JP | 2004-109114 A | 4/2004 | |
| JP | 2004-200547 A | 7/2004 | |
| JP | 2004-209585 A | 7/2004 | |
| JP | 2004-233072 A | 8/2004 | |
| JP | 2004-304622 A | 10/2004 | |
| JP | 2004-364041 A | 12/2004 | |
| JP | 2005-091166 A | 4/2005 | |
| JP | 2005-127750 A | 5/2005 | |
| JP | 2005-129888 A | 5/2005 | |
| JP | 2005-166909 A | 6/2005 | |
| JP | 2005-181644 A | 7/2005 | |
| JP | 2005-191556 A | 7/2005 | |
| JP | 2005-251898 A | 9/2005 | |
| JP | 2005-292117 A | 10/2005 | |
| JP | 2006-202974 A | 8/2006 | |
| JP | 2006322717 A | * 11/2006 | |
| KR | 1998-86900 A | 12/1998 | |
| KR | 2003-17428 A | 3/2003 | |
| TW | 093107297 | 2/2006 | |
| WO | WO-2005/086597 A2 | 9/2005 | |
| WO | WO-2005/104228 A1 | 11/2005 | |
| WO | WO-2006/030716 A1 | 3/2006 | |

OTHER PUBLICATIONS

Decision of Refusal for the Application No. 2006-089558 from Japan Patent Office mailed Sep. 25, 2007.
Decision of Refusal for the Application No. 2006-089589 from Japan Patent Office mailed Sep. 25, 2007.
Decision of Refusal for the Application No. 2006-089633 from Japan Patent Office mailed Sep. 25, 2007.
Notification of Reasons for Refusal for the Application No. 2005-371042 from Japan Patent Office mailed Dec. 26, 2006.
Notification of Reasons for Refusal for the Application No. 2006-089590 from Japan Patent Office mailed Dec. 26, 2006.
Notification of Reasons for Refusal for the Application No. 2006-089634 from Japan Patent Office mailed Dec. 26, 2006.
Notification of Reasons for Refusal for the Application No. 2006-089558 from Japan Patent Office mailed Mar. 6, 2007.
Notification of Reasons for Refusal for the Application No. 2006-089588 from Japan Patent Office mailed Mar. 6, 2007.
Notification of Reasons for Refusal for the Application No. 2006-089633 from Japan Patent Office mailed Mar. 6, 2007.
Takagi, Hideki et al., "Low Temperature, Pressure Less Bonding of Si and $SiO_2$ by the Surface Activation Method", Japan Welding Society Paper, 1997, vol. 61, pp. 224-225.
Itoh, Toshihiro et al., "Problems in MEMS Packaging and Application of Surface Activated Bonding (SAB) Method", Electronics Mounting Society Paper, 2001, vol. 4, No. 1, pp. 25-27.
Esashi, Masayoshi, "MEMS and Its Application", Journal of Japan Institute of Electronics Packaging, 2002, vol. 5, No. 6, pp. 537-541.
Suga, Tadatomo, "Bonding Technology for Micro-Machines", Plastic Processing Symposium, 2002, 211th, pp. 15-20.
Akaike, Hirotake et al., "Technology Tendency of Bonding for MEMS Device by Japanese Patent Research", Japan Institute of Electronics Packaging, 2003, vol. 6, No. 7, pp. 602-609.
Korean Office Action for the Application No. 10-2008-7012313 from Korean Intellectual Property Office dated Nov. 30, 2010.
International Search Report for the Application No. PCT/JP2006/323459 mailed Feb. 6, 2007.
Taiwanese Office Action for the Application No. 095143554 from Taiwanese Patent Office dated Sep. 17, 2009.
U.S. Restriction Requirement for the U.S. Appl. No. 12/094,772 from U.S. Patent and Trademark Office mailed Jun. 8, 2010.
U.S. Non-Final Office Action for the Application No, 12,094,674 from U.S.Patent and Trademark Office mailed Oct. 1, 2010.
U.S. Final Office Action for the U.S. Appl. No. 12/094,674 from U.S. Patent and Trademark Office mailed Mar. 16, 2011.
Notification of Reasons for Refusal for the Application No. 2006-089555 from Japan Patent Office mailed Dec. 5. 2006.
Notification of Reasons for Refusal for the Application No. 2006-089579 from Japan Patent Office mailed Dec. 5, 2006.
Notification of Reasons for Refusal for the Application No. 2006-089580 from Japan Patent Office mailed Dec. 5, 2006.
Notification of Reasons for Refusal for the Application No. 2006-089586 from Japan Patent Office mailed Dec. 26, 2006.
Supplementary European Search Report for the Application No. 06 83 3259 dated Jun. 24, 2011.

* cited by examiner

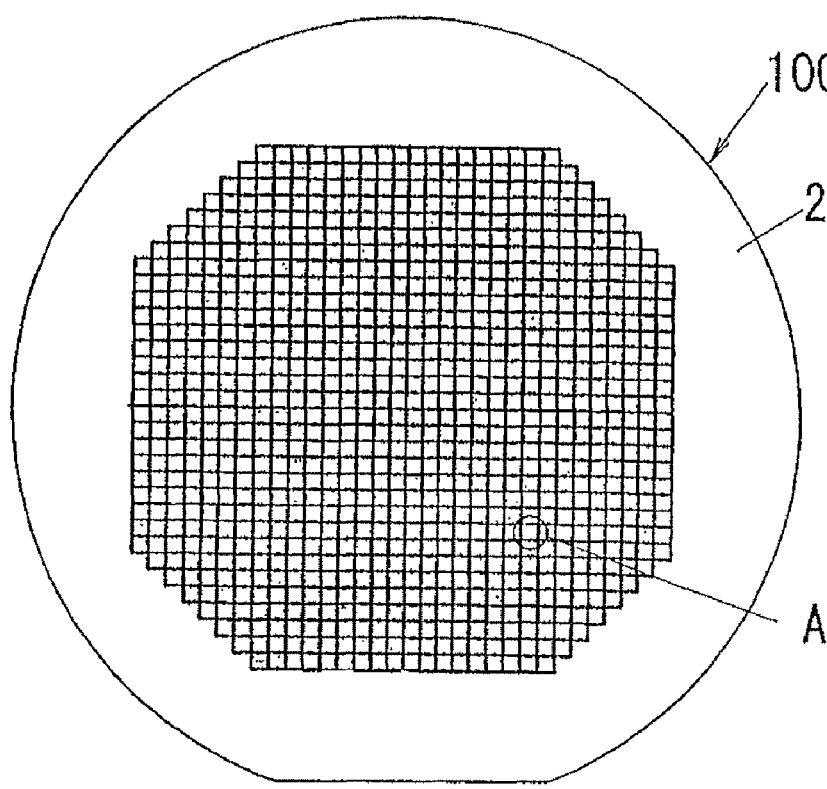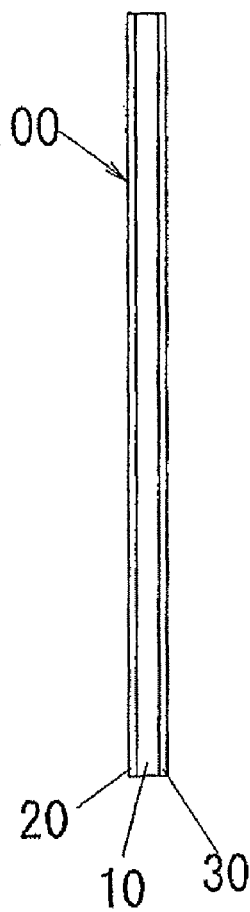
FIG.1A
FIG.1B

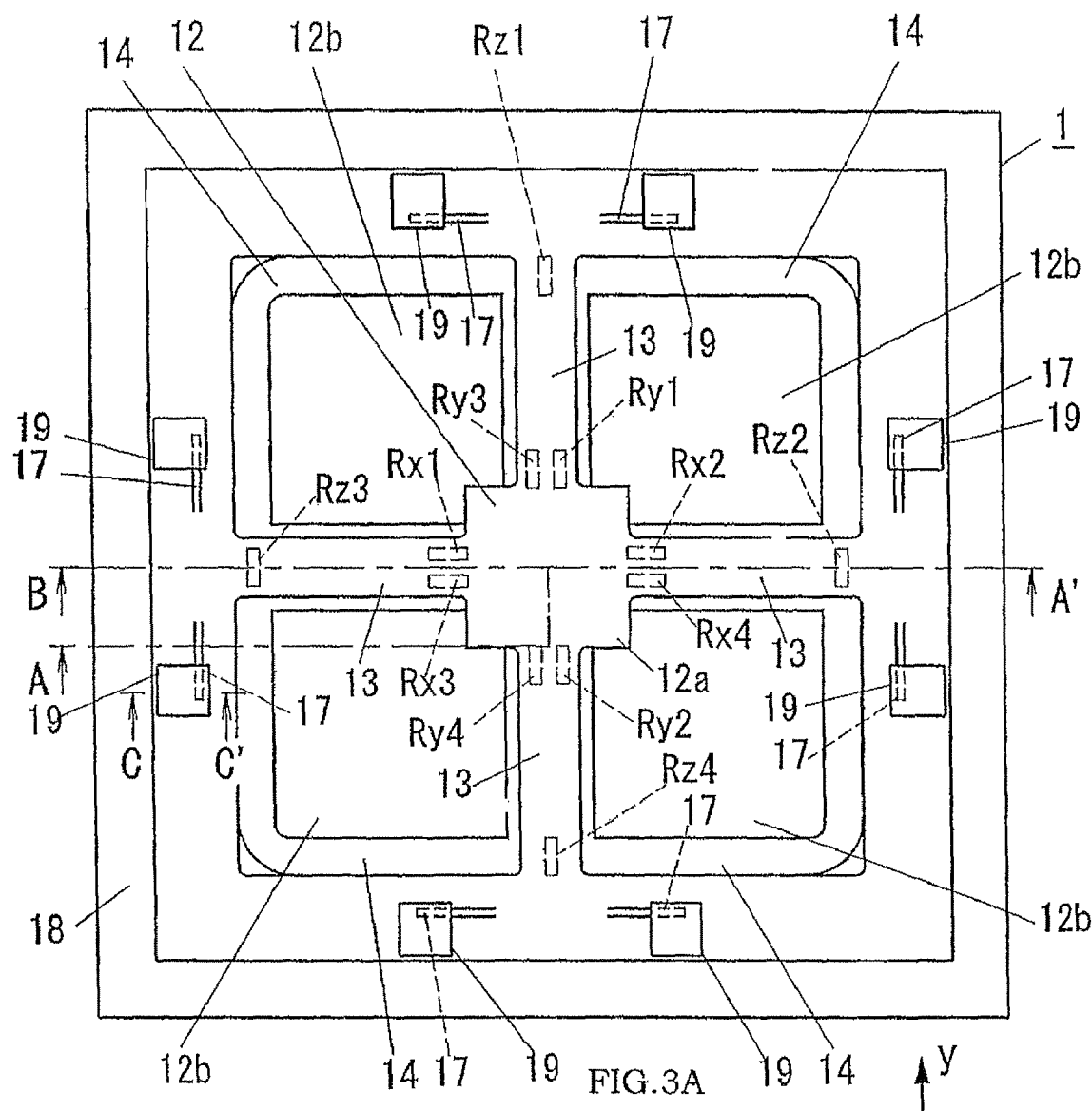
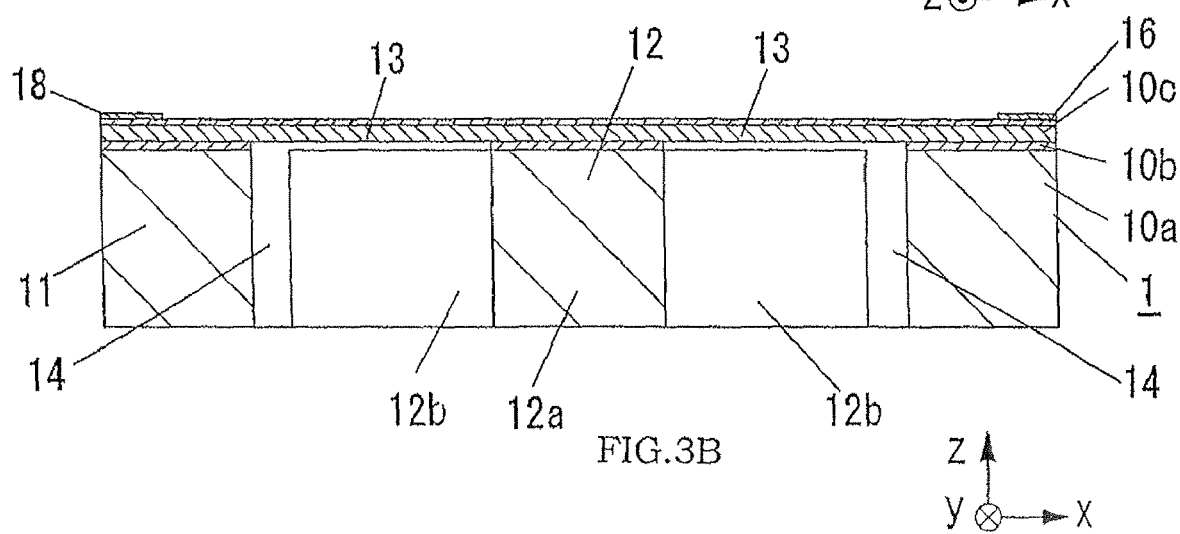

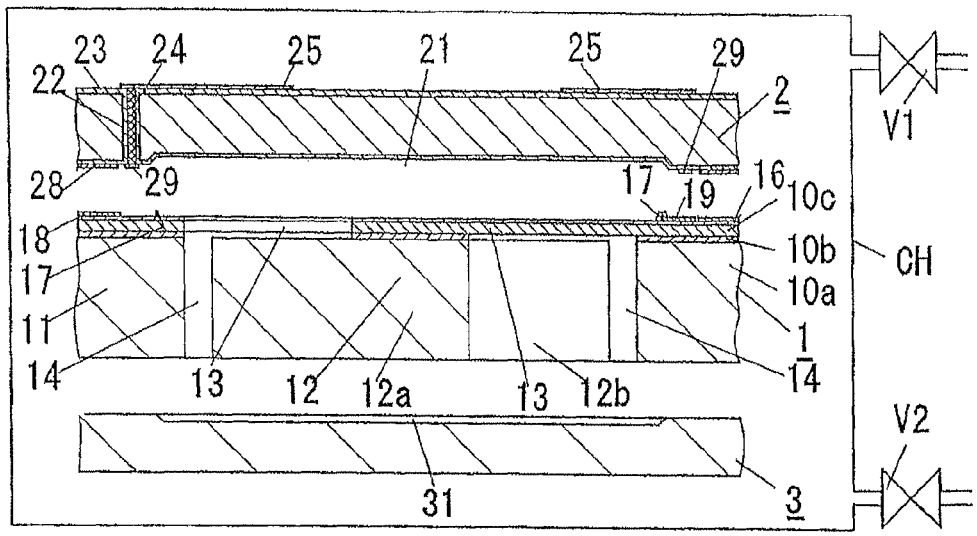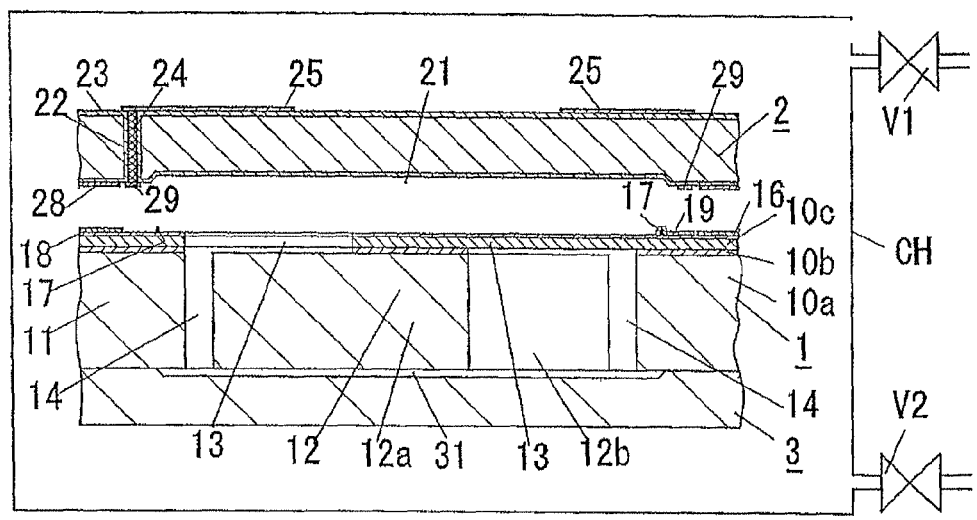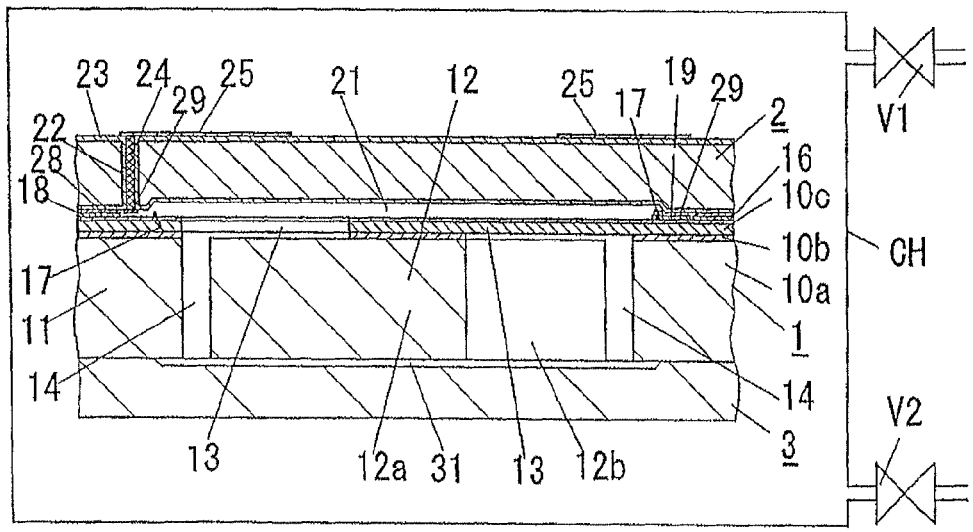

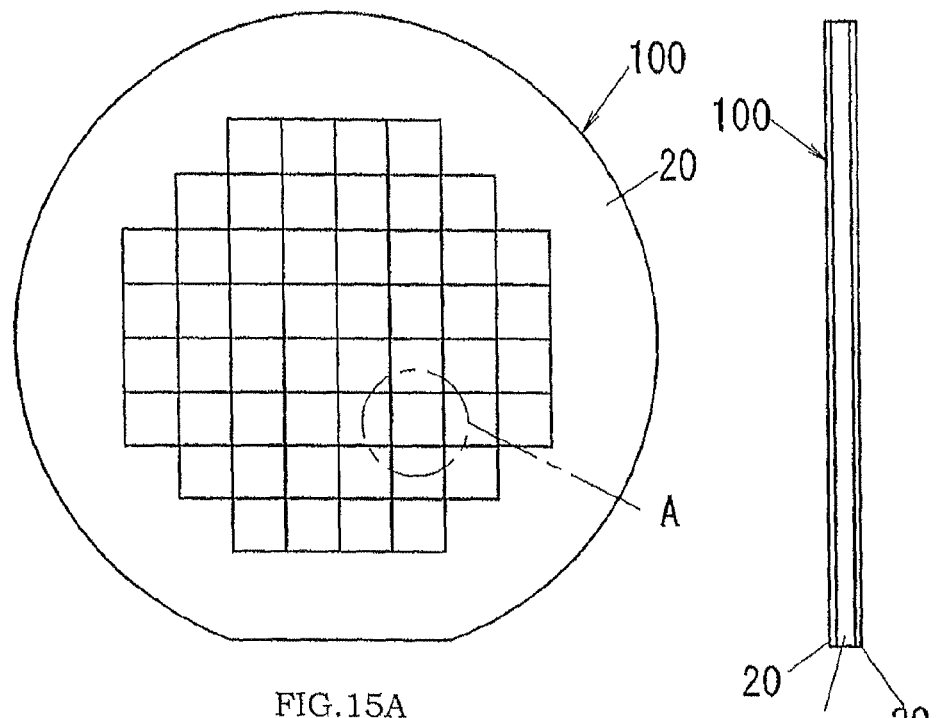
FIG.15A
FIG.15B
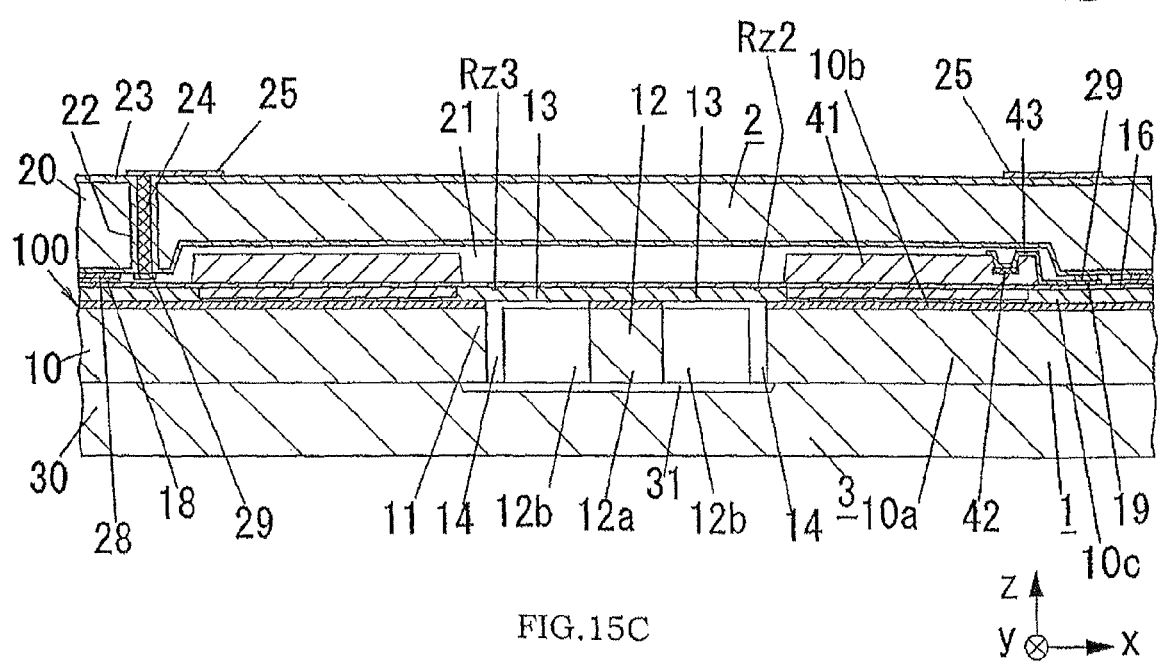
FIG.15C

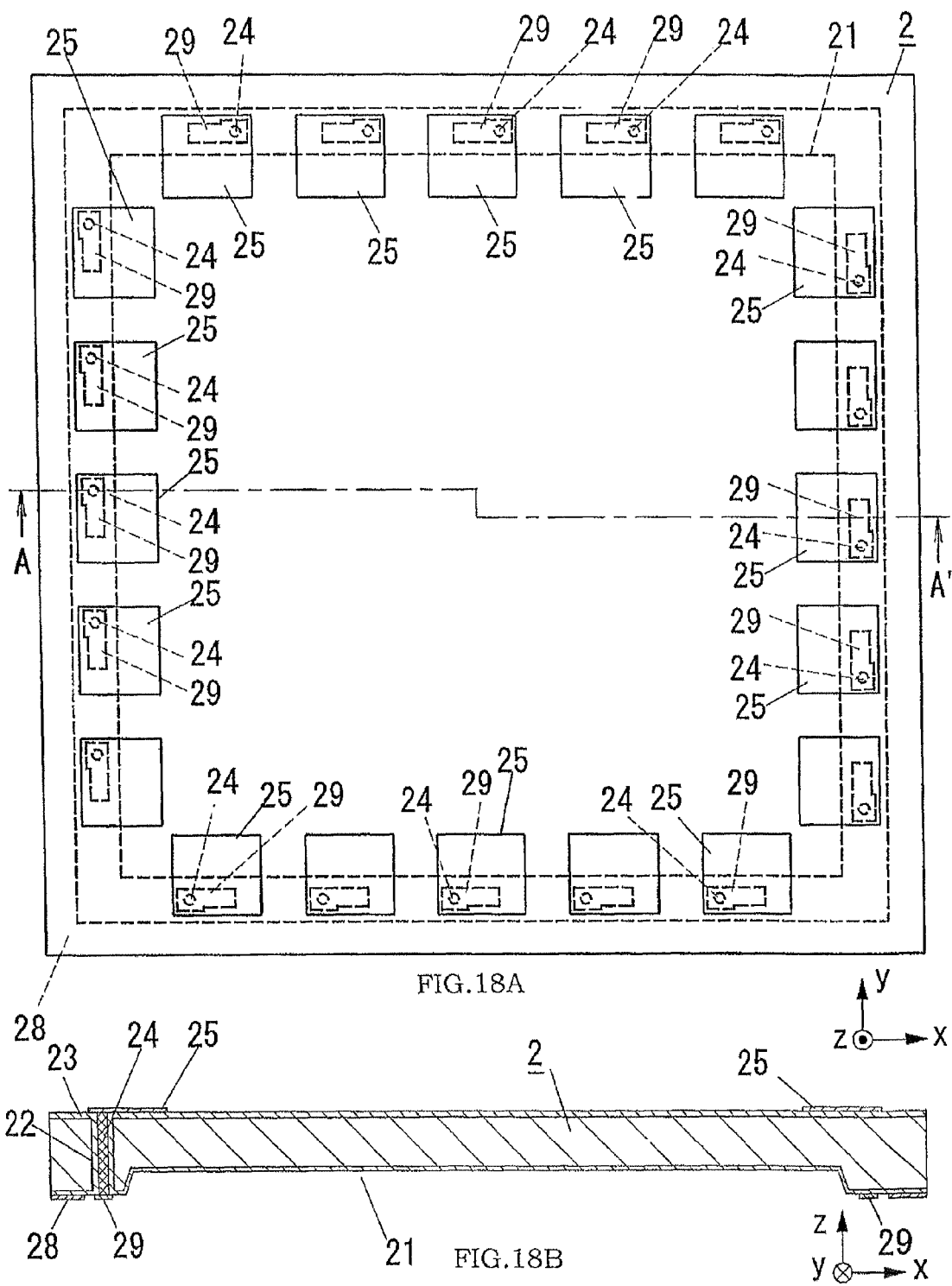

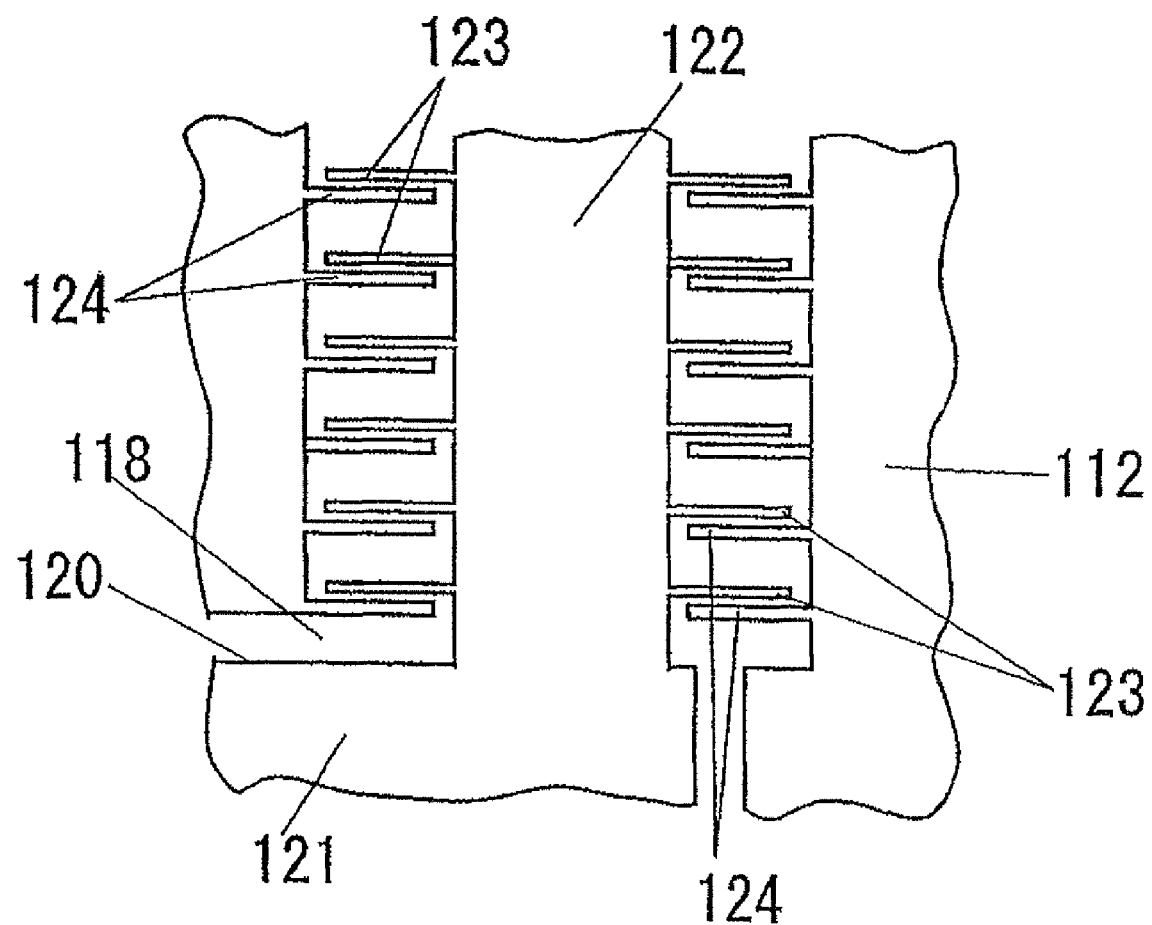
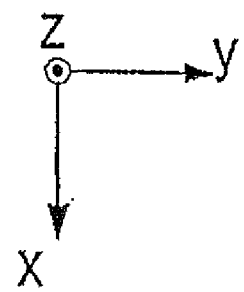
FIG.26

WAFER LEVEL PACKAGE STRUCTURE AND PRODUCTION METHOD THEREFOR

TECHNICAL FIELD

The present invention relates to a wafer level packaging technique for manufacturing compact sensor devices such as an acceleration sensor and a gyro sensor.

BACKGROUND ART

In recent years, wafer level packaging technique has attracted lots of attention as an appropriate manufacturing technique for sensor devices with chip size package (CSP).

For example, Japanese Patent Early Publication No. 2005-251898 discloses a manufacturing technique for a wafer level package structure 200, as shown in FIGS. 29A and 29B. That is, a sensor wafer 210 and a package wafer 220 are arranged in a face-to-face relation to each other, as shown in FIG. 29A. The sensor wafer 210 has a MEMS (Micro Electro Mechanical System) element 211 and a metal wiring (outgoing electrode) 217 electrically connected to a sensing portion (not shown) of the MEMS element 211. The package wafer 220 has a through-hole wiring 224 electrically connected with the metal wiring 217 and a concave portion 221 providing a space for airtightly sealing the MEMS element 211. Then, by forming a wafer level bonding between the sensor wafer 210 and the package wafer 220, as shown in FIG. 29B, the wafer level package structure 200 is obtained. Finally, plural sensor devices are separated from the wafer level package structure 200.

On a surface facing the package wafer 220 of the sensor wafer 210, a metal layer 218 is formed to surround the MEMS element 211 of the sensor body and the metal wiring 217 electrically connected to the MEMS element 211. On the other hand, a metal layer 228 surrounding the concave portion 221 is formed on a surface facing the sensor wafer 210 of the package wafer 220. In addition, a wiring layer 219 electrically connected to the metal wiring 217 is formed at an inner side of the metal layer 218 on the sensor wafer 210, and a wiring layer 229 electrically connected to the through-hole wiring 224 is formed at an inner side of the metal layer 228 on the package wafer 220. In the above-described wafer level package structure 200, the metal layer 218 of the sensor wafer 210 is bonded to the metal layer 228 of the package wafer 220 through a soldering portion 238 such as AuSn, and the wiring layer 219 of the sensor wafer 210 is bonded to the wiring layer 229 of the package wafer 220 through a soldering portion 239.

As the MEMS element 211, acceleration sensors and gyro sensors are well known. As the acceleration sensors, there are piezoresistance-type and capacitance-type acceleration sensors. The piezoresistance-type acceleration sensor is capable of detecting acceleration according to a change in resistance value resulting from a strain of a piezoresistive element as a gauge resistance caused when the acceleration is applied. The capacitance type acceleration sensor is capable of detecting acceleration according to a change in electric capacitance between stationary and movable electrodes when the acceleration is applied. In the piezoresistance-type acceleration sensor, there are cantilever type and double-supported beam type acceleration sensors. The cantilever type acceleration sensor is formed with a rectangular frame portion, a weight portion disposed inside of the frame portion, and a flexible beam portion connected at its one end to the weight portion such that the weight portion is movable relative to the frame portion. On the other hand, the double-supported beam type acceleration sensor is formed with a frame portion, a weight portion disposed inside of the frame portion, and a pair of flexible beam portions extending in opposite directions from the weight portion and configured to support the weight portion to be movable relative to the frame portion. In recent years, acceleration sensors for detecting acceleration with respect to each of three directions orthogonal to each other have been also proposed in, for example, Japanese Patent Early Publication No. 2004-109114 and No. 2004-233072. The acceleration sensors has a frame portion, a weight portion disposed inside of the frame portion, and four flexible beam portions extending in four directions and configured to support the weight portion so as to be movable relative to the frame portion.

In the above-described wafer level package structure 200, however, a prescribed amount of solder is supplied to the metal layer 228 and the wiring layer 229 by a solder shooting method to bond between the metal layers (218, 228) and between the wiring layers (219, 229). Then, a reflow soldering process is performed to a layered structure of the sensor wafer 210 and the package wafer 220. Therefore, when using the piezoresistance-type acceleration sensor body as the MEMS element 211, there is a problem that variations in sensor characteristics increase because residual stress at the vicinity of the bonding interface has an influence on the flexible beam portion(s). It is estimated that such an influence of the residual stress increases as the sensor device is downsized.

SUMMARY OF THE INVENTION

Therefore, in consideration of the above problems, a primary concern of the present invention is to provide a wafer level package structure, which is formed by bonding a semiconductor wafer having a plurality of compact sensor elements such as an acceleration sensor and a gyro sensor to a package wafer without almost causing residual stress at the bonding interface, and the wafer level package structure, from which compact sensor devices having reduced variations in sensor characteristics can be obtained.

That is, the wafer level package structure of the present invention comprises:
a semiconductor wafer having a plurality of sensor units; and
a package wafer bonded to a surface of the semiconductor wafer;
wherein the semiconductor wafer has a first metal layer formed on each of the sensor units;
the package wafer has a bonding metal layer on a position facing the first metal layer; and
the bonding between the semiconductor wafer and the package wafer comprises a solid-phase direct bonding without diffusion between an activated surface of the first metal layer and an activated surface of the bonding metal layer.

According to the present invention, since the package wafer is bonded to the semiconductor wafer by the solid-phase direct bonding without diffusion, it is possible to avoid a problem that variations in sensor characteristics occur due to residual stress at the bonding interface in the case of using a heat treatment such as reflow soldering as the bonding method. Therefore, the wafer level package structure can be obtained, in which a plurality of compact sensor devices with reduced variations in sensor characteristics are integrally formed.

To obtain the solid-phase direct bonding with good bonding strength, it is preferred that the activated surfaces of the first metal layer and the bonding metal layer are provided by any one of a plasma-treated surface, an ion-beam irradiated surface, and an atomic-beam irradiated surface. In addition, it is preferred that the first metal layer and the bonding metal layer are made of a same metal material selected from gold (Au), copper (Cu) and aluminum (Al). Particularly, it is preferred that each of the first metal layer and the bonding metal layer is made of gold, and has a thickness of 500 nm or less. When the Au film has a thickness larger than 500 nm, a defective bonding easily occurs due to an increase in roughness of the film surface. Therefore, it is particularly preferred to use the Au film with the thickness of not larger than 500 nm from the viewpoint of achieving good bonding strength with an improved yield. As to a lower limit value of the film thickness, for example, 10 nm or more is desired in consideration of the continuity of the Au film.

In addition, it is preferred that the first metal layer comprises an intermediate layer made of any one of Ti and Cr formed on the semiconductor wafer, and an Au film formed on the intermediate layer, the bonding metal layer comprises an intermediate layer made of any one of Ti and Cr formed on the package wafer, and an Au film formed on the intermediate layer, and the bonding between the first metal layer and the bonding metal layer is the solid-phase direct bonding between activated surfaces of the Au films. Since the adhesion of the Au film to each of the semiconductor wafer and the package wafer is improved by the formation of the Ti film or the Cr film as the intermediate layer, an improvement in reliability of the bonding between the semiconductor wafer and the package wafer can be achieved.

In a case where each of the sensor units comprises a frame having an opening, a movable portion held in the opening to be movable relative to the frame, and a detecting portion configured to output an electric signal according to a positional displacement of the movable portion, it is preferred from the viewpoint of sealing the interior of the sensor unit in an airtight manner that the first metal layer is formed on a surface facing the package wafer of the frame of each of the sensor units over an entire circumference of the frame so as to surround the movable portion, and the bonding metal layer is formed on a region facing the first metal layer of the package wafer.

In addition, to achieve an improvement in airtightness, and improve the bonding reliability, it is preferred that at least one of the first metal layer and the bonding metal layer is composed of a ring-like outer metal layer formed around the movable portion, and a ring-like inner metal layer formed at an inner side of the outer metal layer around the movable portion. In addition, to further improve the reliability of airtightness of the sensor unit brought by the formation of the outer and inner metal layers, it is particularly preferred that each of the first metal layer and the bonding metal layer is composed of the outer metal layer, the inner metal layer, and an auxiliary sealing layer connecting between the outer metal layer and the inner metal layer, which is formed at plural locations spaced from each other by a predetermined distance in the circumferential direction of the inner metal layer. In this case, each of a bonding between the outer metal layers, a bonding between the inner metal layers, and a bonding between the auxiliary sealing layers is provided by the solid-phase direct bonding described above.

In addition, as a preferred embodiment of the present invention, the frame of each of the sensor units has a second metal layer electrically connected to the detecting portion, and the package wafer has a concave portion formed in a region facing the movable portion of each of the sensor units, a through-hole wiring formed in a bottom of the concave portion, and an intermediate wiring layer connected at its one end to the through-hole wiring. The through-hole wiring is electrically connected to the second metal layer through the intermediate wiring layer. The electrical connection is provided by a solid-phase direct bonding without diffusion between activated surfaces of the second metal layer and the intermediate wiring layer. In this case, the through-hole wiring can be designed with a high degree of layout freedom. The number of through-hole wirings can be determined according to the kind of the sensor unit. By the formation of the intermediate wiring layer, it is possible to prevent that formation sites of the through-hole wirings are locally concentrated.

As a further preferred embodiment of the present invention, each of the sensor units has a second metal layer electrically connected to the detecting portion, and the package wafer has a through-hole wiring, and a wiring metal layer connected at its one end to the through-hole wiring. The second metal layer is electrically connected to the wiring metal layer at a closer side to the movable portion than the bonding between the first metal layer and the bonding metal layer. The electrical connection is provided by a solid-phase direct bonding without diffusion between activated surfaces of the second metal layer and the wiring metal layer. In this embodiment, it is particularly preferred that the first metal layer, the bonding metal layer, the wiring metal layer and the second metal layer are made of a same metal material (preferably an Au film having a thickness of 500 nm or less), the first metal layer and the second metal layer are formed to be flush with each other, and the bonding metal layer and the wiring metal layer are formed to be flush with each other. At the time of bonding between the semiconductor wafer and the package wafer, a pressure can be uniformly applied to the bonding portion between the first metal layer and the bonding metal layer and the bonding portion between the second metal layer and the wiring metal layer. As a result, the solid-phase direct bonding can be obtained with stable quality in a lump sum.

Another concern of the present invention is to provide a method of producing the wafer level package structure described above. That is, this production method comprises the steps of:
providing a semiconductor wafer having a plurality of sensor units, and a package wafer;
forming a first metal layer on each of the sensor units;
forming a bonding metal layer on the package wafer at a position facing the first metal layer;
performing a surface activation treatment in a reduced pressure atmosphere to form activated surfaces of the first metal layer and the bonding metal layer; and after the surface activation treatment, forming a direct bonding between the activated surfaces of the first metal layer and the bonding metal layer at room temperature.

In the production method according to a preferred embodiment of the present invention, the surface activation treatment is performed by use of an atomic beam, an ion beam, or a plasma of an inert gas.

From the viewpoint of preventing the activated surfaces of the first metal layer and the bonding metal layer obtained by the surface activation treatment from contamination with extraneous substances contained in the air, it is particularly preferred to form the direct bonding between the activated surfaces of the first metal layer and the bonding metal layer at room temperature without exposing the semiconductor wafer and the package wafer to outside air after the surface activation treatment.

In addition, it is preferred that the surface activation treatment and the direct bonding step are performed in a same chamber, and an atmosphere adjusting step of adjusting an interior of the chamber to a desired atmosphere is performed before the direct bonding step and after the surface activation treatment. For example, when the sensor unit is an acceleration sensor, the direct bonding step is preferably performed after the interior of the sensor unit is maintained in an inert-gas atmosphere. Alternatively, when the sensor unit is a gyro sensor, the direct bonding step is preferably performed after the interior of the sensor unit is maintained in a reduced pressure atmosphere such as high vacuum.

In addition, as another preferred embodiment of the present invention, each of the sensor units comprises a frame having an opening, a movable portion held in the opening to be movable relative to the frame, the first metal layer formed over the entire circumference of the frame so as to surround the movable portion, a detecting portion configured to output an electrical signal according to a positional displacement of the movable portion, and a second metal layer electrically connected to the detecting portion and formed at a position closer to the movable portion than the first metal layer. On the other hand, the package wafer comprises a through-hole wiring formed with respect to each of the sensor units, and a wiring metal layer electrically connected to the through-hole wiring. After the surface activation treatment is performed to the second metal layer and the wiring metal layer, the direct bonding between the activates surfaces of the first metal layer and the bonding metal layer and a direct bonding between activated surfaces of the second metal layer and the wiring metal layer are simultaneously formed at room temperature. In this case, there is an advantage that mechanical and electrical connections between the semiconductor wafer and the package wafer can be obtained simultaneously.

By cutting the wafer level package structure obtained by the above-described production method into a size of the sensor unit, it is possible to efficiently obtain the sensor devices, each of which has a compact size and reduced variations in sensor characteristics.

BRIEF EXPLANATION OF THE DRAWINGS

FIGS. 1A and 1B are respectively schematic plan and side views of a wafer level package structure according to a first embodiment;

FIG. 3A is a top view of a sensor substrate, and FIG. 3B is a cross-sectional view taken along the line B-A' in FIG. 3A;

FIG. 14A is a cross-sectional view showing a surface activation step, FIG. 14B is a cross-sectional view showing an atmosphere adjusting step, and FIG. 14C is a cross-sectional view showing a room-temperature bonding step;

FIGS. 15A and 15B are respectively schematic plan and side views of a wafer level package structure according to a second embodiment, and FIG. 15C is a schematic cross-sectional view of a sensor device in the wafer level package structure;

FIG. 18A is a top view of a first package substrate, and FIG. 18B is a cross-sectional view taken along the line A-A' in FIG. 18A;

FIG. 26 is an enlarged view of a relevant portion of the sensor substrate;

BEST MODE FOR CARRYING OUT THE INVENTION

Figure 2A:
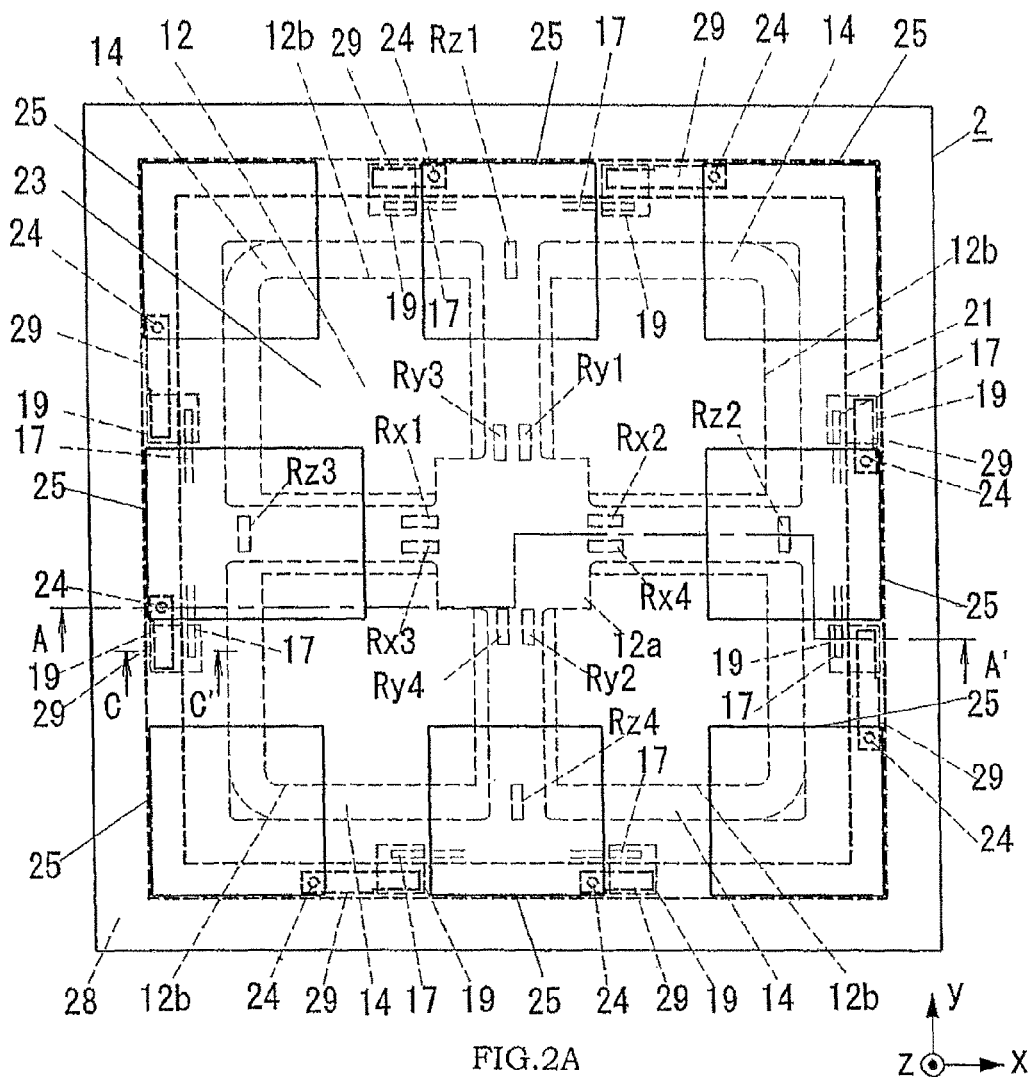
FIGS. 2A and 2B are respectively schematic plan and cross-sectional views of a sensor device obtained from the wafer level package structure.
Figure 2B:
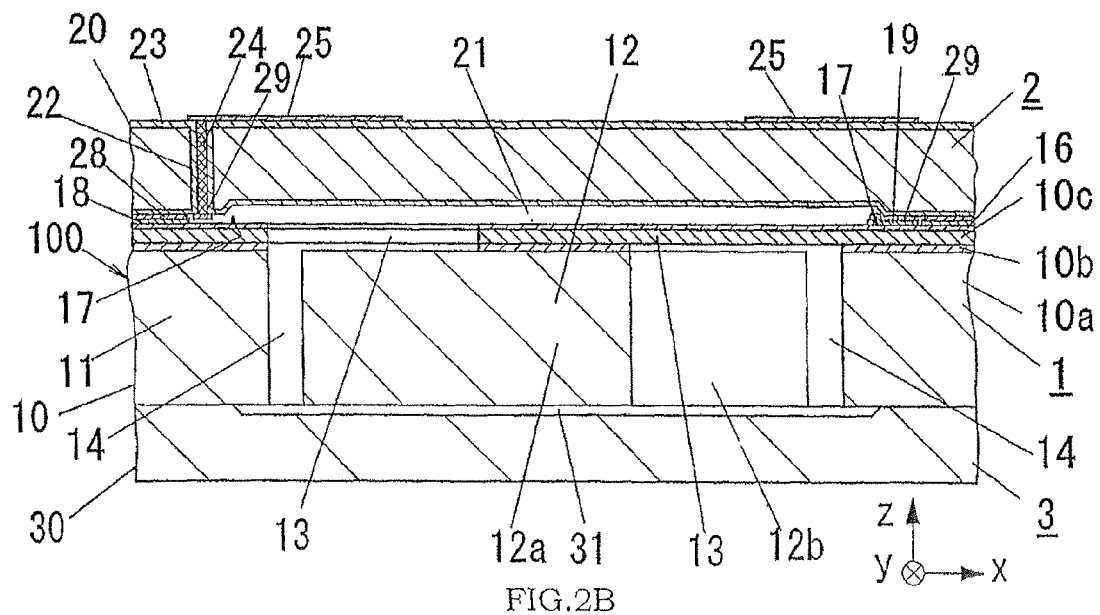

Referring to the attached drawings, the wafer level package structure of the present invention, the production method therefor, and the sensor device obtained from the same structure are explained below in details.

First Embodiment

As shown in FIGS. 1A, 1B, and FIGS. 2A, 2B, a wafer level package structure 100 of the present embodiment has a structure comprised of a semiconductor wafer 10 with a plurality of acceleration sensor units, a first package wafer 20 bonded to one of opposite surfaces of the semiconductor wafer 10, and a second package wafer 30 bonded to the other surface of the semiconductor wafer 10. In the following explanation, a region for forming each of the acceleration sensor units of the semiconductor wafer 10 is defined as a sensor substrate 1. A region facing each of the sensor substrates 1 of the first package wafer 20 is defined as a first package substrate 2. A region facing each of the sensor substrates 1 of the second package wafer 30 is defined as a second package substrate 3.

In the present embodiment, an SOI wafer used as the semiconductor wafer 10 is composed of a support substrate 10a made of a silicon substrate, an insulating layer (embedded oxide film) 10b such as a silicon oxide film formed on the support substrate 10a, and an n-type silicon layer (active layer) 10c formed on the insulating layer 10b. Each of the acceleration sensor units is formed by processing this SOI wafer. Each of the first package wafer 20 and the second package wafer 30 is formed by processing a silicon wafer. In the present embodiment, a thickness of the support substrate 10a of the SOI substrate is in a range of 300 µm to 500 µm, a thickness of the insulating layer 10b is in a range of 0.3 µm to 1.5 µm, and a thickness of the silicon layer 10c is in a range of 4 µm to 10 µm. In addition, a surface of the silicon layer 10c that is a general surface of the SOI wafer corresponds to a (100) surface. A thickness of the silicon wafer for the first package wafer 20 is in a range of 200 µm to 300 µm, and a thickness of the silicon wafer for the second package wafer 30 is in a range of 100 µm to 300 µm. These thickness values are illustrative only, and therefore the present invention is not limited to them.

Figure 4:
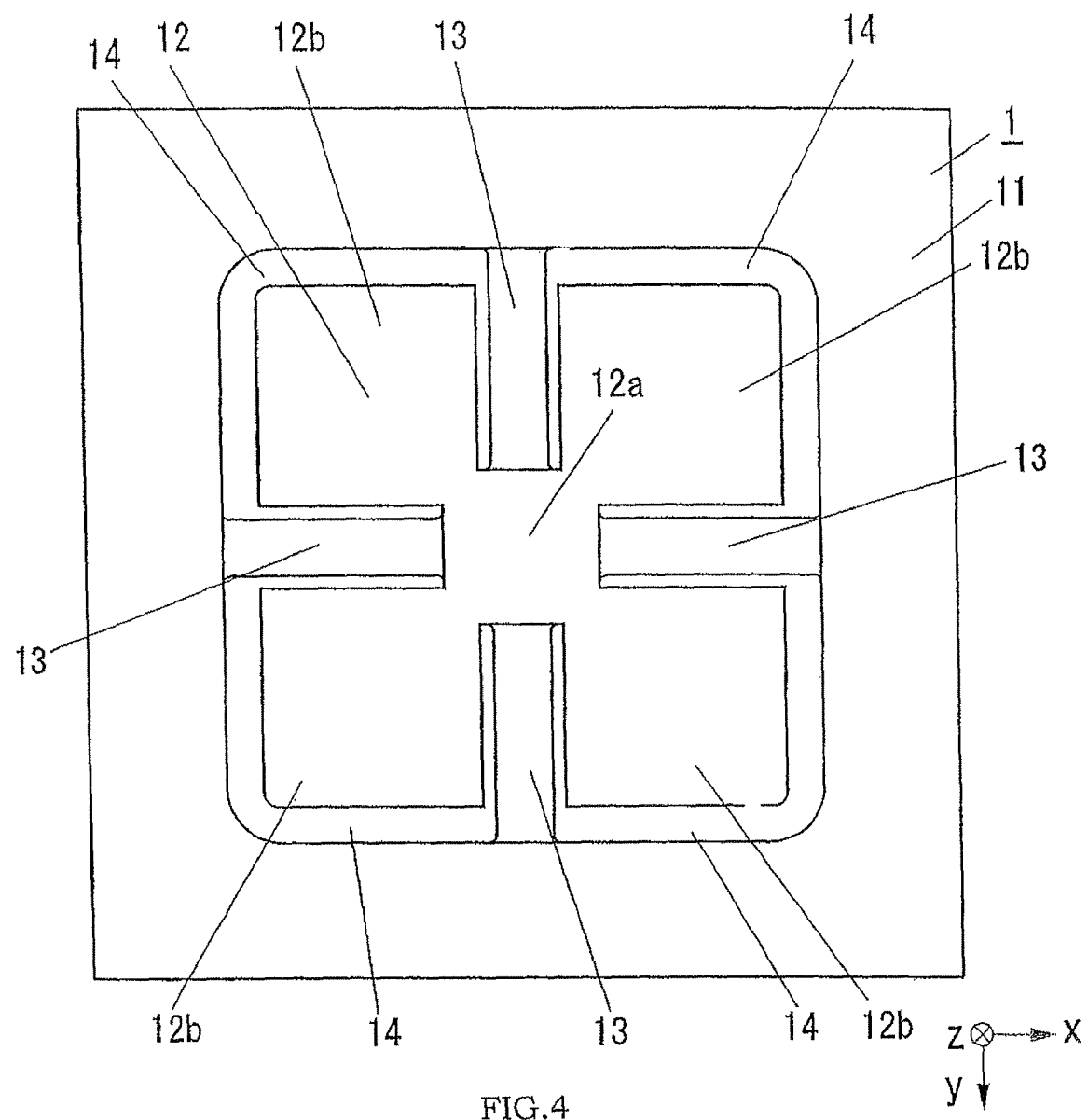
FIG. 4 is a bottom view of the sensor substrate.

FIGS. 3A and 3B are respectively top and cross-sectional views of one acceleration sensor unit (corresponding to an area "A" in FIG. 1A) formed in the sensor substrate 1. In addition, FIG. 4 is a bottom view of the acceleration sensor unit. Each of the acceleration sensor units has a frame portion 11 (for example, a rectangular frame portion) having an inner opening, a weight portion 12 disposed inside of the frame portion 11, and four flexible portions 13 each formed in a strip-like shape and having flexibility. The weight portion 12 is supported at the top-surface side (FIG. 3A) of the sensor unit by the flexible portions 13 to be movable relative to the frame portion 11 in a swinging manner. In other words, the weight portion 12 is movably supported in the inner opening of the frame portion 11 in a swinging manner by the four flexible portions 13 extending from four sides of the weight portions toward the frame portion 11. The frame portion 11 is formed by use of the support substrate 10a, the insulating layer 10b and the silicon layer 10c of the above-described SOI substrate. On the other hand, as shown in FIG. 3B, the flexible portions 13 are formed by use of the silicon layer 10c of the SOI substrate. Therefore, the flexible portion 13 has a sufficiently smaller thickness than the frame portion 11.

The weight portion 12 has a core section 12a having a rectangular solid shape, which is supported to the frame portion 11 through the four flexible portions 13, and four leaf sections 12b each having a rectangular solid shape, which are integrally coupled to four corners of the core section 12a at the top-surface side of the sensor substrate 1. That is, when viewing from the above of the sensor substrate 1, each of the leaf sections 12b is disposed in a spaced surrounded by the frame portion 11, the core section 12a, and two flexible portions 13 extending in directions orthogonal to each other. The numeral 14 designates a slit formed between each of the leaf sections 12b and the frame portion 13. A distance between adjacent leaf sections 12b through the flexible portion 13 is larger than the width dimension of the flexible portion 13. The core section 12a is formed by use of the support substrate 10a, the insulating layer 10b and the silicon layer 10c of the above-described SOI wafer. On the other hand, each of the leaf sections 12b is formed by use of the support substrate 10a of the SOI wafer. At the top-surface side of the sensor substrate 1, the top surface of each of the leaf sections 12b is provided at a lower position than the top surface of the core section 12a, i.e., at a side closer to the bottom of the sensor substrate 1 (FIG. 4). The frame portion 11, the weight portion 12 and the flexible portions 13 of the sensor substrate 1 are preferably formed by using conventional lithography and etching technologies.

By the way, as shown at a lower right portion of each of FIGS. 3A, 3B and 4, when a horizontal direction of the frame portion 11 corresponds to an "x" axis, a horizontal direction orthogonal to the "x" axis corresponds to a "y" axis, and a thickness direction of the sensor substrate 1 corresponds to a "z" axis, the weight portion 12 is supported to the frame portion 11 by a pair of the flexible portions 13 extending in the "x" axis direction at both sides of the core section 12a, and another pair of the flexible portions 13 extending in the "y" axis direction at both sides of the core section 12a. The rectangular coordinate system defining the above-described "x", "y" and "z" axes has an origin, which corresponds to a center position of the top surface of the weight portion 12 formed by the silicon layer 10c of the sensor substrate 1.

On the flexible portion 13 extending from the core section 12a of the weight portion 12 in a positive direction of the "x" axis, i.e., the flexible portion 13 positioned at the right side of FIG. 3A, a pair of piezoresistive elements (Rx2, Rx4) are formed near the core section 12a, and a piezoresistive element Rz2 is formed near the frame portion 11. On the other hand, on the flexible portion 13 extending from the core section 12a of the weight portion 12 in a negative direction of the "x" axis, i.e., the flexible portion 13 positioned at the left side of FIG. 3A, a pair of piezoresistive elements (Rx1, Rx3) are formed near the core section 12a, and a piezoresistive element Rz3 is formed near the frame portion 11. In this regard, the four piezoresistive elements (Rx1, Rx2, Rx3, Rx4) formed near the core section 12a are used to detect acceleration in the "x" axis direction. Each of the piezoresistive elements (Rx1, Rx2, Rx3, Rx4) is formed in an elongate rectangular shape as a planar shape, and disposed such that the elongate direction of the piezoresistive element is substantially the same as the longitudinal direction of the flexible portion 13. In addition, these piezoresistive elements are connected by wirings (diffusion layer wirings and metal wirings 17 formed on the sensor substrate 1) to obtain a bridge circuit Bx shown at a left side of FIG. 5. The piezoresistive elements (Rx1, Rx2, Rx3, Rx4) are formed at stress concentration regions of the flexible portions 13 where stress concentration occurs when the acceleration is applied in the "x" axis direction.

On the flexible portion 13 extending from the core section 12a of the weight portion 12 in a positive direction of the "y" axis, i.e., the flexible portion 13 positioned at the upper side of FIG. 3A, a pair of piezoresistive elements (Ry1, Ry3) are formed near the core section 12a, and a piezoresistive element Rz1 is formed near the frame portion 11. On the other hand, on the flexible portion 13 extending from the core section 12a of the weight portion 12 in a negative direction of the "y" axis, i.e., the flexible portion 13 positioned at the lower side of FIG. 3A, a pair of piezoresistive elements (Ry2, Ry4) are formed near the core section 12a, and a piezoresistive element Rz4 is formed near the frame portion 11. In this regard, the four piezoresistive elements (Ry1, Ry2, Ry3, Ry4) formed near the core section 12a are used to detect acceleration in the "y" axis direction. Each of the piezoresistive elements (Ry1, Ry2, Ry3, Ry4) is formed in an elongate rectangular shape as a planar shape, and disposed such that the elongate direction of the piezoresistive element is substantially the same as the longitudinal direction of the flexible portion 13. In addition, these piezoresistive elements are connected by wirings (diffusion layer wirings and metal wirings 17 formed on the sensor substrate 1) to obtain a bridge circuit By shown at a center of FIG. 5. The piezoresistive elements (Ry1, Ry2, Ry3, Ry4) are formed at stress concentration regions of the flexible portions 13 where stress concentration occurs when the acceleration is applied in the "y" axis direction.

Figure 5:
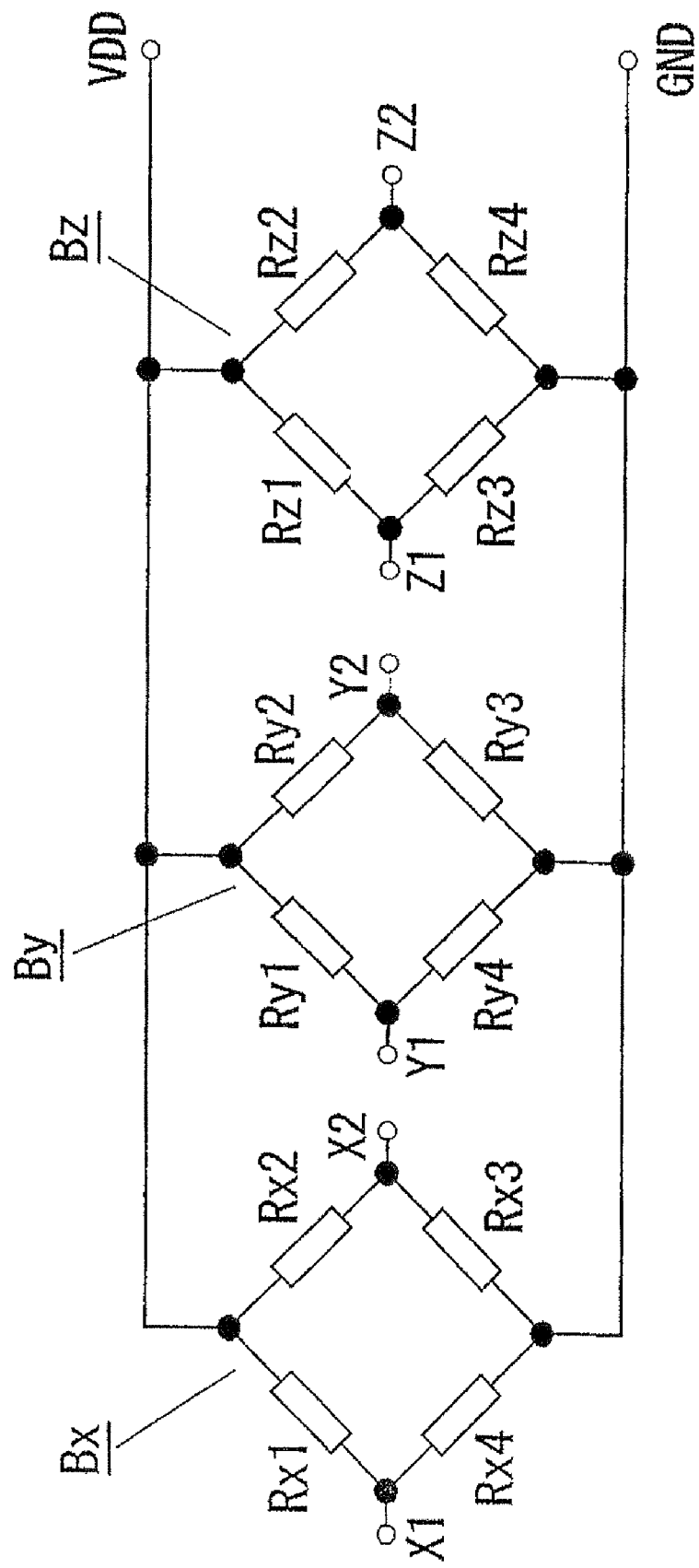
FIG. 5 is a circuit diagram of the sensor substrate.

In addition, the piezoresistive elements (Rz1, Rz2, Rz3, Rz4) formed near the frame portion 11 are used to detect acceleration in the "z" axis direction, and connected by wirings (diffusion layer wirings and metal wirings 17 formed on the sensor substrate 1) to obtain a bridge circuit Bz shown at a right side of FIG. 5. The piezoresistive elements (Rz1, Rz4) are disposed on the pair of the flexible portions 13 such that that the elongate direction of the piezoresistive element is substantially the same as the longitudinal direction of the flexible portion 13, and the piezoresistive elements (Rz2, Rz3) are disposed on another pair of the flexible portions 13 such that that the elongate direction of the piezoresistive element is substantially the same as the width (lateral) direction of the flexible portion 13.

FIG. 3A shows only a part of the metal wirings 17 on the sensor substrate 1 in the vicinity of a second metal layer 19 described later. In addition, the diffusion layer wirings are not shown in FIG. 3A.

The piezoresistive elements (Rx1 to Rx4, Ry1 to Ry4, Rz1 to Rz4) and the diffusion layer wirings are formed by doping a p-type impurity into predetermined formation sites of the silicon layer 10c at an appropriate concentration. On the other hand, the metal wirings 17 can be obtained by forming a metal film (e.g., Al film, Al alloy film or the like) on the insulating film 16 by means of sputtering or vapor deposition, and then patterning the metal film by using conventional lithography and etching technologies. The metal wirings 17 can be electrically connected to the diffusion layer wirings through contact holes formed in the insulating film 16.

Figure 6A:
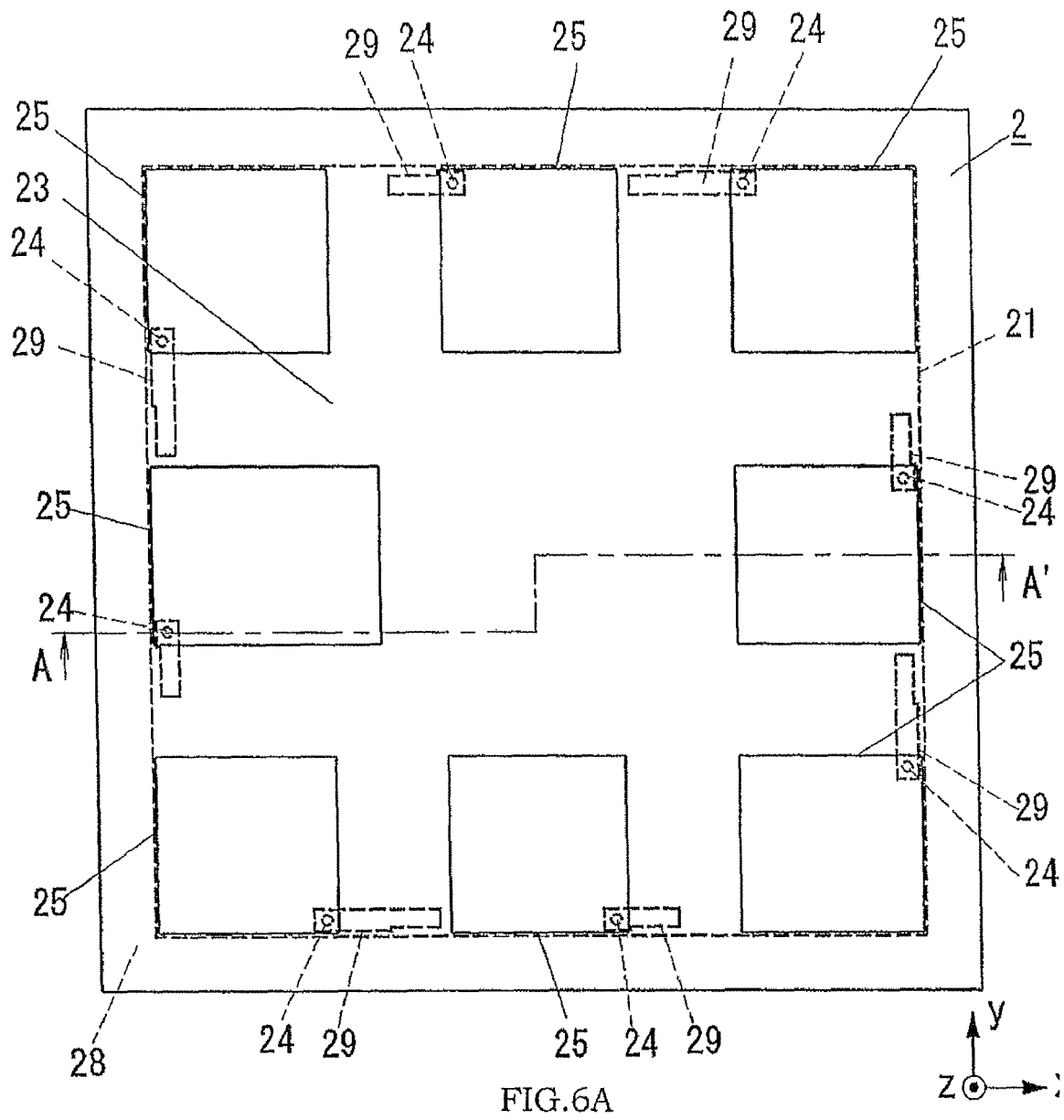
FIG. 6A is a top view of a first package substrate.
Figure 6B:
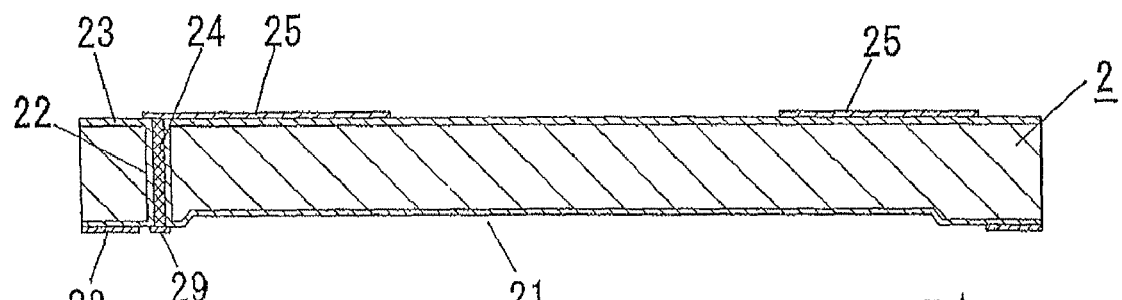
FIG. 6B is a cross-sectional view taken along the line A-A' in FIG. 6A.
Figure 7:
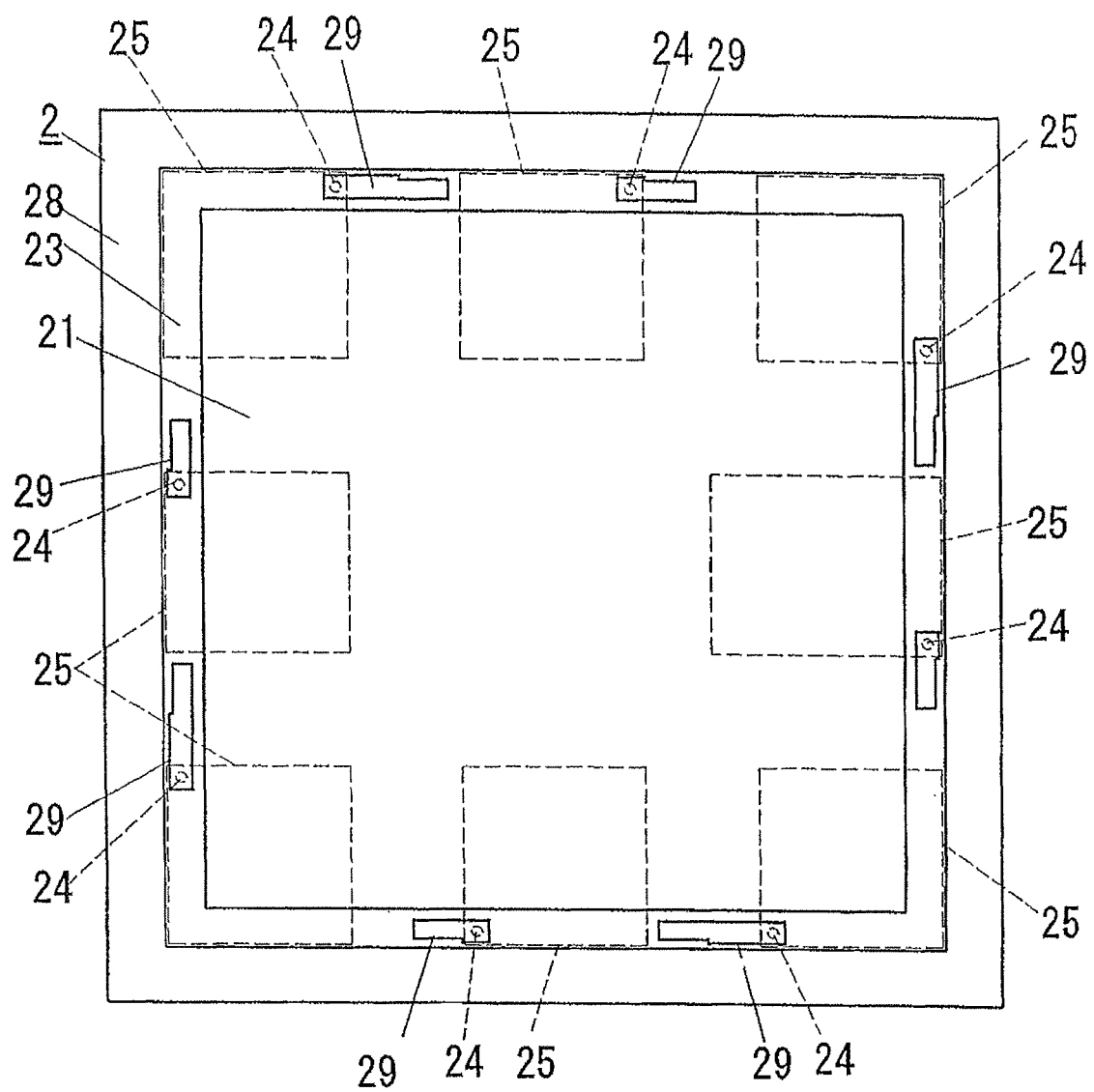
FIG. 7 is a bottom view of the first package substrate.

As shown in FIGS. 6A, 6B and 7, the first package substrate 2 is formed at a surface facing the sensor substrate 1 with a concave portion 21 for providing a space for positional displacement of the movable portion comprised of the weight portion 12 and the flexible portions 13 of the sensor substrate 1, and a plurality of through holes 22 (e.g., eight through holes) formed in the thickness direction around the concave portion 21. The outer peripheral shape of each of the sensor substrate 1 and the first package substrate 2 is a rectangular shape, and the first package substrate 2 is formed to have the same outside dimension as the sensor substrate 1.

The first package substrate 2 has an insulating film 23 formed by a heat insulating film (silicon oxide film) on the opposite surfaces in the thickness direction as well as the inner surfaces of the through holes 22. Therefore, a part of the insulating film 23 lies between a through-hole wiring 24 and the inner surface of each of the through holes 22. In this embodiment, eight through-hole wirings 24 are formed to be spaced from each other in the circumferential direction of the first package substrate 2. As a material for the through-hole wirings 24, for example, copper can be used. Alternatively, nickel may be used.

In addition, it is preferred that the through-hole wiring 24 formed in the first package substrate 2 has a tapered shape such that an area of an end portion facing the sensor substrate 1 is larger than the area of the other end portion. When the through-hole wiring is formed by performing electroplating in the tapered through hole formed in the first package substrate, a plating solution is supplied from the end portion having the larger opening area, so that a wiring formation metal precipitates from the end portion having the small opening area toward the other end portion having the large opening area. Thereby, air bubbles generated in the through hole can be easily exhausted to the outside, as compared with the case where the through hole has a constant opening area. In addition, since the plating solution is easy to put in the through hole, it is possible to prevent a reduction in metal ion concentration in the through hole, and increase the metal precipitation rate. As a result, there is an advantage that the through-hole wiring 24 having a uniform thickness can be efficiently formed. A plurality of electrodes 25 for external connection are formed on a (top) surface of the first package substrate 2 at an opposite side of the surface facing the sensor substrate 1 so as to be electrically connected with the through-hole wirings 24. The electrode 25 of the present embodiment has a rectangular outer peripheral shape.

Figure 8A:
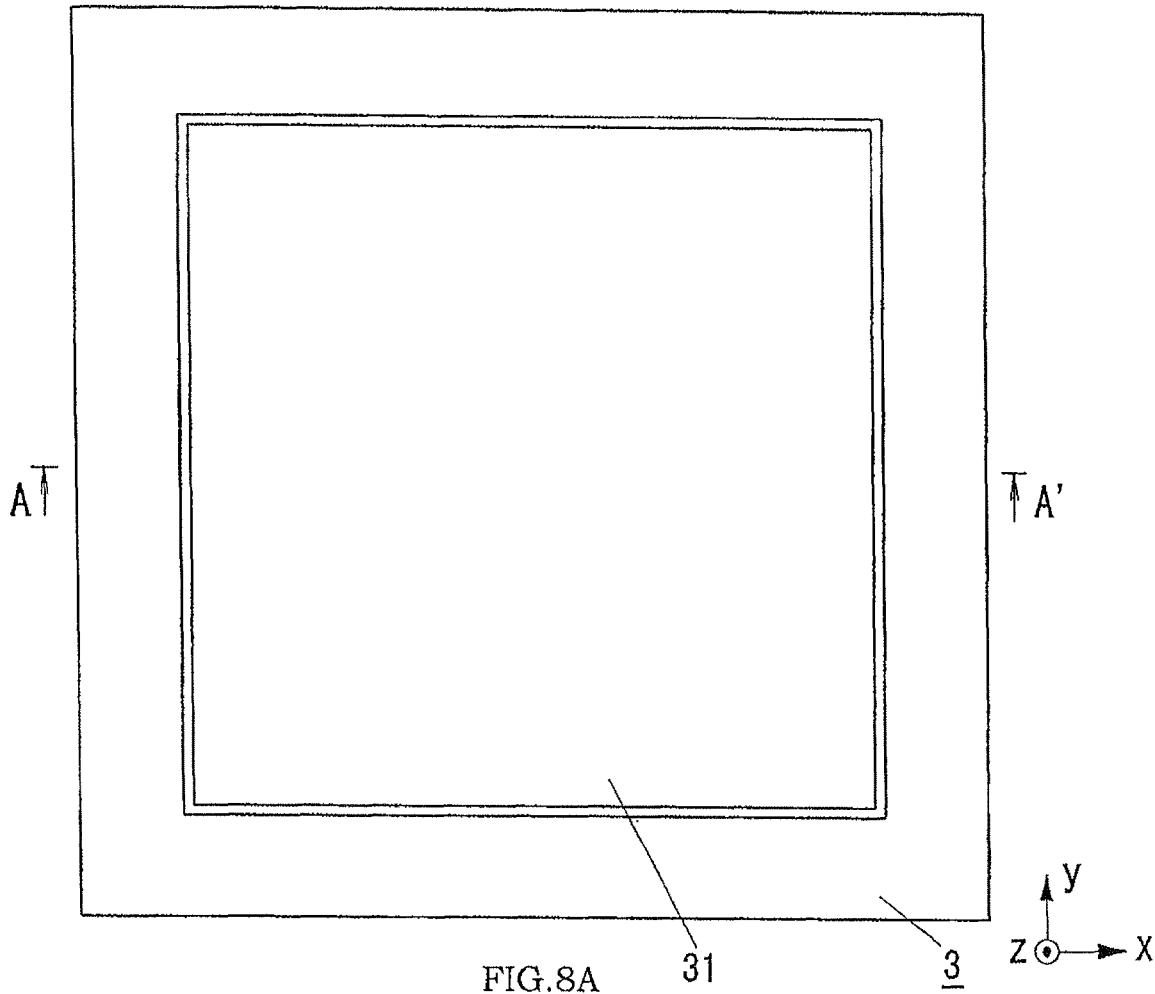
FIGS. 8A and 8B are respectively top and cross-sectional views of a second package substrate.
Figure 8B:
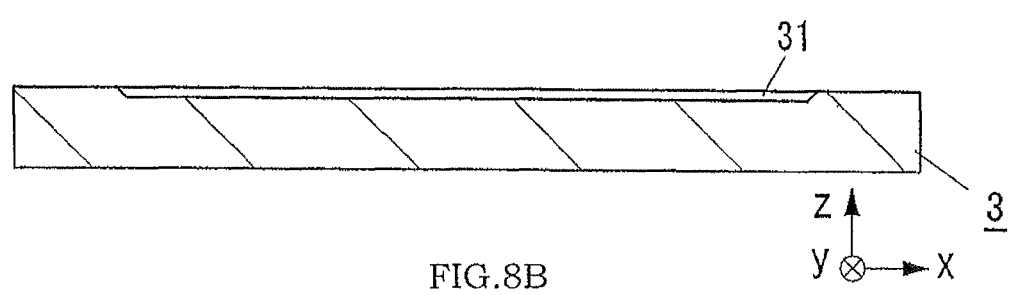

As shown in FIGS. 8A and 8B, the second package substrate 3 is formed at a surface facing the sensor substrate 1 with a concave portion 31 having a predetermined depth (e.g., 5 μm to 10 μm) for providing a space for positional displacement of the weight portion 12. The concave portion 31 can be formed by using conventional lithography and etching technologies. Each of the sensor substrate 1 and the second package substrate 3 has a rectangular outer peripheral shape. The second package substrate 3 is formed to have the same outside dimension as the sensor substrate 1.

When the thickness of a portion of the support substrate 10a used to form the core section 12a and the leaf sections 12b of the weight portion 12 is determined to be smaller than the thickness of another portion of the support substrate 10a used to form the frame portion 11 by a dimension corresponding to an allowable positional displacement amount of the weight portion 12 in the thickness direction of the sensor substrate 1, a clearance for enabling the positional displacement of the weight portion 12 can be obtained between the weight portion 12 and the second package substrate 3 without the formation of the concave portion 31 in the second package substrate 3.

Figure 9:
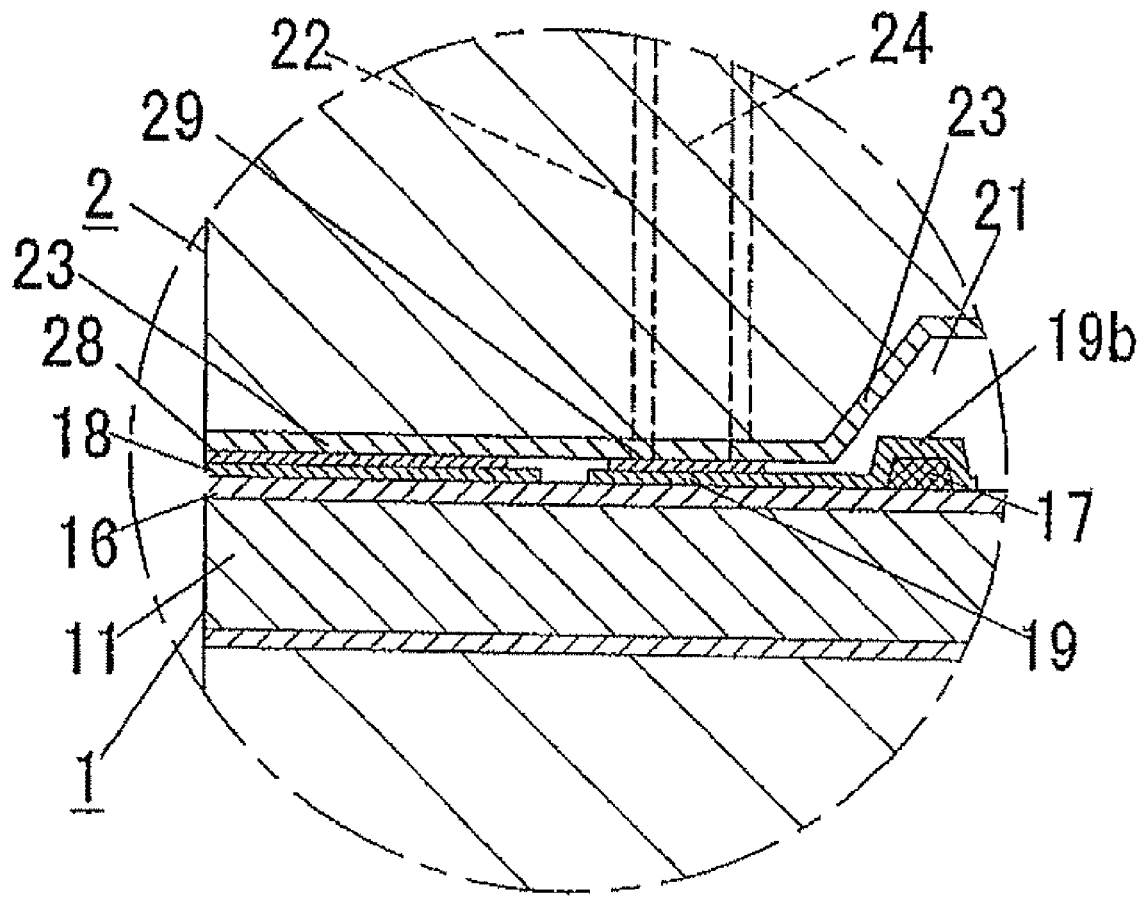
FIG. 9 is an enlarged cross-sectional view of a bonding portion between the sensor substrate and the first package substrate.

Next, a bonding portion between the sensor substrate 1 and the first package substrate 2 is explained. On the frame portion 11 of each of the acceleration sensor units, a first metal layer 18 is formed at a side facing the first package substrate 2 over the entire circumference of the frame portion so as to surround the movable portion comprised of the weight portion 12 and the flexible portions 13. The bonding portion between the sensor substrate 1 and the first package substrate 2 is formed, as shown in FIG. 9, by a solid-phase direct bonding without diffusion between an activated surface of the first metal layer 18 of each of the acceleration sensor units and an activated surface of a frame-like metal layer 28 formed on a corresponding region of the first package substrate 2. This solid-phase direct bonding can be obtained by pressing the activated surfaces to each other at room temperature, as described later.

In addition, the first package substrate 2 has a plurality of wiring layers 29, which are formed at an inner side of the frame-like metal layer 28 and around the concave portion 21, and electrically connected to the through-hole wirings 24. For example, the number of the wiring layers 29 formed in the present embodiment is eight. Each of the wiring layers 29 is connected at an end portion of its longitudinal direction to the through-hole wiring 24. The wiring layer 29 is positioned at a side closer to the weight portion 12 than the first metal layer 18 of the sensor substrate 1, and also electrically connected to a second metal layer 19 formed on the frame portion 11. The connection between the second metal layer 19 and the wiring layer 29 is positioned at an outer side of the metal wiring 17 on the sensor substrate 1.

On the surface facing the first package substrate 2 of the sensor substrate 1, an insulating film 16 is formed, which is comprised of a laminate film of a silicon oxide film and a silicon nitride film on the silicon layer 10c. The first metal layer 18, the second metal layers 19 and the metal wirings 17 are formed on the insulating film 16.

The first metal layer 18 and the metal layer 28 are formed by use of the same metal material. For example, Au, Cu or Al is preferably used as the metal material. It is particularly preferred to use Au. The metal material used in the present embodiment is Au. To achieve an improvement in adhesion between the first metal layer 18 of Au and the insulating film 16, a Ti film is formed as an intermediate layer therebetween. In other words, the first metal film 18 is comprised of a laminate film of the Ti film formed on the insulating film 16 and the Au film formed on the Ti film.

Similarly, the second metal layer 19 and the wiring layer 29 are formed by use of the same metal material. For example, Au, Cu or Al is preferably used as the metal material. It is particularly preferred to use Au. The metal material used in the present embodiment is Au. To achieve an improvement in adhesion between the second metal layer 19 of Au and the insulating film 16, a Ti film is formed as an intermediate layer therebetween. In other words, the second metal film 19 is comprised of a laminate film of the Ti film formed on the insulating film 16 and the Au film formed on the Ti film.

With respect to each of the first metal layer 18 and the second metal layer 19, a thickness of the Ti film can be preferably set in a range of 15 to 50 nm. In the present embodiment, a thickness of the Au film is set to 500 nm, and a thickness of the metal wiring 17 is set to 1 µm. These thickness values are illustrative only, and the present invention is not limited to them. In the case of using the Au film, it is preferred that the thickness is not larger than 500 nm from the viewpoint of improving yields in the bonding process. The Au film may be formed by use of a gold material containing an impurity other than pure gold. In the present embodiment, the Ti film is formed as the adhesive layer for improving the adhesion between the Au film and the insulating film 16. In place of the Ti film, Cr, Nb, Zr, TiN, TaN or the like may be used as the material for the adhesive layer.

As described above, when the first metal layer 18 and the second metal layer 19 are formed by use of the same metal material, it is effective to achieve a reduction in production cost because those metal layers having substantially the same thickness can be formed simultaneously. That is, since the first metal layer 18 and the second metal layer 19 are formed to be flush with each other on the sensor substrate 1, and the metal layer 28 and the wiring layer 29 are formed to be flush with each other on the first package substrate 2, it becomes possible to apply a uniform pressure to the bonding interface between the sensor substrate 1 and the first package substrate 2. Consequently, the solid-phase direct bonding between the first metal layer 18 and the metal layer 28 and the solid-phase direct bonding between the second metal layer 19 and the wiring layer 29 can be obtained with stable quality.

Figure 10:
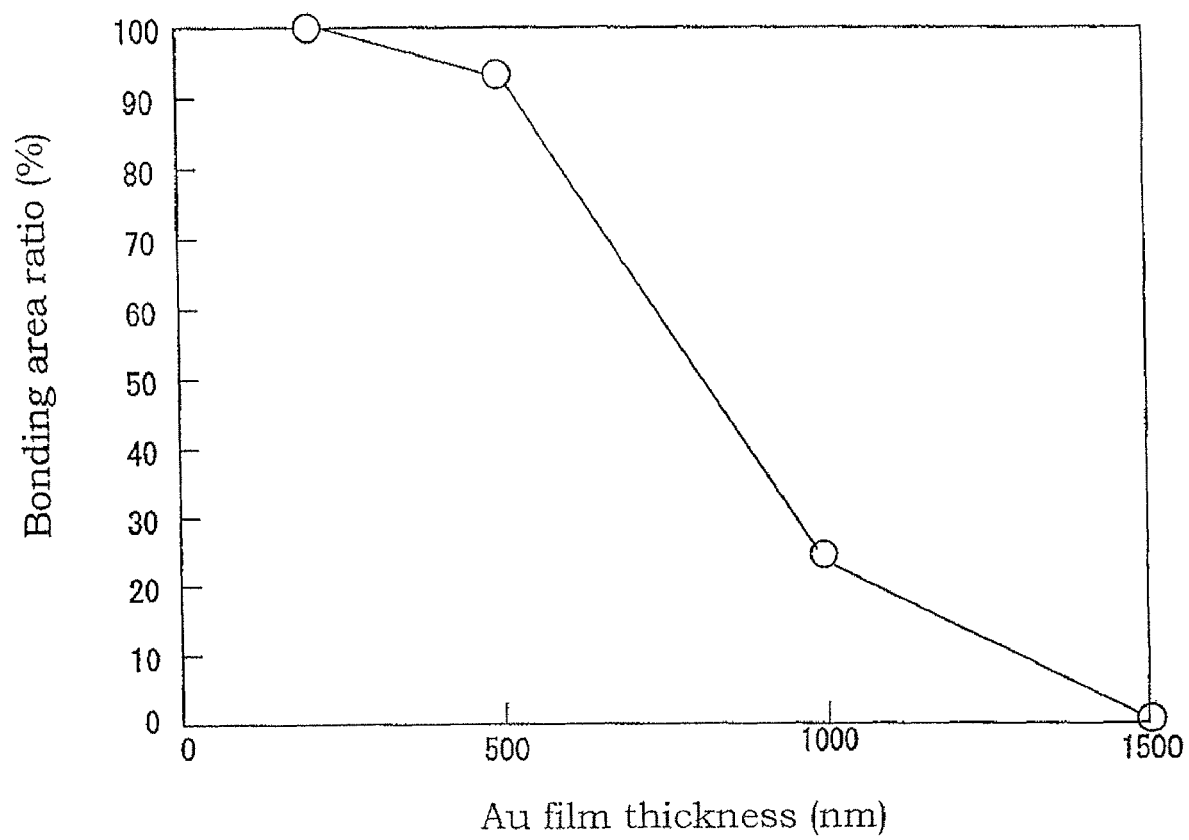
FIG. 10 is a graph showing a relation between Au film thickness and bonding area ratio.

By the way, to improve yields of the solid-phase direct bonding between the first metal layer 18 and the metal layer 28 and the solid-phase direct bonding between the second metal layer 19 and the wiring layer 29, an optimum thickness of the Au film used as these metal layers is discussed below. That is, a plurality of SOI wafers, which are the same as the SOI wafer used for the semiconductor wafer 10, were prepared, and the insulating film 16 and the Ti film were formed on the entire surface of each of the SOI wafers under the same conditions as the present embodiment. Next, Au films were formed on the SOI wafers to have different thicknesses from each other. Similarly, a plurality of silicon wafers, which are the same as the silicon wafer used for the first package substrate 20, were prepared, and the insulating film 23 and the Ti film were formed on the entire surface of each of the silicon wafers under the same conditions as the present embodiment. Next, Au films were formed on the silicon wafers to have different thicknesses from each other. By using the SOI wafer and the silicon wafer, which have the same thickness of the Au film, activated surfaces of those Au films were bonded to each other at room temperature. Subsequently, an area (bonding area) of a bonding portion between the Au films was observed by use of an ultrasonic microscope, and a ratio of the bonding area relative to the wafer area was calculated as a bonding area ratio. FIG. 10 is a graph showing a relation between the thus obtained bonding area ratio and the thickness of the Au film. As understood from this graph, as the thickness of the Au film increases, the bonding area ratio decreases. It is presumed that this is because a defective bonding easily occurs when the surface roughness of the Au film becomes large due to an increase in film thickness. In addition, it shows that the Au film having the thickness of 500 nm or less is preferred to obtain 90% or more of the bonding area ratio. In other words, the thickness of the Au film is preferably 500 nm or less to improve the yields of the solid-phase direct bonding between the first metal layer 18 and the metal layer 28 and the solid-phase direct bonding between the second metal layer 19 and the wiring layer 29. As to a lower limit value of the film thickness, it is desired that the lower limit value is set to 10 nm or more in consideration of an increase in resistance value caused by poor continuity of the Au film, and the occurrence of a defective conductivity between the second metal layer 19 and the wiring layer 29.

Figure 11A:
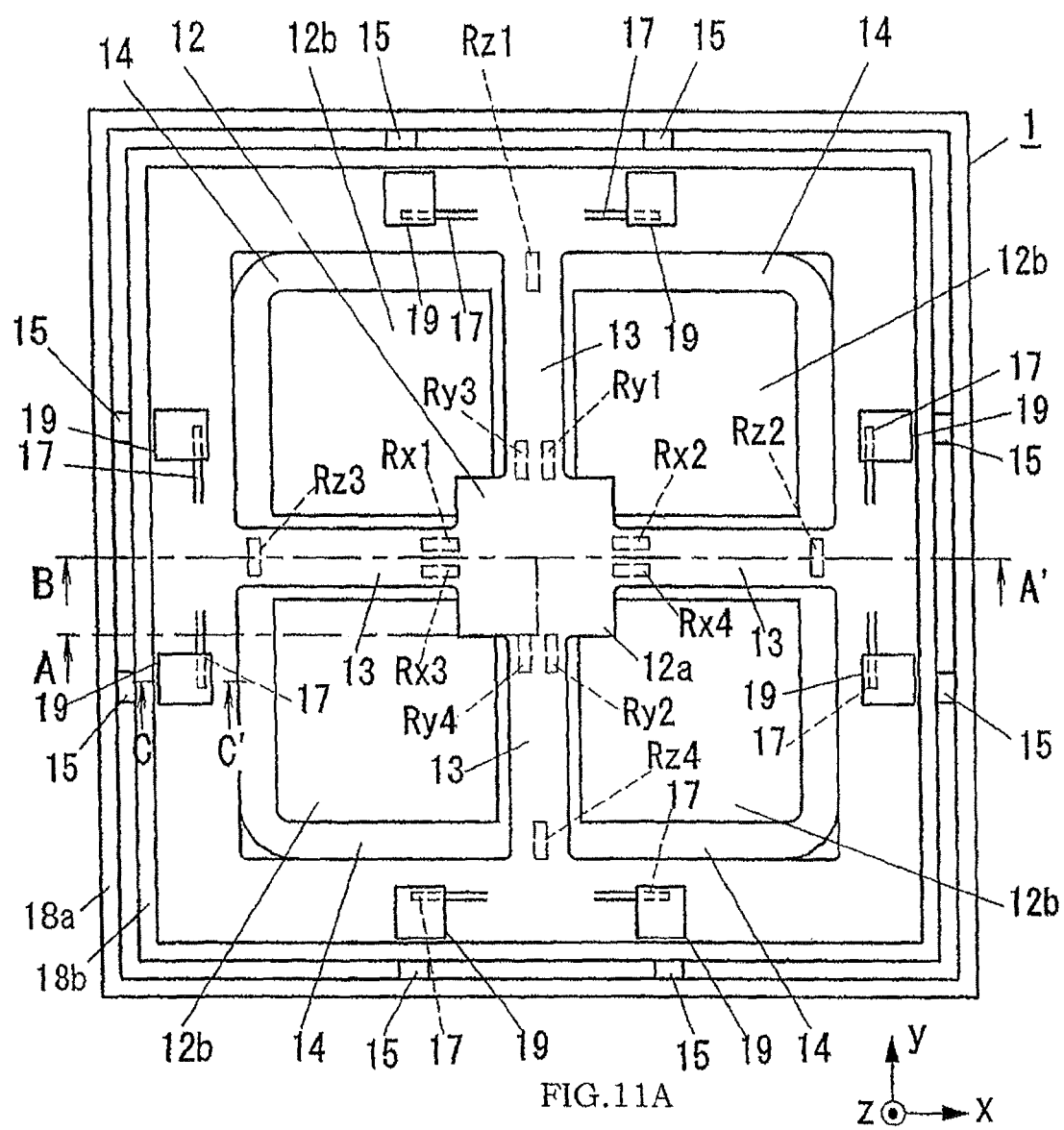
FIG. 11A is a top view of the sensor substrate according to a modification of the present embodiment.
Figure 11B:
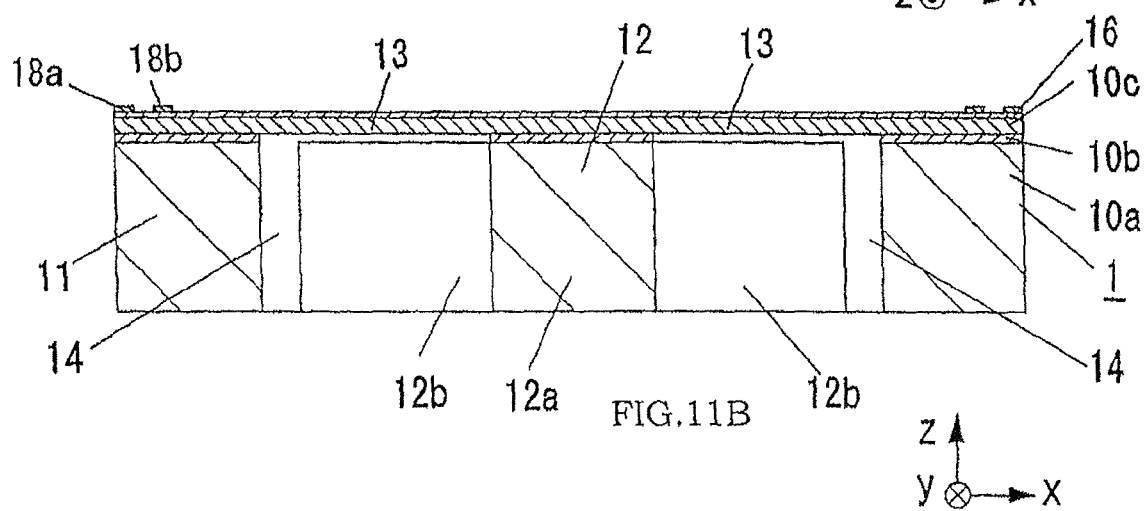
FIG. 11B is a cross-sectional view taken along the line B-A' in FIG. 11A.
Figure 12A:
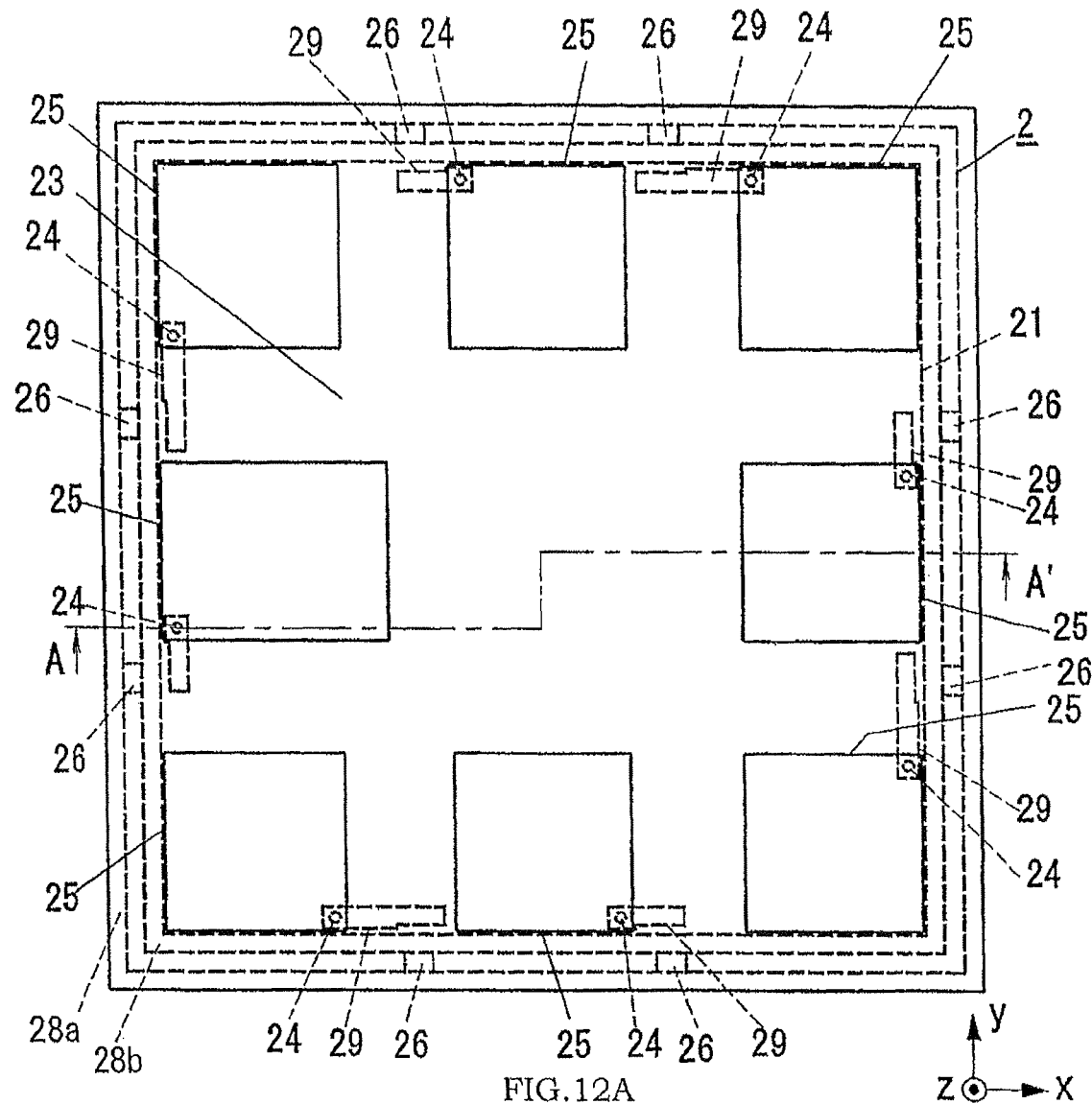
FIG. 12A is a top view of the first package substrate according to a modification of the present embodiment.
Figure 12B:
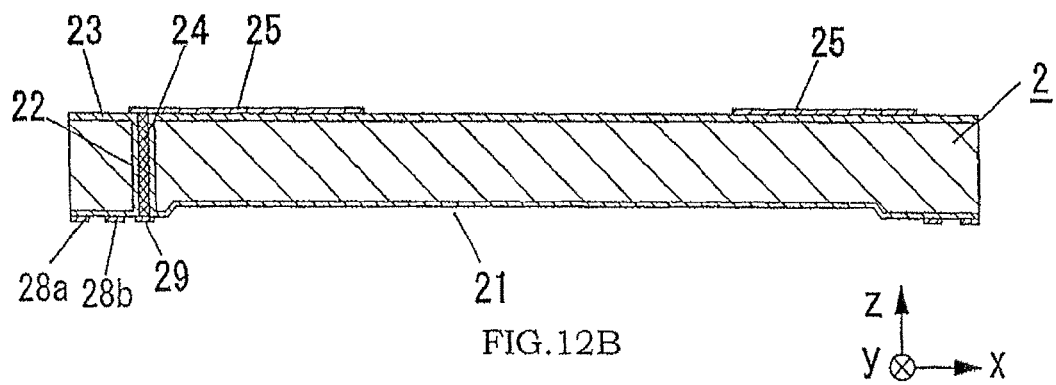
FIG. 12B is a cross-sectional view taken along the line A-A' in FIG. 12A.
Figure 13:
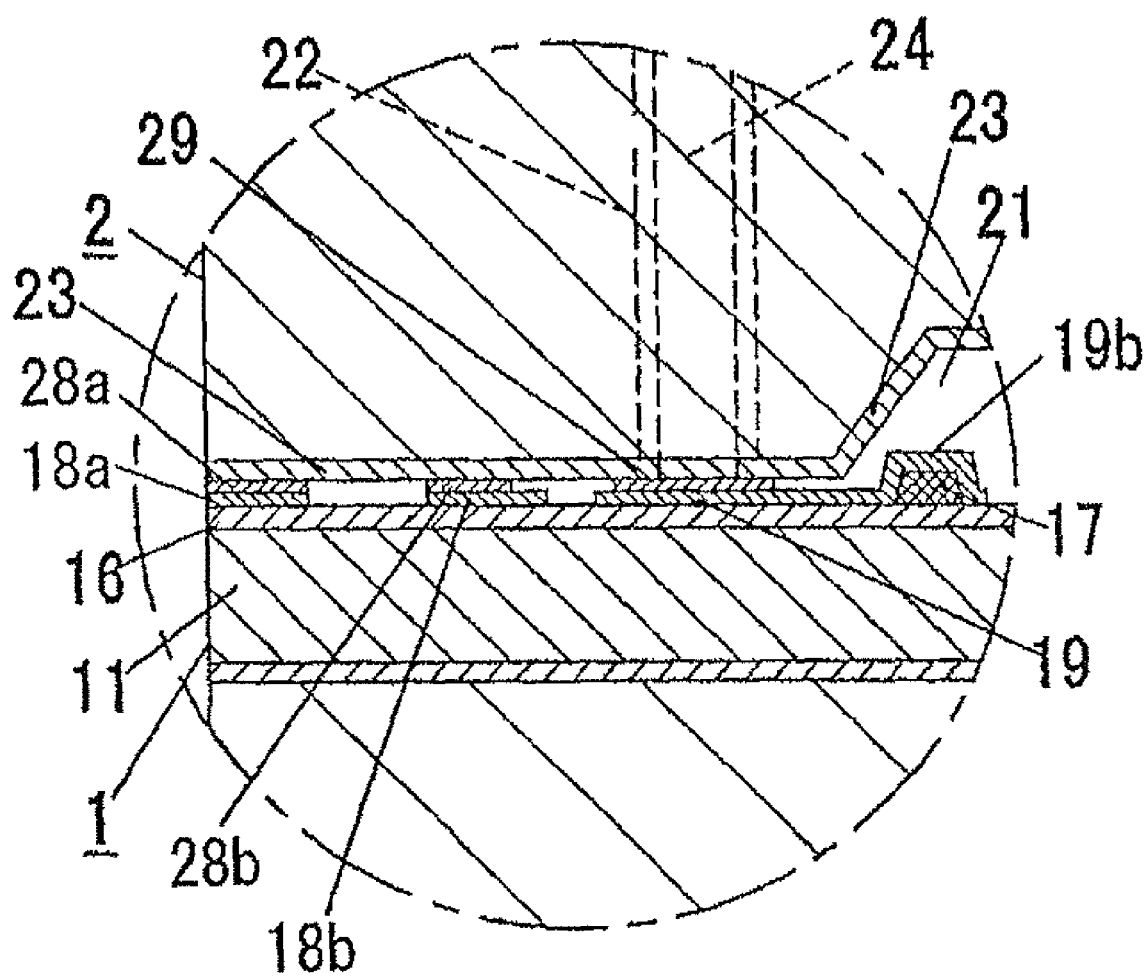
FIG. 13 is a schematic enlarged cross-sectional view of a bonding portion between the sensor substrate of FIG. 11A and the first package substrate of FIG. 12A.

In addition, as shown in FIGS. 11A and 11B, the first metal layer 18 may be composed of a ring-like outer metal layer 18a formed over the entire circumference of the frame portion 11 so as to surround the weight portion 12, and a ring-like inner metal layer 18b formed at an inner side of the outer metal layer 18a over the entire circumference of the frame portion 11 so as to surround the weight portion 12. In this case, as shown in FIGS. 12A and 12B, it is also preferred that the metal layer 28 of the first package substrate 2 is composed of a ring-like outer metal layer 28a and a ring-like inner metal layer 28b disposed at an inner side of the outer metal layer 28a, which are formed in a face-to-face relation with the first metal layer 18. Alternatively, the metal layer 28 of the first package substrate 2 may be formed by a single metal layer, which has a width dimension determined so as to straddle between the outer metal layer 18a and the inner metal layer 18b. Thus, when forming double bonding between the first metal layer 18 and the metal layer 28, as shown in FIG. 13, it is possible to further improve the effect of airtightly sealing the interior (i.e., the movable portion) of the acceleration sensor unit. In FIG. 13, a connecting portion 19b with the metal wiring 17 is located in the concave 21 of the first package substrate 2, and the second metal layer 19 is electrically connected to this connecting portion 19b.

In FIG. 11A, the numeral 15 designates an auxiliary sealing layer extending between the outer metal layer 18a and the inner metal layer 18b. The auxiliary sealing layer 15 is provided at plural locations spaced from each other in the circumferential direction of the frame portion 11 by a predetermined distance. In addition, as shown in FIG. 12A, auxiliary sealing layers 26 are formed on the first package substrate 2 at positions corresponding to the auxiliary sealing layers 15 of the sensor substrate 1. Therefore, when the first package substrate 2 is bonded to the sensor substrate 1, the solid-phase direct bonding between activated surfaces of the auxiliary sealing layers (15, 26) is also obtained. Moreover, the following effect is expected by the formation of the auxiliary sealing layers (15, 26). For example, when a foreign substance exists on the outer metal layer 28a, the airtightness between the outer metal layers (18a, 28a) may deteriorate. Alternatively, when another foreign substance exists on the inner metal layer 28b, the airtightness between the inner metal layers (18b, 28b) may deteriorate. In these cases, it is expected to be difficult to airtightly seal the interior of the sensor device. However, when forming the bonding between the auxiliary sealing layers (15, 26), a plurality of airtight spaces can be obtained between the outer metal layer 18a and the inner metal layer 18b. That is, when a region where a reduction in airtightness of the bonding between the outer metal layers (18a, 28a) occurs due to the foreign substance is located away from the region where a reduction in airtightness of the bonding between the inner metal layers (18b, 28b) occurs due to another foreign substance, these regions can be spatially shielded from each other by the bonding between the auxiliary sealing layers (15, 26). In brief, the airtightness brought by the bonding between the outer metal layers (18a, 28a) and the bonding between the inner metal layers (18b, 28b) can be further reliably improved by the bonding between the auxiliary sealing layers (15, 26).

In the present embodiment, as described above, the first metal layer 18 is formed on the surface facing the first package substrate 2 over the entire circumference of the frame portion 11 so as to surround the weight portion 12, and the metal layer 28 is formed at the corresponding region on the first package substrate 2. Alternatively, it is preferred that a Si layer or a $SiO_2$ layer is formed in place of the first metal layer 18, and a Si layer or a $SiO_2$ layer is formed in place of the metal layer 28. In brief, the bonding between the sensor substrate 1 and the first package substrate 2 may be formed by any one of a solid-phase direct bonding between Si and Si, a solid-phase direct bonding between Si and $SiO_2$, and a solid-phase direct bonding between $SiO_2$ and $SiO_2$.

To form the solid-phase direct bonding without diffusion between the sensor substrate 1 and the first package substrate 2, activated surfaces of the first metal layer 18 and the metal layer 28 are previously formed prior to the bonding step. In the present embodiment, these activated surfaces are obtained by irradiating an atomic beam, an ion beam or a plasma of argon in vacuum to clean up and activate the surfaces of the first metal layer 18 and the metal layer 28. Similarly, the activated surfaces can be formed on the second metal layer 19 and the wiring layer 29. Subsequently, the room-temperature bonding method described above is performed. That is, the direct bonding between the first metal layer 18 and the metal layer 28 and the direct bonding between the second metal layer 19 and the wiring layer 29 are simultaneously formed by applying an appropriate load at room temperature.

Next, the bonding portion between the sensor substrate 1 and the second package substrate 3 is explained. The frame portion 11 of each of the acceleration sensor units has a surface activated region formed on the surface facing the second package substrate 3 over the entire circumference of the frame portion 11 by a surface activation treatment. The bonding portion between the sensor substrate 1 and the second package substrate 3 is formed by the solid-phase direct bonding without diffusion between the surface activated region of each of the acceleration sensor units and a surface activated region formed on the corresponding surface of the second package substrate 3 by the surface activation treatment. This solid-phase direct bonding can be obtained by pressing the surface activated regions to each other at room temperature. Therefore, the bonding interface in this case is formed by the solid-phase direct bonding between Si and Si. Alternatively, a $SiO_2$ layer may be formed on one of the sensor substrate 1 and the second package substrate 3 to obtain the solid-phase direct bonding between Si and $SiO_2$. In addition, the $SiO_2$ layer may be formed on both of the sensor substrate 1 and the second package substrate 3 to obtain the solid-phase direct bonding between $SiO_2$ and $SiO_2$. Furthermore, it is also preferred to use the solid-phase direct bonding between surface activated regions of a metal material such as the direct bonding between Au and Au described above. Thus, if necessary, the solid-phase direct bonding can be formed between the sensor substrate 1 and the second package substrate 3, as in the case of forming the solid-phase direct bonding between the sensor substrate 1 and the first package substrate 2.

To manufacture the wafer level package structure 100, it is desired that the second package substrate 3 is directly bonded to the sensor substrate 1, and then the first package substrate 2 is directly bonded to the sensor substrate 1 from the viewpoint of effectively applying the pressure to the bonding interface.

Referring to FIGS. 14A to 14C, the bonding step between the sensor substrate 1 and each of the first package substrate 2 and the second package substrate 3 is concretely explained below.

First, as shown in FIG. 14A, the sensor substrate 1, the first package substrate 2 and the second package substrate 3 are placed in a chamber CH, and the air in the chamber is exhausted to be not greater than a predetermined degree of vacuum (e.g., $1 \times 10^{-5}$ Pa). Subsequently, under a reduced atmosphere, surfaces of the sensor substrate 1, the first package substrate 2 and the second package substrate 3 are cleaned up by means of sputter etching, and then a surface activation treatment is performed. That is, the surface activation treatment is performed to the surfaces of the first and second metal layers (18, 19) of the sensor substrate 1, the surface of the frame portion 11 to be bonded to the second package substrate 3, the metal layers (28, 29) of the first package substrate 2, and the surface of the second package substrate 3 to be bonded to the sensor substrate. As the surface activation treatment, an argon ion beam is irradiated to the surfaces to be treated for a predetermined time period (e.g., 300 seconds). During the surface activation treatment, the internal pressure of the chamber is maintained at a lower degree of vacuum (e.g., approximately $1 \times 10^{-2}$ Pa) than the above-described degree of vacuum. In place of the argon ion beam, an atomic beam or a plasma of argon may be used. The gas used for the surface activation treatment is not limited to argon. Alternatively, an inert gas such as nitrogen and helium may be used.

After the surface activation treatment, an atmosphere adjusting step is performed to adjust the interior of the chamber to a desired atmosphere for the bonding step between the sensor substrate 1 and each of the first and second package substrates (2, 3), as shown in FIG. 14B. By this step, the interior (i.e., the movable portion) of each of the acceleration sensor units can be maintained in the desired atmosphere after the bonding step. For example, in the present embodiment where the acceleration sensor units are formed, the interior of the chamber is controlled to an inert-gas atmosphere such as argon at atmospheric pressure to improve frequency characteristics and impact resistance by damping effects. Such atmosphere control can be carried out by opening and closing a gas introduction valve V1 and a gas exhaust valve V2 of the chamber. To prevent that contamination of the activated surfaces is caused by contact with the outside air, it is particularly preferred that the atmosphere adjusting step and the bonding step are continuously performed in the chamber without exposure to the outside.

After the interior of the chamber is controlled to the desired atmosphere, the direct bonding between the activated surfaces (Au—Au surfaces) of the first metal layer 18 and the metal layer 28 of the first package substrate 2, the direct bonding between the activated surfaces (Au—Au solid-phase bonding) of the second metal layer 19 and the wiring layer 29 of the first package substrate 2, and the direct bonding between the activated surfaces (Si—Si solid-phase bonding) of the frame portion 11 of the sensor substrate 1 and the second package substrate 3 are formed at room temperature by applying an appropriate load (e.g., 300 N), as shown in FIG. 14C. Thus, the solid-phase direct bonding having substantially no residual stress at the bonding interface can be obtained under the condition that the interior of the sensor unit is maintained in the desired atmosphere.

Since the wafer level package structure 100 of the present embodiment has the direct bonding between the sensor substrate 1 and the first package substrate 2 and the direct bonding between the sensor substrate 1 and the second package substrate 3, which are formed according to a low-temperature process such as the room-temperature bonding method, there is an advantage that the piezoresistive elements (Rx1 to Rx4, Ry1 to Ry4, Rz1 to Rz4) become hard to receive the influence of thermal stress, as compared with the case of performing the bonding step with a heat treatment such as reflow soldering. In addition, it is possible to reduce the process temperature, and achieve a simplification of the manufacturing process.

In addition, when the sensor substrate 1 is formed by use of the SOI wafer, and each of the first and second package substrates (2, 3) is formed by use of the Si wafer, it is possible to reduce stress occurring in the flexible portions 13 due to a difference in linear expansion coefficient therebetween, and the influence of the stress resulting from the difference in linear expansion coefficient on output signals of the above-described bridge circuits (Bx, By, Bz). As a result, variations in sensor characteristics can be minimized. Each of the substrates may be formed by a semiconductor material other than silicon.

When dicing the thus obtained wafer level package structure 100 into a size of the acceleration sensor unit formed on the sensor substrate 1, the sensor substrate 1 and the first and second package substrates (2, 3) can be simultaneously cut to have the same outside dimension. Therefore, it is possible to efficiently obtain compact chip size packages.

An operation of the acceleration sensor device obtained from the wafer level package structure of the present embodiment is briefly explained below.

Under the condition that no acceleration is applied to the sensor substrate 1, when acceleration is applied to the sensor substrate 1 in the positive direction of the "x" axis, a positional displacement of the weight portion 12 relative to the frame portion 11 occurs due to an inertia force of the weight portion 12 acting in the negative direction of the "x" axis. As a result, the pair of the flexible portions 13 where the longitudinal direction corresponds to the "x" axis direction elastically deforms, so that resistance values of the piezoresistive elements (Rx1 to Rx4) on the flexible portions 13 change. In this case, the piezoresistive elements (Rx1, Rx3) receive a tensile stress, and the piezoresistive elements (Rx2, Rx4) receive a compression stress. In general, when the piezoresistive element receives the tensile stress, the resistance value (resistivity) increases, and when the piezoresistive element receives the compression stress, the resistance value (resistivity) decreases. Therefore, in this case, the resistance values of the piezoresistive elements (Rx1, Rx3) increase, and the resistance values of the piezoresistive elements (Rx2, Rx4) decrease. When a constant DC voltage is applied from an external power source to between a pair of input terminals (VDD, GND) shown in FIG. 5, a potential difference between output terminals (X1, X2) of the bridge circuit Bx shown at the left side in FIG. 5 changes depending on a magnitude of the acceleration in the "x" axis direction.

Similarly, when acceleration is applied to the sensor substrate 1 in the "y" axis direction, a potential difference between output terminals (Y1, Y2) of the bridge circuit By shown at a center in FIG. 5 changes depending on a magnitude of the acceleration in the "y" axis direction. In addition, when acceleration is applied to the sensor substrate 1 in the "z" axis direction, a potential difference between output terminals (Z1, Z2) of the bridge circuit Bz shown at the right side in FIG. 5 changes depending on a magnitude of the acceleration in the "z" axis direction. Therefore, the sensor substrate 1 is capable of detecting the acceleration applied to the sensor substrate 1 with respect to each of the "x" axis direction, the "y" axis direction and the "z" axis direction by detecting a change in output voltage of each of the bridge circuits (Bx, By, Bz). In the present embodiment, the movable portion is composed of the weight portion 12 and the flexible portions 13, and the sensing portion is formed by the piezoresistive elements (Rx1 to Rx4, Ry1 to Ry4, Rz1 to Rz4), which are gauge resistances on the sensor substrate 1.

By the way, as shown in FIG. 5, the sensor substrate 1 has the two input terminals (VDD, GND) shared by the three bridge circuits (Bx, By, Bz), the two output terminals (X1, X2) of the bridge circuit Bx, the two output terminals (Y1, Y2) of the bridge circuit By, and the two output terminals (Z1, Z2) of the bridge circuit Bz. These input terminals (VDD, GND) and output terminals (X1, X2, Y1, Y2, Z1, Z2) are formed on the surface facing the first package substrate 2 by the second metal layers 19, and electrically connected to the through-hole wirings 24 formed in the first package substrate 2. That is, in the present embodiment, the second metal layers 19 are formed at eight locations on the sensor substrate 1, and eight through-hole wiring 24 are formed in the first package substrate 2. Each of the second metal layers 19 formed at the eight locations is configured in a rectangular outer peripheral shape (a square outer peripheral shape in the present embodiment). In addition, the second metal layers 19 are arranged away from each other in the circumferential direction of the frame portion 11. In the present embodiment, a pair of the second metal layers 19 is disposed at each of four sides of the frame portion 11 having the rectangular shape.

Second Embodiment

As shown in FIGS. 15A to 15C, a wafer level package structure of the present embodiment is substantially the same as that of the first embodiment except that the sensor substrate 1 has an IC region E2 other than an acceleration sensor unit, and the IC region E2 comprises an integrated circuit (i.e., CMOS IC) using CMOS and operable in collaboration with the piezoresistive elements (Rx1 to Rx4, Ry1 to Ry4, Rz1 to Rz4) of gauge resistances (i.e., a sensing portion). The integrated circuit is formed by integrating a signal processing circuit configured to execute signal processing such as amplification, offset adjustment and temperature compensation to output signals of the bridge circuits (Bx, By, Bz) explained in the first embodiment, and an EEPROM for storing data used in the signal processing circuit. Therefore, in the following explanation, the same components as those in the first embodiment are denoted by the same reference numerals, and the duplicate explanation will be omitted.

Figure 16A:
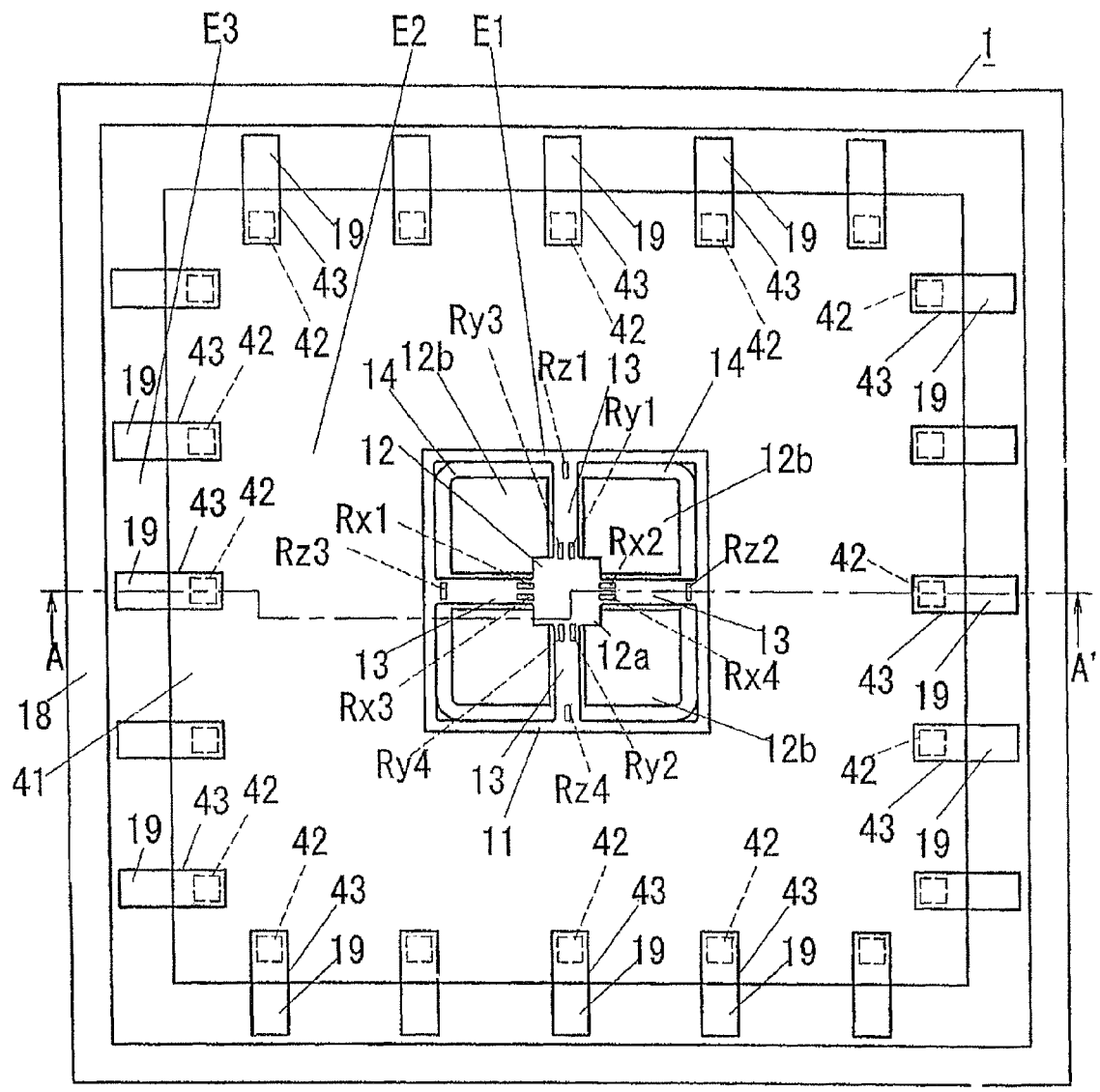
FIG. 16A is a top view of a sensor substrate.
Figure 16B:
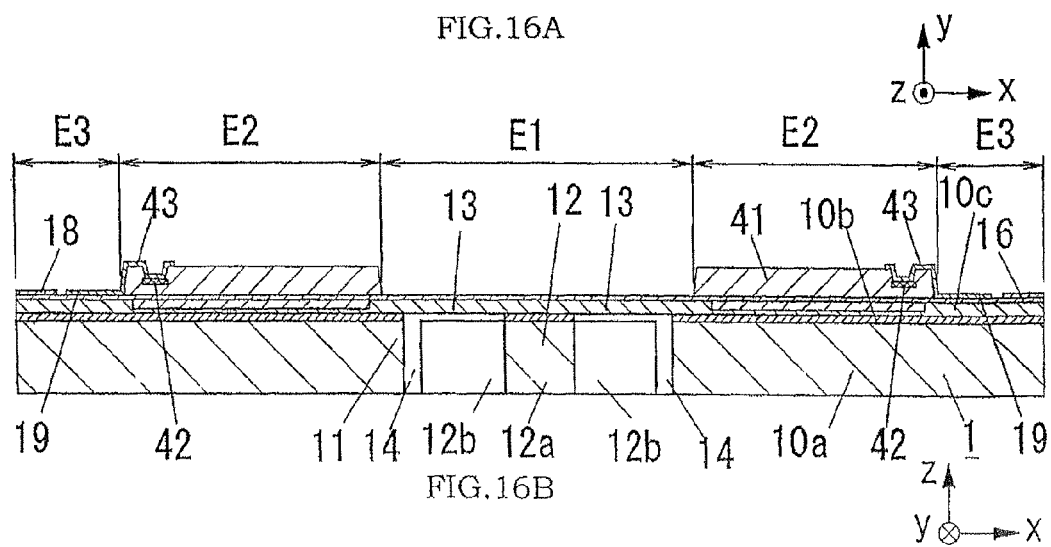
FIG. 16B is a cross-sectional view taken along the line A-A' in FIG. 15A.

As shown in FIGS. 16A and 16B, the sensor substrate 1 of the present embodiment is formed with a sensor region E1 comprising a part of the frame portion 11 explained in the first embodiment, the weight portion 12, the flexible portions 13, and the piezoresistive elements (Rx1 to Rx4, Ry1 to Ry4, Rz1 to Rz4), the IC region E2 having the integrated circuit described above, and a bonding region E3 having the first metal layer 18 explained in the first embodiment. In a plan view, a layout of those regions (E1, E2, E3) is designed such that the sensor region E1 is positioned at a substantially center portion of the sensor substrate 1, the IC region E2 is formed around the sensor region E1, and the bonding region E3 is formed around the IC region E2. The frame portion 11 of the sensor substrate 1 of the present embodiment has a larger outside dimension than that of the first embodiment. In other words, since the sensor substrate 1 has an increased width dimension of the frame portion 11, the integrated circuit can be mounted on the frame portion 11.

The semiconductor wafer 10 is formed by use of an SOI wafer, as in the case of the first embodiment. The IC region E2 is preferably formed by using a multilayer wiring technique to achieve a reduction in occupied area of the IC region E2 on the sensor substrate 1. For example, in the IC region E2 of the sensor substrate 1, an insulating film 16 is formed by a laminated film of a silicon oxide film on the silicon layer 10c and a silicon nitride film on the silicon oxide film. On the insulating film 16, a multilayer structure portion 41 comprising an interlayer insulation film and a passivation film is formed. By appropriately removing a part of the passivation film, a plurality of pads 42 can be exposed. Each of the pads 42 is electrically connected to the second metal layer 19 on the insulating film 16 of the bonding region E3 through an outgoing wiring 43 made of a metal material such as Au. In the present embodiment, the outgoing wiring 43 and the second metal layer 19 are made of the same material, and integrally formed in a continuous manner. A part of the plural pads 42 formed on the IC region E2 is electrically connected to the sensing portion through the signal processing portion, and the other pads are electrically connected to the sensing portion not through the signal processing portion. In either case, through-hole wirings 24 of the first package substrate 2 are electrically connected to the gauge resistances of the sensing portion.

In the present embodiment, a concave portion 21 of the first package substrate 2 is formed to be larger than that of the first embodiment such that the sensor region E1 and the IC region E2 are accommodated in the concave portion. The multilayer structure portion 41 of the IC region E2 is disposed in the concave portion 21.

Referring to FIGS. 17A to 17D, a production method of the sensor substrate 1 of the present embodiment is explained below. Each of FIGS. 17A to 17D corresponds to a cross section taken along the line A-A' in FIG. 16A.

First, diffusion layer wirings for the bridge circuits (Bx, By, Bz), the piezoresistive elements (Rx1 to Rx4, Ry1 to Ry4, Rz1 to Rz4), and circuit elements of the integrated circuit described above are formed at the general surface side (a surface side of the silicon layer 10c) of the SOI substrate 10 by using a CMOS process technique and so on. In a stage where a step of exposing the pads 42 of the IC region E2 has been finished, the multilayer structure portion 41 extends over the bonding region E3 as well as the sensor region E1. No metal wiring is formed on regions corresponding to the sensor region E1 and the bonding region E3 of the multilayer structure portion 41.

Figure 17A:
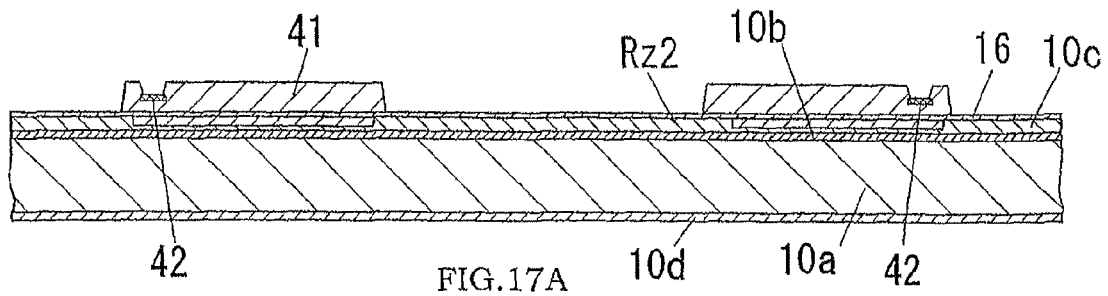
FIGS. 17A to 17D are schematic cross-sectional views showing a method of producing the sensor substrate of the second embodiment.

After finishing the step of exposing the pads 42, a patterned resist layer is formed such that the regions corresponding to the sensor region E1 and the bonding region E3 of the multilayer structure portion 41 are exposed. By using this resist layer as an etching mask, the exposed regions of the multilayer structure portion 41 are wet-etched and removed by using the silicon nitride film of the insulating film 16 on the silicon layer 10c as an etching stopper layer. Subsequently, by removing the resist layer, the structure shown in FIG. 17A is obtained.

Figure 17B:
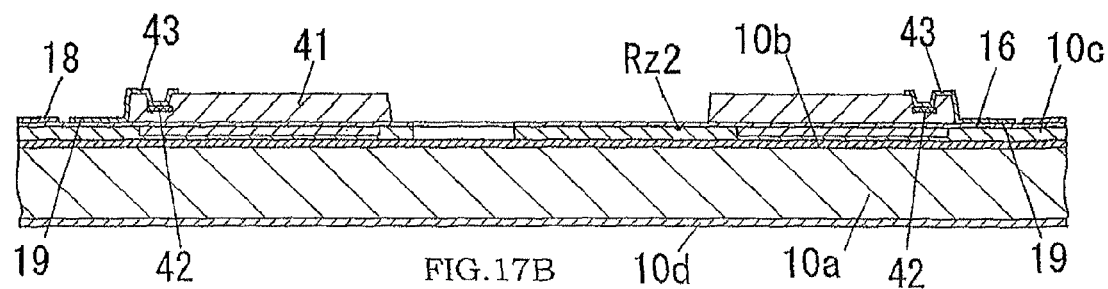

Next, the first metal layer 18, the second metal layers 19 and the outgoing wirings 43 are formed by using a thin-film forming method such as sputtering and conventional lithography and etching techniques. Then, a patterned resist layer is formed on the insulating film 16 at the general surface side of the SOI wafer such that regions corresponding to the frame portion 11, the core section 12a of the weight portion 12 and the flexible portions 13 are covered by the resist layer, and the other regions are exposed. By using this resist layer as an etching mask, a surface patterning process is performed. That is, the exposed regions of the insulating film 16 are etched and removed to perform patterning of the insulating film 16. This etching step is further continued by using the insulating layer 10b as an etching stopper layer so as to have an etching depth reaching the insulating layer 10b from the general surface side of the SOI wafer. Subsequently, by removing this resist layer, a structure shown in FIG. 17B is obtained. As a result of this surface patterning process, the silicon layer 10c of the SOI wafer remains at the regions corresponding to the frame portion 11, the core section 12a and the flexible portions 13. As the etching step of this surface patterning process, for example, it is preferred to perform dry etching by use of an inductively-coupled plasma (ICP) type dry etching apparatus. The etching condition is set such that the insulating layer 10b functions as the etching stopper layer.

Figure 17C:
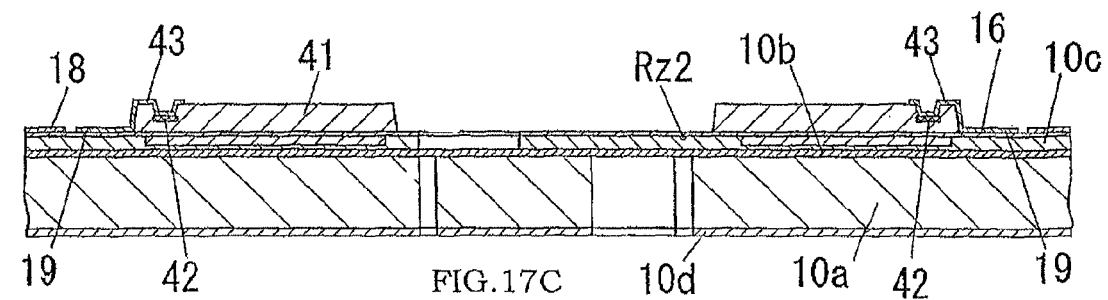

After the surface patterning process described above, a patterned resist layer is formed on a silicon oxide film 10d at the rear surface side of the support substrate 10a of the SOI wafer such that regions corresponding to the frame portion 11, the core section 12a and the leaf sections 12b are covered by the resist layer and the other regions are exposed. By using this resist layer as the etching mask, a rear-surface patterning process is performed. That is, the exposed regions of the silicon oxide film 10d are etched and removed to perform patterning of the silicon oxide film 10d. After the resist layer is removed, dry etching is further performed in a substantially vertical direction by using the silicon oxide film 10d as the etching stopper layer so as to have an etching depth reaching the insulating layer 10b from the rear surface side of the SOI wafer. Thus, a structure shown in FIG. 17C is obtained. As a result of this surface patterning process, the support substrate 10a of the SOI wafer remains at the regions corresponding to the frame portion 11, the core section 12a and the leaf sections 12b. As an etching apparatus for this rear-surface patterning process, for example, it is preferred to use an inductively-coupled plasma (ICP) type dry etching apparatus. The etching condition is set such that the insulating layer 10b functions as the etching stopper layer.

Figure 17D:
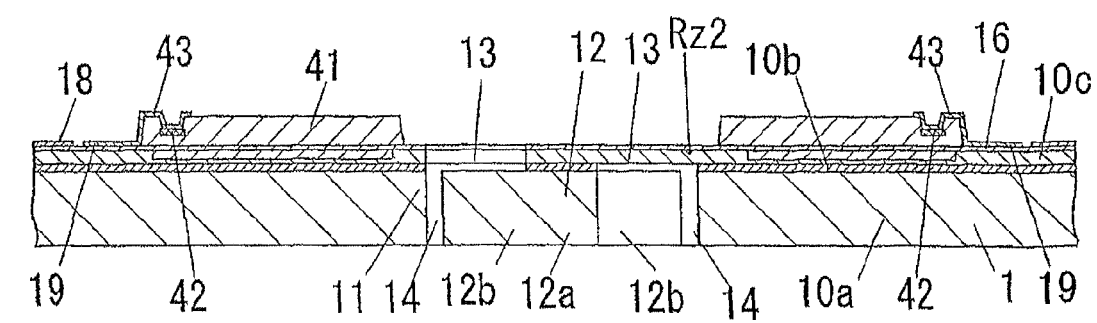

After the rear-surface patterning process, a separation process is performed to form the frame portion 11, the flexible portions 13 and the weight portion 12 by etching and removing undesired portions by means of wet etching, while leaving the regions corresponding to the frame portion 11 and the core section 12a of the insulating film 10b. As a result, a structure shown in FIG. 17D is obtained. In this separation process, the silicon oxide film 10d on the rear surface of the SOI wafer is also etched and removed.

Figure 19A:
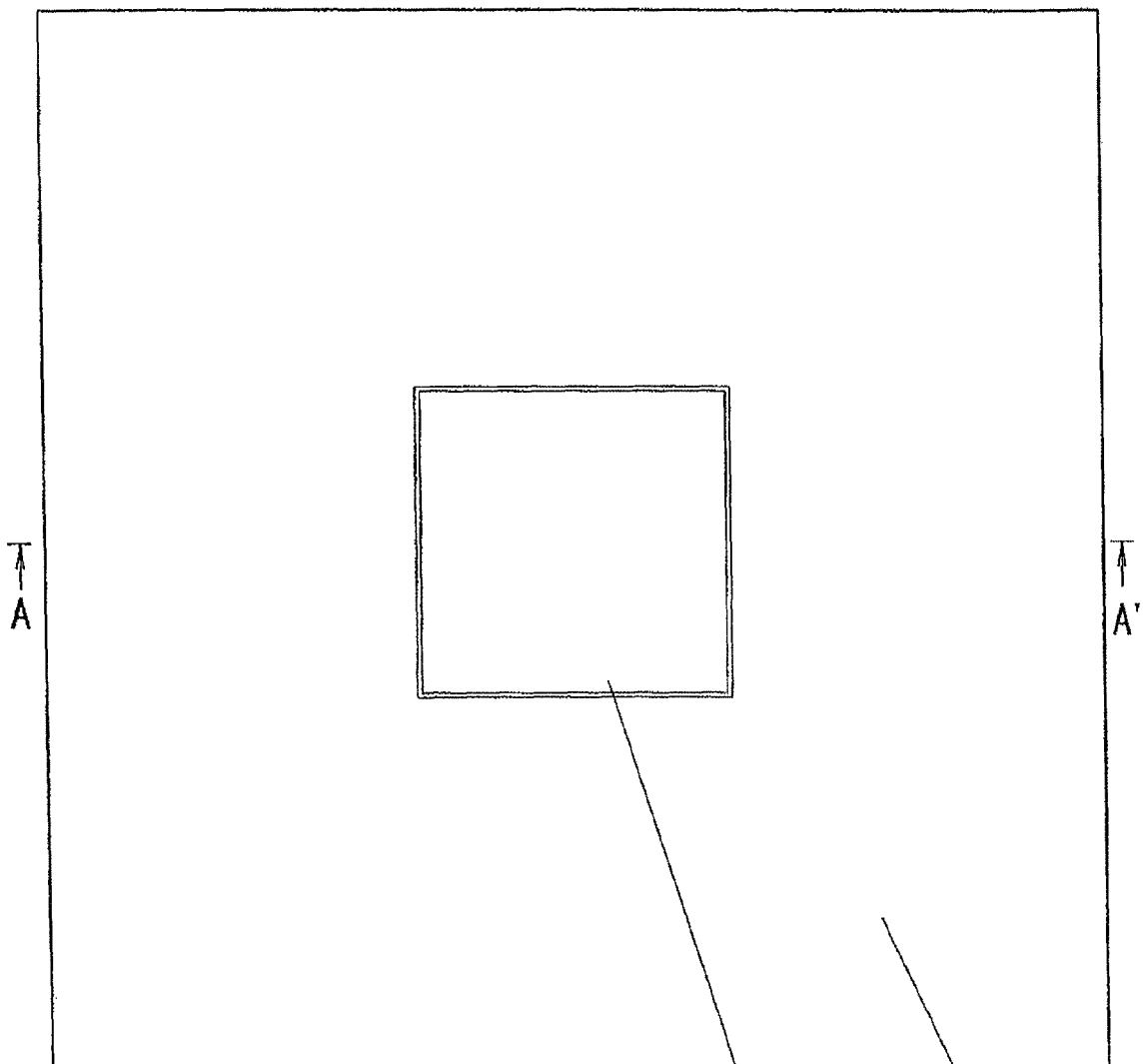
FIGS. 19A and 19B are respectively top and cross-sectional views of a second package substrate.
Figure 19B:
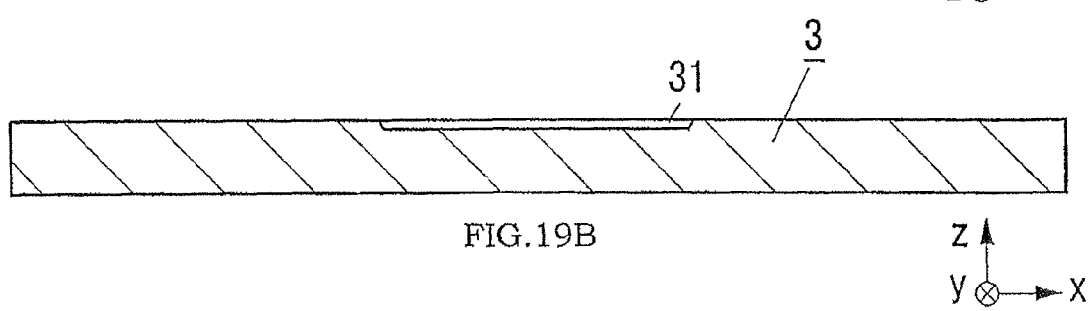

The wafer level package structure 100 of the present embodiment is obtained by bonding each of the first package substrate 2 shown in FIGS. 18A and 18B and the second package substrate 3 shown in FIGS. 19A and 19B to the sensor substrate 1 at room temperature in a wafer level. That is, by room-temperature bonding between the activated surfaces (Au—Au surfaces) of the first metal layer 18 of the sensor substrate 1 and the metal layer 28 of the first package substrate 2 and room-temperature bonding between the activated surfaces (Au—Au solid-phase bonding) of the second metal layers 19 and the wiring layers 29 of the first package substrate 2, the sensor substrate 1 is integrated with the first package substrate 2. On the other hand, by room-temperature bonding between the activated surfaces (Si—Si solid-phase bonding) of the frame portion 11 of the sensor substrate 1 and the second package substrate 3, the sensor substrate 1 is integrated with the second package substrate 3.

The acceleration sensor device of the present embodiment can be obtained by a dicing process of cutting the thus obtained wafer level package structure 100 into a predetermined size (a desired chip size). The acceleration sensor device of FIG. 15C corresponds to a cross section of a region surrounded by the dotted circle "A" of the wafer level package structure 100 shown in FIG. 15A. Therefore, the first and second package substrates (2, 3) have the same outside dimension as the sensor substrate 1. As a result, a compact chip size package can be realized, and the manufacturing process becomes easy.

In addition, since the IC chip including the integrated circuit operable in collaboration with the gauge resistances is built in the acceleration sensor device of the present embodiment, it is possible to achieve downsizing and cost reduction, as compared with conventional sensor modules. Furthermore, an improvement in sensor characteristics can be achieved by shortening wiring lengths between the gauge resistances and the integrated circuit.

Figure 20:
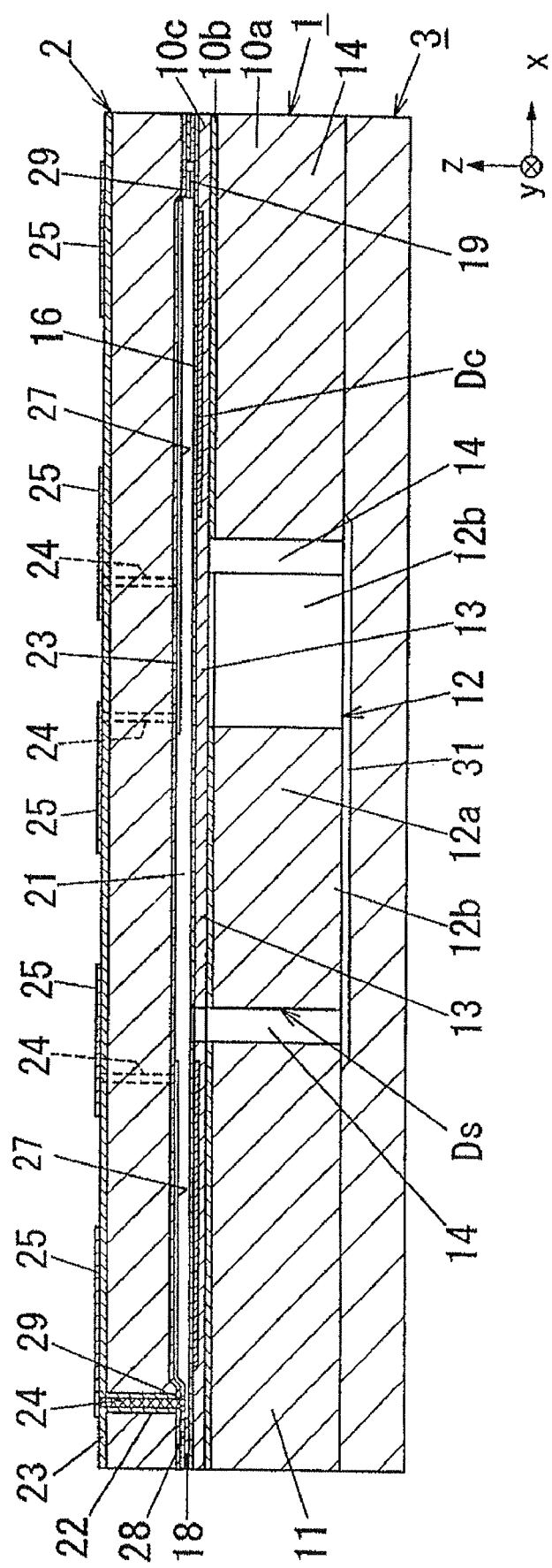
FIG. 20 is a schematic cross-sectional view of a wafer level package structure according to another modification of the present embodiment.
Figure 21:
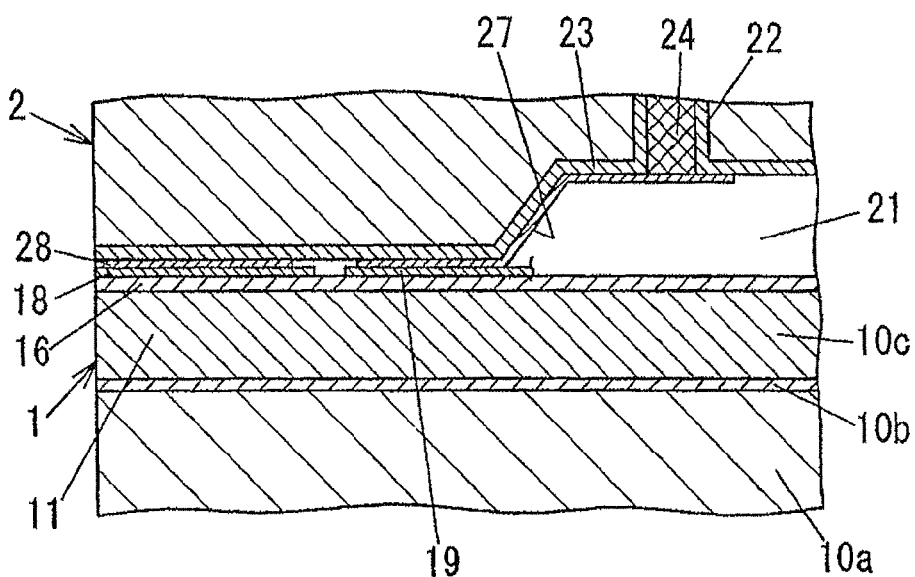
FIG. 21 is an enlarged cross-sectional view showing an intermediate wiring electrically connected between a through-hole wiring and a bonding metal layer.

By the way, when a large number of the second metal layers 19 are arranged around the sensing portion (the weight portion 12 and the flexible portions 13) of the acceleration sensor unit, there is a case that it becomes difficult in design to densely form the through-hole wirings 24 at positions corresponding to the second metal layers 19 of the first package substrate 2. In such a case, as shown in FIG. 20, some of the through-hole wirings 24 are preferably formed in an inner bottom surface of the concave portion 21 formed on the first package substrate 2 so as to enable the positional displacement of the sensing portion Ds. In this case, since the second metal layer 19 is located away from the through-hole wiring 24, an intermediate wiring layer 27 is formed to obtain an electrical connection therebetween. As shown in FIG. 21, the intermediate wiring layer 27 is connected at its one end to the through-hole wiring 24, and formed along an inner surface of the concave portion 21 such that the other end of the intermediate wiring layer 27 reaches a position facing the second metal layer 19. In the present embodiment, the intermediate wiring layer 27 is formed by an Au film, as in the case of the metal layer 28 and the wiring layer 29. A Ti film is formed to improve the adhesion between the Au film and the insulating film 23. In this regard, the Ti film preferably has a thickness of 15 to 50 nm, and the Au film preferably has a thickness of 500 nm or less. These thickness values are illustrative only, and therefore the present invention is not limited to them.

On the upper surface of the first package substrate 2 shown in FIG. 20, i.e., the opposite surface of the surface facing the sensor substrate 1, pad electrodes 25 are formed, and connected to end portions of the through-hole wirings 24. The layout and the number of the pad electrodes 25 are determined depending on the kind of the sensor unit to be formed. Therefore, even when a through-hole wiring 24 cannot be formed at the position facing the second metal layer 19 due to an increase in the number of the pad electrodes 25, the through-hole wiring 24 can be formed at the other position of the first package substrate 2 by use of the intermediate wiring layer 27. That is, by forming the intermediate wiring layer 27, it is possible to improve a degree of layout freedom of the through-hole wirings 24 or the pad electrodes 25.

Figure 22:
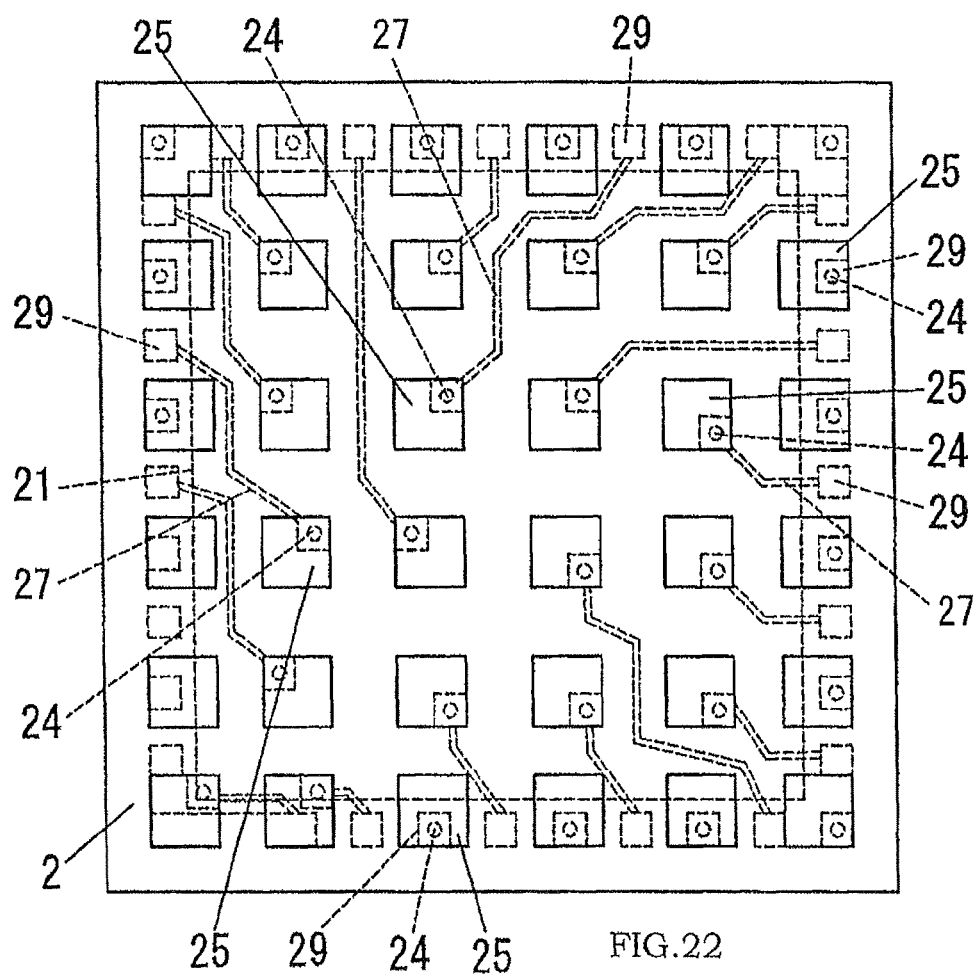
FIG. 22 is a plan view showing an example of an intermediate wiring pattern and the through-hole wiring formed in the first package substrate.

As an example, the first package substrate 2 having a preferred layout of the pad electrodes 25 and the intermediate wiring layers 27 is shown in FIG. 22. In this example, a plurality of pad electrodes 25 each having a square shape are arranged on each of lattice points of a 6×6 square lattice. In addition, the second metal layer 19 is formed at 11 locations with respect to each of the four sides of the sensor substrate 1, and the wiring layer 29 is formed at a position facing each of the second metal layers 19. For example, with respect to each of the second metal layers 19 formed at 5 locations along the right side of the square lattice, the wiring layer 29 facing the second metal layer 19 is electrically connected to the through-hole wiring 24 formed in the inner bottom surface of the concave portion 21 of the first package substrate 2 through the intermediate wiring layer 27. Thus, since the layout of the pad electrodes 25 and the through-hole wirings 24 is not restricted by the layout of the wiring layers 29 facing the second metal layers 19, the entire surface of the first package substrate 2 can be efficiently utilized. In addition, even when the wiring layers 29 facing the second metal layers 19 are arranged on the first package substrate 2 at a relatively narrow pitch or interval suitable for flip-chip mounting, the pad electrodes 25 can be arranged on the opposite surface of the first package substrate 2 at a relatively wide pitch or interval suitable for reflow soldering.

Figure 23:
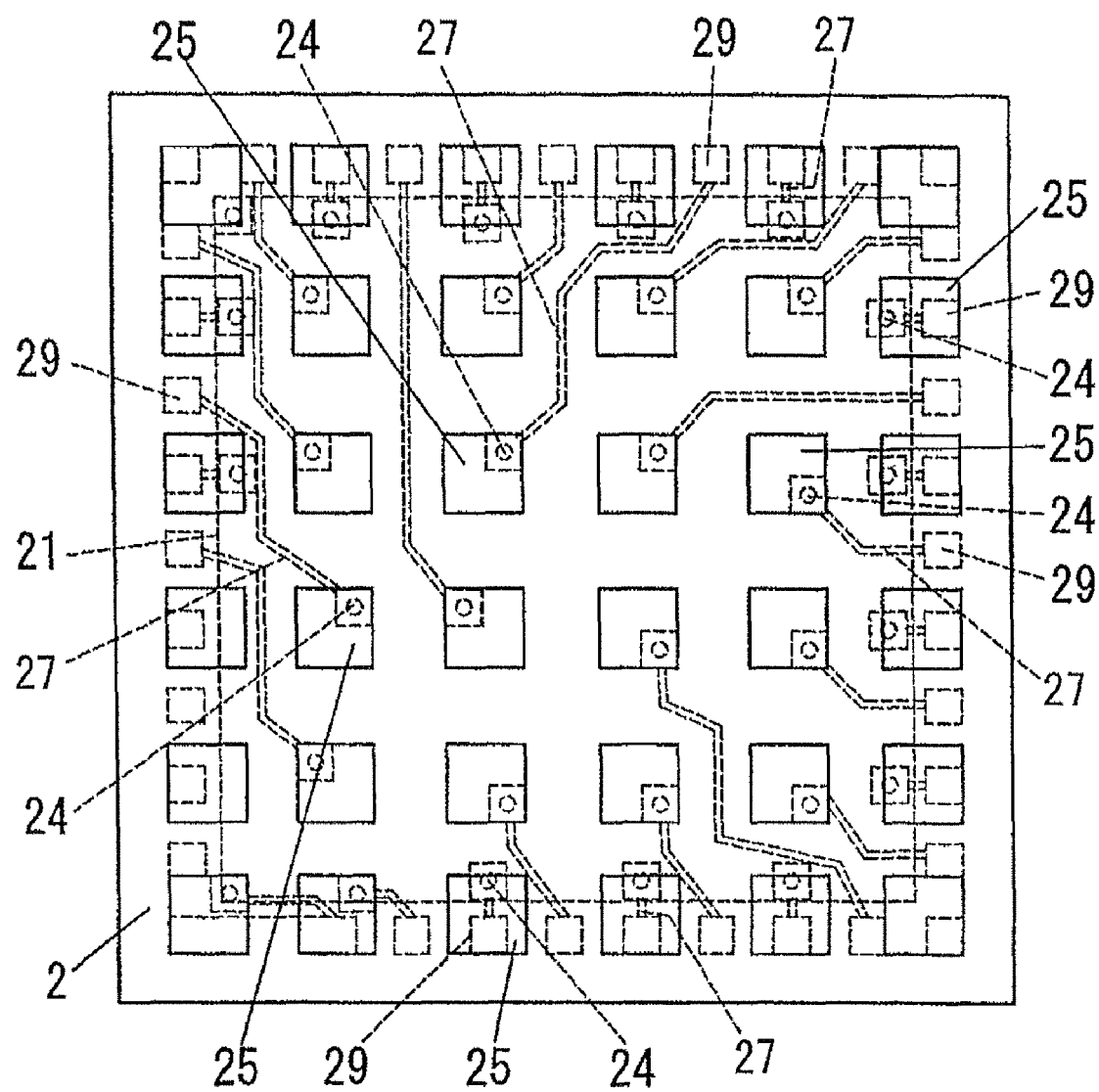
FIG. 23 is a plan view showing another example of the intermediate wiring pattern and the through-hole wiring formed in the first package substrate.

In addition, the first package substrate 2 having another preferred layout of the pad electrodes 25 and the intermediate wiring layers 27 is shown in FIG. 23. In the case of FIG. 22, since some of the through-hole wirings 24 are formed in the inner bottom surface of the concave portion 21 of the first package substrate 2, the entire length of the through-hole wiring 24 becomes shorter than that of a the through-hole wiring 24 formed at the position facing the second metal layer 19. The formation of the through-hole wirings 24 with different entire lengths may lead to variations in quality of the through-hole wirings 24. Therefore, as shown in FIG. 23, the through-hole wiring 24 may not be formed at the position facing the second metal layer 19. That is, all of the through-hole wirings 24 are formed in the inner bottom surface of the concave portion 21 of the first package substrate 2, so that all of the wiring layers 29 facing the second metal layers 19 are electrically connected to the through-hole wirings 24 through the intermediate wiring layers 27. In this case, all of the through-hole wirings 24 formed in the first package substrate 2 have the same entire length. As a result, it becomes possible to avoid the occurrence of variations in quality of the through-hole wirings 24.

In FIG. 20, a circuit portion Dc of the acceleration sensor unit (e.g., a power supply circuit for applying a voltage to an input terminal of each of the bridge circuits, and an amplification circuit for amplifying an output voltage of the bridge circuit) is formed in the n-type silicon layer (active layer) 10c of the frame portion 11 of the sensor substrate 1. When the circuit portion Dc is also formed in the active layer 10c of the weight portion 12, a diffusion-layer wiring or a metal wiring is formed on the flexible portion 13 to make an electrical connection between the circuit portions Dc formed on the frame portion 11 and the weight portion 12. That is, an internal wiring for the circuit portion Dc is formed on the flexible portion 13. On the other hand, when the circuit portion Dc is not formed in the weight portion 12, the insulating layer 10b and the active layer 10c on the leaf sections 12b of the weight portion 12 may be removed. Since the flexible portion 13 not having the support substrate 10a is formed to be deformable, the circuit portion Dc is not formed on the flexible portion 13.

Third Embodiment

In each of the above embodiments, the piezoresistance-type acceleration sensor was used as the sensor unit. The technical concept of the present invention is also available to the other sensor unit such as a capacitance type acceleration sensor or a gyro sensor. The present embodiment is characterized by forming a gyro sensor unit on a sensor substrate in place of the acceleration sensor unit. The other configurations of the present embodiment are substantially the same as those of the first embodiment. Therefore, a bonding portion between the sensor substrate 101 and each of the first and second package substrates (102, 103) can be formed according to the same manner as the first embodiment.

A wafer level package structure of the present embodiment has a structure comprising a semiconductor wafer with a plurality of gyro sensor units, a first package wafer bonded to one of opposite surfaces of the semiconductor wafer, and a second package wafer bonded to the other surface of the semiconductor wafer. In the following explanation, a region for forming each of the gyro sensor units of the semiconductor wafer is defined as the sensor substrate 101. In addition, a region facing each of the sensor substrates 101 of the first package wafer is defined as the first package substrate 102. Similarly, a region facing each of the sensor substrates 101 of the second package wafer is defined as the second package substrate 103.

In the present embodiment, the sensor substrate 101 is formed by use of a silicon substrate having a resistivity of 0.2 Ω·cm. Each of the first and second package substrates (102, 103) is formed by use of a silicon substrate having a resistivity of 20 Ω·cm. These resistivity values are illustrative only, and therefore the present invention is not limited to them.

Figure 24:
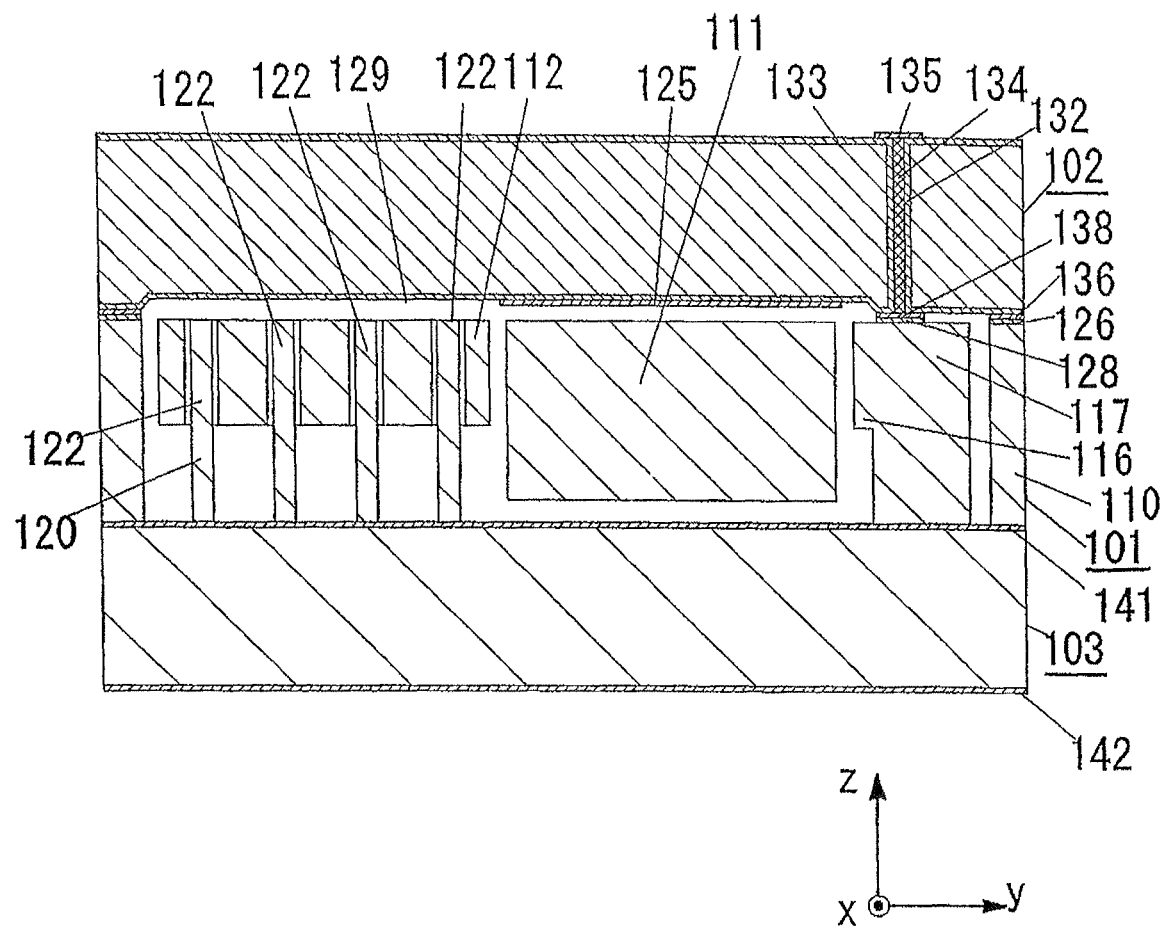
FIG. 24 is a schematic cross-sectional view of a gyro sensor device according to a third embodiment.

As shown in FIG. 24, the gyro sensor unit is mainly formed with a movable portion comprising a first mass body 111, which can be vibrated by vibrating means, and a second mass body 112 coupled to the first mass body 111, and a detecting portion configured to convert a positional displacement of the second mass body 112, which is caused when a rotational force is applied during the vibration of the first mass body 111, into an electrical signal.

That is, the first mass body 111 and the second mass body 112, each of which has substantially a rectangular outer peripheral shape in plan view, are arranged in parallel along a surface of the sensor substrate 101. In addition, the sensor substrate 101 has a frame portion 110 (e.g., a rectangular frame portion in the present embodiment) extending around the first and second mass bodies (111, 112). In the present embodiment, an orthogonal coordinate system is defined, as shown at a lower right portion in each of FIGS. 24 to 28. That is, a direction of arranging the first and second mass bodies (111, 112) corresponds to the "y" axis direction, and a direction orthogonal to the "y" axis direction in a plane extending along the surface of the sensor substrate 101 corresponds to the "x" axis direction. In addition, a direction orthogonal to the "x" axis direction and the "y" axis direction (i.e., a thickness direction of the sensor substrate 101) corresponds to the "z" axis direction.

Figure 25:
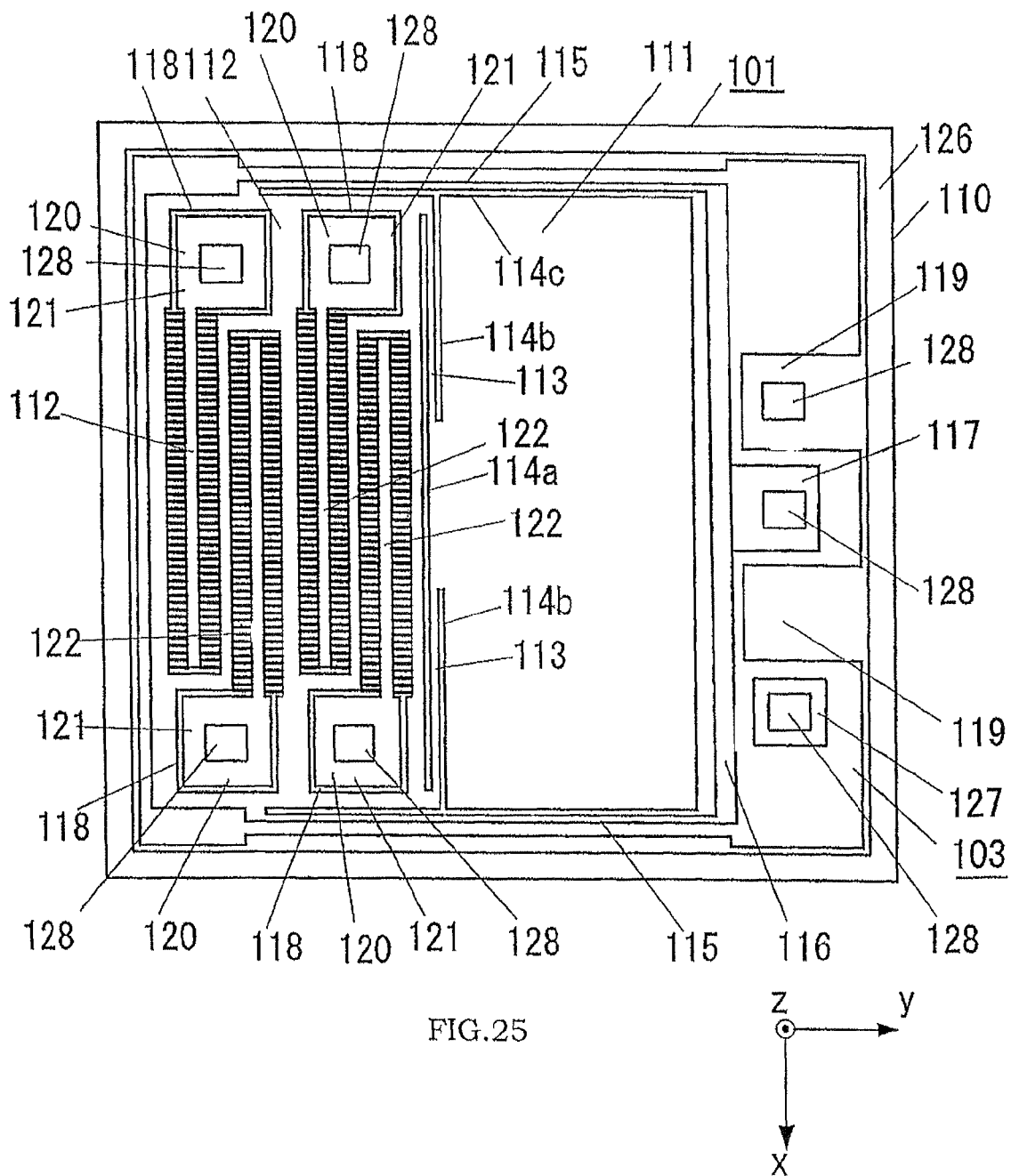
FIG. 25 is schematic plan view of a sensor substrate according to the third embodiment.

As shown in FIG. 25, the first mass body 111 and the second mass body 112 of the sensor substrate 101 are integrally coupled to each other through a pair of drive springs 113 extending in the "x" axis direction. That is, the sensor substrate 101 has a slit groove 114a having a length slightly shorter than the entire length of the second mass body 112 in the "x" axis direction, and two slit grooves 114b arranged in a straight line along the "x" axis direction and at the lateral side of the first mass body 111. Each of the slit grooves 114b has an opening at its one end. Each of the drive springs 113 is formed between the slit groove 114a and each of the slit grooves 114b. An end portion of each of the drive springs 113 continuously extends between an end portion of the slit groove 114a and a lateral edge of the second mass body 112, and the other end portion of the drive spring 113 continuously extends to the first mass body 111 through a region between the slit grooves 114b. The drive spring 113 is a torsion spring having a torsional deformation capability, and enable a positional displacement of the first mass body 111 relative to the second mass body 112 about the drive spring 113. That is, the drive springs 113 enables a translational movement in the "z" axis direction of the first mass body 111 relative to the second mass body 112 as well as a rotational movement about the "x" axis of the first mass body 111 relative to the second mass body 112. In addition, since the sensor substrate 101 uses the torsion spring as the drive spring 113, it is not necessary to reduce a dimension of the drive spring 113 in the thickness direction of the sensor substrate 101. Therefore, the drive springs 113 can be easily manufactured.

The numeral 115 designates a detection spring extending in the "y" axis direction, and continuously connected at its one end to an edge portion in the "x" axis direction of the second mass body 112 of the sensor substrate 101. The opposite end portion of one of the detection springs 115 is continuously connected to that of the other detection spring 115 through a coupling member 116 extending in the "x" axis direction. That is, a substantially "C" shaped member is formed in plan view by the pair of the detection springs 115 and the coupling member 116. In this regard, the coupling member 116 is designed to have a sufficiently higher rigidity than the drive springs 113 and the detection springs 115. The numeral 117 designates a fixation portion projecting from an intermediate portion in the longitudinal direction of the coupling member 116. The fixation portion 117 is fixed to a predetermined position of the second package substrate 103. The first and second mass bodies (111, 112) are separated from the detection springs 115 and the coupling member 116 by a slit groove 114c formed in a substantially "C" shape. The one end of the slit groove 114b is communicated with the slit groove 114c. Each of the detection springs 115 has a bending deformability in the "x" axis direction. Therefore, the detection springs 115 enable a positional displacement of the first and second mass bodies (111, 112) relative to the fixation portion 117 in the "x" axis direction.

By the way, the sensor substrate 101 has four apertures 118 penetrating the second mass body 112 in the thickness direction, and a stationary part 120 disposed in each of the apertures 118. The stationary part 120 has an electrode portion 121 disposed in the vicinity of each end in the "x" axis direction of the second mass body 112, and a comb bone portion 122 extending from the electrode portion 121 in the "x" axis direction. The electrode portion 121 and the comb bone portion 122 are configured in a substantially "L" shape. The electrode portion 121 and the comb bone portion 122 are bonded to the second package substrate 103. That is, the stationary part 120 is fixed at a predetermined position. An inner surface of the aperture 118 extends along an outer peripheral surface of the stationary part 120 through a clearance. A pair of the electrode portions 121 is disposed at both ends in the "x" axis direction of the second mass body 112. As shown in FIG. 26, a plurality of stationary comb teeth 123 arranged along the "x" axis direction are formed at both sides in the width direction of the comb bone portion 122. On the other hand, a plurality of movable comb teeth 124 are formed in the aperture 118 at a side facing the comb bone portion 122 of the second mass body 112, and arranged along the "x" axis direction such that each of the movable comb teeth 124 is in a face-to-face relation with each of the stationary comb teeth 123, as shown in FIG. 26. Each of the movable comb teeth 124 is located away from a corresponding stationary comb tooth 123 by a distance. When the second mass body 112 is displaced in the "x" axis direction, a change in distance between the stationary comb teeth 123 and the movable comb teeth 124 occurs, so that a change in electric capacitance caused by the change in distance is detected. That is, a detection means for detecting the positional displacement of the second mass body 112 is composed of the stationary comb teeth 123 and the movable comb teeth 124.

The sensor substrate 101 is coupled to the second package substrate 103 by bonding the frame portion 110, the fixation portion 117, and the stationary parts 120 to the second package substrate 103. In other words, the second package substrate 103 is used as a support substrate for supporting the sensor substrate 101. On the other hand, since the first and second mass bodies (111, 112) are formed to be displaceable in the "z" axis direction, the bottom surfaces facing the second package substrate 103 of the first and second mass bodies (111, 112) are backed away from the second package substrate 103, as shown in FIG. 24. That is, the thickness of each of the first and second mass bodies (111, 112) in the thickness direction of the sensor substrate 101 is determined to be smaller than the thickness of the frame portion 110. Thus, a clearance is ensured between the second package substrate 103 and each of the first and second mass bodies (111, 112). In the present embodiment, a gap length between the first mass body 111 and the second package substrate 103 is set to 10 µm. This value is illustrative only, and therefore the present invention is not limited to it.

In addition, the sensor substrate 101 has a pair of ground portions 119 formed on the frame portion 110 at the vicinity of the fixation portion 117 such that the fixation portion 117 is located between the ground portions 119. The numeral 127 designates an electrode portion electrically connected to an electrode 125 described later, and formed near one of the ground portions 119. The ground portions 119 and the electrode portion 127 are bonded to the second package substrate 103. At the upper-surface side, a second metal layer 128 is formed on the fixation portion 117, the electrode portions 121, one of the ground portions 119 and the electrode portion 127. In this regard, one fixation portion 117, four electrode portions 121, one ground portion 119 and one electrode portion 127 are separately arranged from each other at the upper-surface side of the second package substrate 103. In a state where the first package substrate 102 is not bonded to the frame portion 110, they are electrically insulated from each other. In addition, at the upper-surface side of the sensor substrate 101, the frame portion 110 has a first metal layer 126 formed over the entire circumference thereof. Each of the first and second metal layers (126, 128) is formed by a laminated film of a Ti film and an Au film. In brief, since the first and second metal layers (126, 128) are made of the same metal material, it is possible to simultaneously obtain these metal layers with the same thickness. In each of the first and second metal layers (126, 128), the Ti film preferably has a thickness of 15 to 50 nm, and the Au film preferably has a thickness of 500 nm. These thickness values are illustrative only, and therefore the present invention is not limited to them. As a material for forming the Au film, an Au material containing an impurity may be used in place of pure gold.

Figure 27:
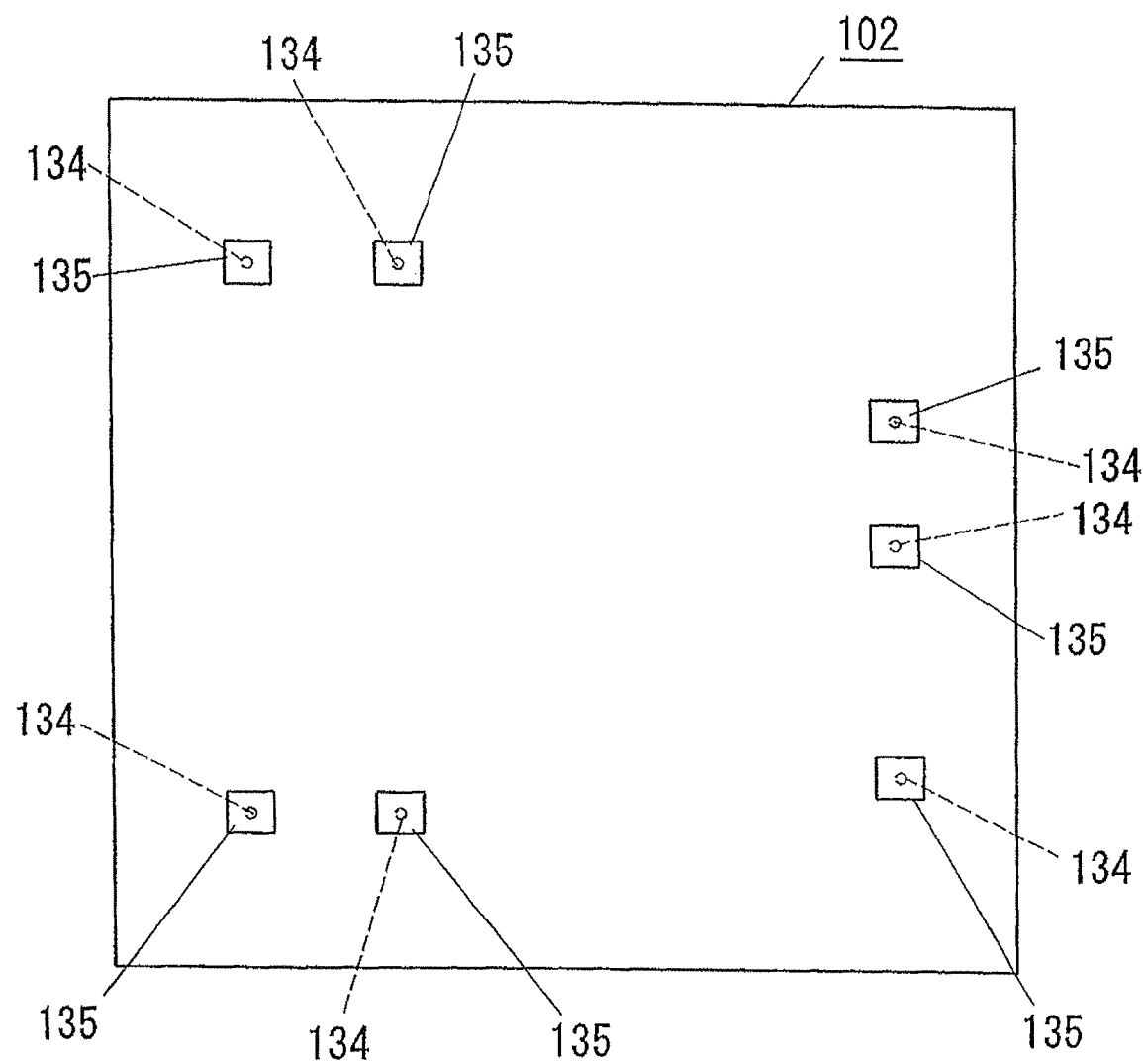
FIG. 27 is a schematic plan view of a first package substrate according to the third embodiment.
Figure 28:
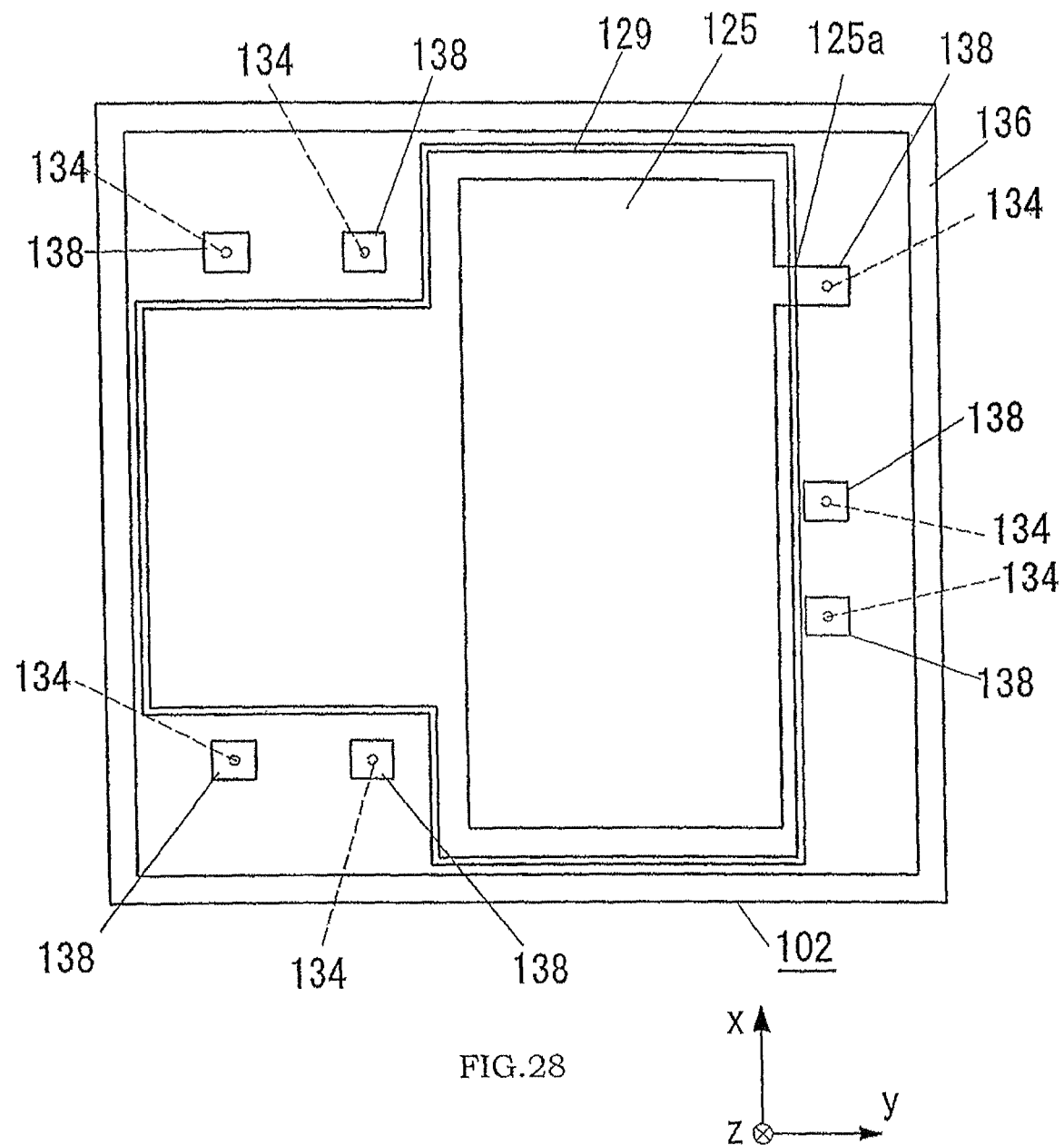
FIG. 28 is a schematic bottom view of the first package substrate.
Figure 29A:
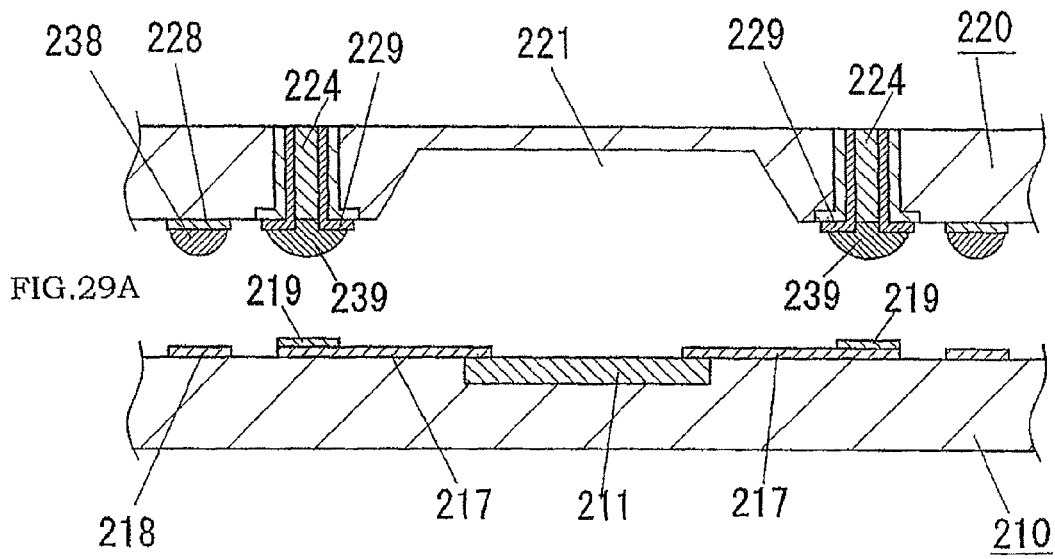
FIGS. 29A and 29B are explanatory views of a method of producing a conventional wafer level package structure.
Figure 29B:
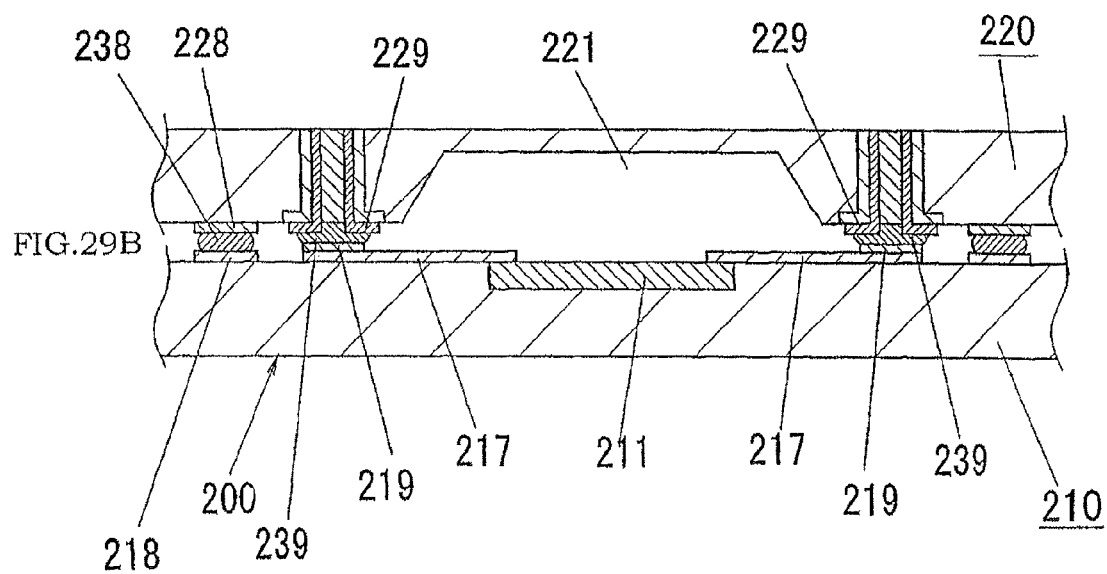

As shown in FIGS. 27 and 28, the first package substrate 102 has a concave portion 129 configured to provide a space for positional displacements of the first and second mass bodies (111, 112) at the side facing the sensor substrate 101, i.e., in the bottom surface of the first package substrate 102 shown in FIG. 24. In addition, the first package substrate 102 has a plurality of through holes 132 penetrating in the thickness direction. A heat insulating film 133 (a silicon oxide film) is formed on both opposite surfaces in the thickness direction of the first package substrate 102 and inner surfaces of the through holes 132. Therefore, the heat insulating film 133 lies between a through-hole wiring 134 and the inner surface of the through hole 132. In the present embodiment, copper is used as a material for the through-hole wiring 134. Alternatively, nickel or the like may be used in place of copper.

The first package substrate 102 has the above-described electrode 125 (FIGS. 24 and 28) formed at a region facing the first mass body 111 on the bottom surface of the concave portion 129 through the insulating film 133. The electrode 125 is formed by a laminated film of a Ti film and an Au film. In the present embodiment, a gap length between the first mass body 111 and the electrode 125 is set to 10 µm. This value is illustrative only, and therefore the present invention is not limited to it.

In addition, the first package substrate 102 has a plurality of metal layers 138 formed on the surface facing the sensor substrate 101, and electrically connected to the through-hole wirings 134. In addition, the first package substrate 102 has a (rectangular) frame-like metal layer 136 formed over the entire circumference thereof on the surface facing the sensor substrate 101. In this regard, the metal layers 138 are bonded to the second metal layers 128 of the sensor substrate 101 to make electrical connections therebetween. The metal layer 136 is bonded to the first metal layer 126 of the sensor substrate 101. Each of the metal layer 136 and the metal layers 138 is formed by a laminated film of a Ti film and an Au film on the Ti film. In brief, since the metal layer 136 and the metal layers 138 are made of the same metal material, it is possible to simultaneously obtain these metal layers with the same thickness. In each of the metal layer 136 and the metal layers 138, the Ti film preferably has a thickness of 15 to 50 nm, and the Au film preferably has a thickness of 500 nm. These thickness values are illustrative only, and therefore the present invention is not limited to them. As a material for forming the Au film, an Au material containing an impurity may be used in place of pure gold. In addition, in the present embodiment, the Ti film is formed as an adhesive layer for improving the adhesion between the Au film and the insulating film 133. In place of the Ti, Cr, Nb, Zr, TiN, TaN or the like may be used as the material for the adhesive layer.

The first package substrate 102 has a plurality of electrodes 135 for external connection formed on an opposite surface of the surface facing the sensor substrate 101. These electrodes 135 are electrically connected to the through-hole wirings 134. Each of the electrodes 135 is configured in a rectangular outer peripheral shape, and formed by a laminated film of a Ti film and an Au film.

On the other hand, the second package substrate 103 has heat insulating films (141, 142) such as a silicon oxide film formed on both opposite surfaces in the thickness direction thereof.

As described in the first embodiment, the sensor substrate 101 is bonded to the first package substrate 102 by solid-phase direct bonding between the first metal layer 126 and the metal layer 136. That is, the first package substrate 102 is sealingly bonded to the entire circumference of the frame portion 110 of the sensor substrate 101. In addition, the second metal layer 128 is electrically connected to the metal layer 138 by solid-phase direct bonding. An interior of the gyro sensor unit is airtightly sealed from the outside by these solid-phase direct bondings. In addition, the second metal layer 128 of the sensor substrate 101 is electrically connected to the electrode 135 through the metal layer 138 and the through-hole wiring 134. The second package substrate 102 has a wiring portion 125a (FIG. 28) extending from the electrode 125 to a peripheral portion of the concave portion 129, which is continuously formed with the metal layer 138 bonded to the second metal layer 128 on the electrode portion 127 of the sensor substrate 101.

To form the bonding portion between the sensor substrate 101 and each of the first and second package substrates (102, 103), a room-temperature bonding method for forming the direct bonding at low temperature is used to reduce residual stress in the sensor substrate 101. In the room-temperature bonding method, the surfaces to be bonded are cleaned up and activated by irradiating an ion beam, an atomic beam or plasma of argon in vacuum, and then the activated surfaces are directly bonded to each other at room temperature in vacuum. In the present embodiment, according to the room-temperature bonding method described above, the direct bonding between the first metal layer 126 and the metal layer 136 and the direct bonding between the second metal layer 128 and the metal layer 138 are simultaneously obtained by applying an appropriate load to the bonding interface at room temperature in vacuum. In addition, the frame portion 110 of the sensor substrate 101 is directly bonded in an airtight manner to the peripheral portion of the second package substrate 103 at room temperature in vacuum by the room-temperature bonding method.

The room-temperature boding method of the present embodiment is explained below. Duplicate explanations about the same steps as the first embodiment are omitted.

After micromachining is appropriately performed to the sensor substrate 101, and the sensor substrate 102 is bonded to the second package substrate 103 at room temperature, an etching step for separating a portion used as the movable portion of the sensor substrate 101 from the other portion and a metal layer formation step for forming the first and second metal layers (126, 128) are performed. In the present embodiment, the sensor substrate 101 is bonded to the second package substrate 103 by the room-temperature bonding between Si and $SiO_2$. Subsequently, the sensor substrate 101 integrated with the second package substrate 103 and the first package substrate 102 are placed in the chamber, and the chamber is vacuum exhausted to a predetermined degree of vacuum (e.g., $1 \times 10^{-5}$ Pa). Then, a surface activation treatment is performed. That is, the surfaces to be bonded to each other of the sensor substrate 101 and the first package substrate 102 are cleaned up and activated by means of sputter etching in vacuum. The degree of vacuum in the chamber during the surface activation treatment is approximately $1 \times 10^{-2}$ Pa, which is a lower degree of vacuum, as compared with the predetermined degree of vacuum in the chamber before the surface activation treatment.

After the surface activation treatment, an atmosphere adjusting step is performed to adjust the interior atmosphere of the chamber, in which the sensor substrate 101 and the second package substrate 103 are placed, to a designed atmosphere determined according to gyro sensor characteristics. In this regard, the gyro sensor of the present embodiment is designed in a predetermined degree of vacuum (a high vacuum of $1 \times 10^{-4}$ Pa or less), in order to increase a mechanical Q value (mechanical quality coefficient Qm) indicative of a mechanical vibration level in the vicinity of the resonance frequency, and achieve an improvement in sensitivity. In the atmosphere adjustment step of the present embodiment, after the surface activation treatment is finished, the interior atmosphere of the chamber is adjusted to the designed atmosphere by performing vacuum pumping until the degree of vacuum in the chamber reaches a predetermined degree of vacuum.

After the atmosphere adjusting step is finished, the sensor substrate 101 is bonded to the first package substrate 102 at room temperature under the atmosphere controlled in the atmosphere adjusting step. At the step of bonding between the sensor substrate 101 and the first package substrate 102, the room-temperature bonding between the first metal layer 126 and the metal layer 136, and the room-temperature bonding between the second metal layer 128 and the metal layer 138 are simultaneously obtained by applying an appropriate load (e.g., 300 N). In the present embodiment, the bonding between the sensor substrate 101 and the first package substrate 102 is provided by the room-temperature bonding between Au and Au.

It is preferred that the surface activation treatment, the atmosphere adjusting step and the bonding step are sequentially performed in the same chamber. The surfaces to be bonded to each other of the sensor substrate 101 and the first package substrate 102 are cleaned up and activated by the surface activation treatment. Then, those activated surfaces are bonded to each other, without exposure to the outside air, at room temperature in an airtight manner under a designed atmosphere determined according to desired sensor characteristics. Thereby, good bonding strength can be obtained therebetween. In the atmosphere adjusting step, since the chamber is vacuum exhausted to a predetermined degree of vacuum after the surface activation treatment to adjust the interior atmosphere to the designed atmosphere, it is possible to obtain a high mechanical Q value (mechanical quality coefficient Qm) indicative of a mechanical vibration level in the vicinity of the resonance frequency of the gyro sensor as the sensor element, and therefore achieve an improvement in sensitivity.

As described above, the wafer level package structure of the present embodiment has the direct bonding between the sensor substrate 101 and the first package substrate 102, and the direct bonding between the sensor substrate 101 and the second package substrate 103, which are formed according to the low-temperature process such as the room-temperature bonding method. Therefore, it is possible to prevent the influence of thermal stress, as compared with the case of bonding the sensor substrate 101 with each of the first and second package substrates (102, 103) by a heat treatment such as reflow soldering. As a result, there is an advantage that variations in sensor characteristics can be reduced. In addition, since the sensor substrate 101 is bonded to the second package substrate 103 through the insulating film 141, it is possible to prevent a reduction in resistance to electric noise. Furthermore, since the substrates are made of silicon wafers, and the insulating film 141 is formed by a silicon oxide film, the sensor substrate 101 can be easily bonded to each of the package substrates (102, 103) at room temperature, and variations in sensor characteristics can be reduced.

In the present embodiment, the second package substrate 103 is bonded to the sensor substrate 101 through the insulating film 141 formed on the surface facing the sensor substrate 101 of the second package substrate 103. In brief, they are preferably bonded to each other through an insulating film formed on at least one of the surface facing the sensor substrate 101 of the second package substrate 103 and the surface facing the second package substrate 103 of the sensor substrate 101.

In addition, by cutting (dicing) the wafer level package structure having the gyro sensor units integrally formed therewith into a size of the gyro sensor unit, it is possible to easily and efficiently obtain compact gyro sensor devices. Therefore, it is suitable for mass production.

An operation of the thus obtained gyro sensor is briefly explained below.

The gyro sensor of the present embodiment detects a positional displacement of the second mass body 112 when an angular velocity is applied to the gyro sensor by an external force under the condition that a predetermined vibration is given to the first mass body 111. In this regard, a vibrating voltage having a sine waveform or a rectangular waveform is applied between the electrode 125 and the first mass body 111 to vibrate the first mass body 111. For example, an AC voltage is used as the vibrating voltage, but polarity inversion is not essential. The first mass body 111 is electrically connected to the fixation portion 117 through the drive springs 113, the second mass body 112, the detection springs 115 and the coupling member 116. The second metal layer 128 is formed on this fixation portion 117. In addition, the electrode 125 is electrically connected to the second metal layer 128 on the electrode portion 127. Therefore, when the vibrating voltage is applied between the second metal layers 128 on the fixation portion 117 and the electrode portion 127, the first mass body 111 can vibrate in the "z" axis direction due to an electrostatic force between the first mass body 111 and the electrode 125. When the frequency of the vibrating voltage is equal to a resonance frequency determined according to weights of the first and second mass bodies (111, 112), and spring constants of the drive spring 113 and the detection spring 115, a large amplitude can be obtained by a relatively small driving force.

In a state where the first mass body 111 is being vibrated, when an angular velocity is applied to the gyro sensor about the "y" axis, a Coriolis force occurs in the "x" axis direction, so that the second mass body 112 (with the first mass body 111) is displaced in the "x" axis direction relative to the stationary part 120. When the movable comb teeth 124 are displaced relative to the stationary comb teeth 123, a change in distance between the movable comb teeth 124 and the stationary comb teeth 123 occurs, so that the electric capacitance therebetween changes. This change in electric capacitance can be taken out from the second metal layers 128 connected to the four stationary parts 120. Thus, it can be regarded that the above-described gyro sensor is provided with four variable capacitance capacitors. Therefore, the positional displacement of the second mass body 112 can be detected by measuring the electric capacitance of each of the variable capacitance capacitors, or the total capacitance of the variable capacitance capacitors connected in parallel. Since the vibration of the first mass body 111 is previously determined, the Coriolis force can be calculated by detecting the positional displacement of the second mass body 112. In the present embodiment, the movable portion disposed inside of the frame portion 110 is composed of the first mass body 111, the drive springs 113, the second mass body 112, the detection springs 115 and the coupling member 116, and the sensing portion is composed of the stationary comb teeth 123 and the movable comb teeth 124 formed on the second mass body 112. In brief, a part of the sensing portion is formed in the movable portion disposed inside of the frame portion 110.

In this regard, the positional displacement of the movable comb teeth 124 is proportional to (the weight of the first mass body 111)/(the weight of the first mass body 111+the weight of the second mass body 112). Therefore, as the weight of the first mass body 111 becomes larger than the weight of the second mass body 112, the displacement of the movable comb teeth 124 increases. As a result, an improvement in sensitivity is achieved. In the present embodiment, from this reason, the thickness dimension of the first mass body 111 is determined to be larger than the thickness dimension of the second mass body 112.

INDUSTRIAL APPLICABILITY

As described above, according to the present invention, the semiconductor wafer having a plurality of compact sensor units is bonded to the package wafer by the solid-phase direct bonding without diffusion between the metal layers formed on the semiconductor wafer and the package wafer. Therefore, it is possible to obtain the wafer level package structure capable of solving problems resulting from residual stress at the bonding interface. In addition, when the through-hole wiring formed in the package wafer is electrically connected to the sensor unit of the semiconductor wafer through the intermediate wiring, the wafer level package structure can be designed at a high degree of freedom according to the kind of sensor to be formed. Furthermore, when it is needed to airtightly seal the interior of the sensor unit from outside, the interior of the sensor unit can be controlled in an appropriate atmosphere according to the kind of sensor such as acceleration sensor and a gyro sensor by performing the atmosphere adjusting step prior to the solid-phase direct bonding step.

Thus, the wafer level package structure and the production method of the present invention are expected to be widely used in applications requiring a reduction in variations of sensor characteristics as well as downsizing of the sensor device.

The invention claimed is:
1. A wafer level package structure comprising:
a semiconductor wafer having a plurality of sensor units; and
a package wafer bonded to a surface of said semiconductor wafer;
wherein said semiconductor wafer has a first metal layer formed on each of said sensor units;
said package wafer has a bonding metal layer on a position facing said first metal layer; and
the bonding between said semiconductor wafer and said package wafer comprises a solid-phase direct bonding without diffusion between an activated surface of said first metal layer and an activated surface of said bonding metal layer,
wherein each of said sensor units comprises a frame having an opening, a movable portion held in said opening to be movable relative to said frame, and a detecting portion configured to output an electric signal according to a positional displacement of said movable portion,
wherein at least one of said first metal layer and said bonding metal layer comprises a ring-like outer metal layer formed around said movable portion, and a ring-like inner metal layer formed at an inner side of said outer metal layer around said movable portion,
wherein each of said first metal layer and said bonding metal layer comprises said outer metal layer, said inner metal layer, and an auxiliary sealing layer connecting between said outer metal layer and said inner metal layer, which is formed at plural locations spaced from each other by a predetermined distance in a circumferential direction of said inner metal layer, and each of a bonding between said outer metal layers, a bonding between said inner metal layers, and a bonding between said auxiliary sealing layers is provided by the solid-phase direct bonding.

2. The wafer level package structure as set forth in claim 1, wherein the activated surfaces of said first metal layer and said bonding metal layer are provided by any one of a plasma-treated surface, an ion-beam irradiated surface, and an atomic-beam irradiated surface.

3. The wafer level package structure as set forth in claim 1, wherein said first metal layer and said bonding metal layer are made of a same metal material selected from gold, copper and aluminum.

4. The wafer level package structure as set forth in claim 1, wherein each of said first metal layer and said bonding metal layer is made of gold, and has a thickness of 500 nm or less.

5. The wafer level package structure as set forth in claim 1, wherein said first metal layer comprises an intermediate layer made of any one of Ti and Cr formed on said semiconductor wafer, and an Au film formed on said intermediate layer,
said bonding metal layer comprises an intermediate layer made of any one of Ti and Cr formed on said package wafer, and an Au film formed on said intermediate layer, and
the bonding between said first metal layer and said bonding metal layer is the solid-phase direct bonding between activated surfaces of said Au films.

6. The wafer level package structure as set forth in claim 1, wherein said sensor unit further comprises an integrated circuit operable in collaboration with said detecting portion.

7. The wafer level package structure as set forth in claim 1, wherein said first metal layer is formed on a surface facing said package wafer of said frame of each of said sensor units over an entire circumference of said frame so as to surround said movable portion, and said bonding metal layer is formed on a region facing said first metal layer of said package wafer.

8. The wafer level package structure as set forth in claim 1, wherein said frame of each of said sensor units has a second metal layer electrically connected to said detecting portion,
said package wafer has a concave portion formed in a region facing said movable portion of each of said sensor units, a through-hole wiring formed in a bottom of said concave portion, and an intermediate wiring layer connected at its one end to said through-hole wiring,
said through-hole wiring is electrically connected to said second metal layer through said intermediate wiring layer, and
the electrical connection is provided by a solid-phase direct bonding without diffusion between activated surfaces of said second metal layer and said intermediate wiring layer.

9. The wafer level package structure as set forth in claim 1, wherein said frame of each of said sensor units has a second metal layer electrically connected to said detecting portion,
said package wafer has a through-hole wiring, and a wiring metal layer connected at its one end to said through-hole wiring, and
said second metal layer is electrically connected to said wiring metal layer at a closer side to said movable portion than the bonding between said first metal layer and said bonding metal layer, and
the electrical connection is provided by a solid-phase direct bonding without diffusion between activated surfaces of said second metal layer and said wiring metal layer.

10. The wafer level package structure as set forth in claim 9, wherein said first metal layer, said bonding metal layer, said wiring metal layer and said second metal layer are made of a same metal material.

11. The wafer level package structure as set forth in claim 9, wherein said first metal layer and said second metal layer are formed to be flush with each other, and said bonding metal layer and said wiring metal layer are formed to be flush with each other.

12. The wafer level package structure as set forth in claim 1, further comprising a second package wafer bonded to the other surface of said semiconductor wafer,
said semiconductor wafer has a surface-activated region on a surface facing said second package wafer, and
the bonding between said second package wafer and said semiconductor wafer is a solid-phase direct bonding without diffusion between the surface-activated region of said semiconductor wafer and a surface-activated region formed on said second package wafer.

13. A sensor device obtained by cutting the wafer level package structure as set forth in claim 1 into a size of said sensor unit.

* * * * *